US007005709B2

(12) United States Patent
Sushihara

(10) Patent No.: US 7,005,709 B2
(45) Date of Patent: Feb. 28, 2006

(54) BASIC CELLS CONFIGURABLE INTO DIFFERENT TYPES OF SEMICONDUCTOR INTEGRATED CIRCUITS

(75) Inventor: Akihiro Sushihara, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/034,241

(22) Filed: Jan. 13, 2005

(65) Prior Publication Data

US 2005/0127404 A1  Jun. 16, 2005

Related U.S. Application Data

(62) Division of application No. 10/794,055, filed on Mar. 8, 2004, now Pat. No. 6,849,903, which is a division of application No. 09/716,250, filed on Nov. 21, 2000, now Pat. No. 6,740,937.

(30) Foreign Application Priority Data

Jun. 5, 2000 (JP) .............................. 2000-166949

(51) Int. Cl.
H01L 29/76 (2006.01)
H01L 27/11 (2006.01)

(52) U.S. Cl. ...................................... 257/365; 257/903
(58) Field of Classification Search ................ 257/298, 257/365, 393, 903, 904
See application file for complete search history.

(56) References Cited

U.S. PATENT DOCUMENTS

| 4,635,088 A | 1/1987 | Eguchi |
| 5,083,178 A | 1/1992 | Otsu |
| 5,442,209 A | 8/1995 | Chung |
| 6,043,521 A | 3/2000 | Shibutani et al. |
| 6,160,280 A | 12/2000 | Bonn et al. |
| 6,268,627 B1 | 7/2001 | Ishigaki et al. |
| 6,268,632 B1 | 7/2001 | Sugimura et al. |
| 6,459,331 B1 | 10/2002 | Takeuchi et al. |

FOREIGN PATENT DOCUMENTS

| JP | 2-250378 | 10/1990 |
| JP | 2-303066 | 12/1990 |
| JP | 05048052 A | 2/1993 |
| JP | 5-152524 | 6/1993 |

Primary Examiner—Ori Nadav
(74) Attorney, Agent, or Firm—Volentine Francos & Whitt, PLLC

(57) ABSTRACT

The basic cell constituted by a semiconductor integrated circuit comprises two PMOS transistors and two NMOS transistors. By setting the gate widths of the gates of these transistors to prescribed lengths, the efficiency of use of elements within the basic cell is improved, and fine adjustment of the threshold voltage Vth and delay time Tpd becomes possible.

2 Claims, 41 Drawing Sheets

BASIC CELLS CONFIGURABLE INTO DIFFERENT TYPES OF SEMICONDUCTOR INTEGRATED CIRCUITS

CROSS REFERENCE TO RELATED APPLICATIONS

This is a divisional application of application Ser. No. 10/794,055, field Mar. 8, 2004 now U.S. Pat. No. 6,849, 903, which is a divisional application of application Ser. No. 09/716,250, filed Nov. 21, 2000, now U.S. Pat. No. 6,740, 937, which are hereby incorporated by reference in their entirety for all purposes.

BACKGROUND OF THE INVENTION

1. Field of the Invention

This invention concerns a semiconductor integrated circuit comprised of macrocells prepared in advance, such as gate arrays.

2. Description of Related Art

LSI manufacturing processes are divided into bulk processes, in which transistors, resistances and other elements are formed at prescribed positions on silicon substrate, and wiring processes, in which elements are connected by metal wiring to form circuit functions. In a gate array, the above-mentioned bulk processes are used to form in advance a bulk chip on which are regularly arranged basic cells (also called unit cells) in an array, so that, simply by changing the wiring processes, various logic circuits can be formed.

FIG. 34 shows a bulk chip used to form the input/output circuit of a semiconductor integrated circuit. As shown in FIG. 34, in the case of an ordinary gate array, the input/output circuit (hereafter abbreviated to "I/O circuit") 10 of a semiconductor integrated circuit comprises main driver units 12a and 12b, and a predriver unit 14. In one of the main driver units 12a, a plurality of P-channel MOS (hereafter "PMOS") transistors are arranged, and in the other main driver unit 12b, a plurality of N-channel MOS (hereafter "NMOS") transistors are arranged. In the predriver unit 14 are arranged, in an array, a plurality of basic cells, comprising two PMOS and two NMOS transistors. The dimensions (gate width and gate length) of the transistors comprised by the predriver unit 14 are small compared with the dimensions of the transistors comprised by the main driver units 12a and 12b.

FIG. 35 is a mask pattern diagram for a basic cell comprised of conventional semiconductor integrated circuits. As shown in FIG. 35, basic cells comprised by the predriver unit 14 comprise PMOS transistors Tr1, Tr2 and NMOS transistors Tr3, Tr4.

Each transistor is formed on a P-type Si substrate, not shown. PMOS transistors Tr1 and Tr2 are formed within an N-well 16 embedded in this substrate. Within this N-well 16, a P-type semiconductor region 18 is formed, and within this P-type semiconductor region 18, the active regions 20 of the PMOS transistors Tr1, Tr2 are formed. On top of these active regions 20 are provided two parallel polysilicon film stripes, as the gates G1, G2 of the PMOS transistors Tr1, Tr2, respectively.

In a region adjacent to this N-well, the active regions 22 of NMOS transistors Tr3, Tr4 are formed. On top of these active regions 22 are provided two parallel polysilicon film stripes, as the gates G3, G4 of the NMOS transistors Tr3, Tr4, respectively.

In this way, the PMOS transistor Tr2 and PMOS transistor Tr1 are juxtaposed, and the NMOS transistor Tr4 and NMOS transistor Tr3 are juxtaposed. The gates of these transistors Tr1 through Tr4 are mutually parallel. And, the gate G1 of PMOS transistor Tr1 and the gate G3 of NMOS transistor Tr3 are provided, that is, arranged in a straight line. Similarly, the gate G2 of PMOS transistor Tr2 and the gate G4 of NMOS transistor Tr4 are provided in a line.

The gate width W1 of gate G1 of PMOS transistor Tr1, the gate width W2 of gate G2 of PMOS transistor Tr2, the gate width W3 of gate G3 of NMOS transistor Tr3, and the gate width W4 of gate G4 of NMOS transistor Tr4, are all equal, with W1:W2:W3:W4=1:1:1:1.

Further, an active region 24 for power supply (VDD) connection is formed adjacent to PMOS transistor Tr2 within the N-well 16. Also, a P-type semiconductor region 26 is formed adjacent to NMOS transistor Tr4 outside the N-well 16, and in this P-type semiconductor region 26 is formed an active region 28 for a ground (GND) connection.

At both ends of each gate G1 through G4 are provided polysilicon films 30 for wiring connections. Each of these polysilicon films 30 is provided in a state of connection with the gates G1 through G4.

FIG. 36 shows an example of the above-mentioned I/O circuit. In the input buffer shown in FIG. 36A, an ESD protection circuit 32 and inverters 34, 36 are connected between the input signal terminal A and the output signal terminal Y. The ESD protection circuit 32 comprises a main driver unit; the inverters 34 and 36 comprise a predriver unit.

In the output buffer shown in FIG. 36B, transistors Tr1, Tr2 and inverters 34, 36 are connected between the input signal terminal A and output signal terminal Y. The transistors Tr1, Tr2 are comprised by the main driver unit, and the inverters 34, 36 are comprised by the predriver unit.

In the output buffer shown in FIG. 36C, transistors Tr1, Tr2, a two-input NAND circuit (hereafter "2NAND circuit") 38, a two-input NOR circuit (hereafter "2NOR circuit") 40, and an inverter 34 are connected between the input signal terminal A and enable signal terminal EB, and the output signal terminal Y. The transistors Tr1, Tr2 are comprised by the main driver unit, and the 2NAND circuit 38, 2NOR circuit 40, and inverter 34 are comprised by the predriver unit.

In this way, in the predriver unit inverters, 2NAND and 2NOR circuits are comprised by basic cells. In a gate array, the threshold voltage Vth and delay time Tpd of these circuits are adjusted through the number of transistors of fixed dimensions used to comprise the predriver unit. Next, an example of configuration of an inverter using basic cells is presented.

In FIG. 37 and FIG. 38, a first example of configuration of an inverter using basic cells is presented. FIG. 37 is a drawing of the inverter mask pattern. FIG. 38 shows a cross-section of the element structure formed by the mask pattern shown in FIG. 37. FIG. 38A is a cross-sectional diagram at the position of the line I—I in FIG. 37; FIG. 38B is a cross-sectional diagram at the position of the line J—J in FIG. 37. In FIG. 38, insulation layers provided between each layer are omitted.

As shown in FIGS. 38A and 38B, an N-well 16 is formed in the P-type Si substrate 72, and within this N-well 16 is formed a P-type semiconductor region 18. Within this P-type semiconductor region 18 are formed the active regions 20 of the PMOS transistors Tr1 and Tr2. On top of this active region 20 are provided gates G1, G2 of the PMOS transistors Tr1, Tr2.

In FIG. 37, shading indicating the first and second metal layers denotes areas where the first metal layer and second metal layer overlap. Also in FIG. 37, shading indicating first and second through-holes denotes areas where a first through-hole and second through-hole overlap. Here a first through-hole is formed between the first metal layer and the second metal layer; a second through-hole is formed between the second metal layer and the third metal layer.

In this inverter, the gate G1 of PMOS transistor Tr1 and gate G2 of PMOS transistor Tr2 are connected to the first metal layer 44 via the contacts 42 provided on the polysilicon films used for wiring connections. These gates G1 and G2 are electrically connected by the first metal layer 44, and this first metal layer 44 is connected to the input terminal IN.

Further, the gate G1 of PMOS transistor Tr1 and gate G3 of NMOS transistor Tr3 are connected to the first metal layer 48 via the contacts 46 provided on the polysilicon films for wiring connections. These gates G1, G3 are electrically connected by the first metal layer 48.

As shown in FIG. 38A, the active region 20 between the gate G1 of PMOS transistor Tr1 and gate G2 of PMOS transistor Tr2 is connected to the third metal layer 52 via the first and second through-holes 50. This third metal layer 52 is connected to the active region 24 used for connection to the power supply (VDD).

The other active regions 20 of the PMOS transistors Tr1, Tr2 are connected to the first metal layer 58 via respective contacts 56. As shown in FIG. 38B, the first metal layer 58 on top of these active regions 20 is connected by the second metal layer 62 on top of the gates G1 and G2, connected via the second through-holes 60. The first metal layer 58 is connected to the output terminal OUT.

The active region 22 between the gate G3 of the NMOS transistor Tr3 and the gate G4 of the NMOS transistor Tr4 is connected to the third metal layer 66 via the first and second through-holes 64. The third metal layer 66 is connected to the active region 28 used for connection to ground (GND). Further, the other active region 22 of the NMOS transistor Tr3 is connected to the first metal layer 70 via the contact 68. This first metal layer 70 is connected to the output terminal OUT.

FIG. 39 is a circuit diagram showing the connections of the inverter shown in FIG. 37. As shown in FIG. 39, the channel of the PMOS transistor Tr1 and the channel of the NMOS transistor Tr3 are connected in series between the power supply VDD and ground GND. Further, the channel of the PMOS transistor Tr2 and the channel of the NMOS transistor Tr3 are connected in series between the power supply VDD and ground GND. The gates of transistors Tr1 through Tr3 are each connected to the input terminal IN. The point of connection of the channels of the PMOS transistor Tr1 and the of NMOS transistor Tr3, and the point of connection of the channels of the PMOS transistor Tr2 and of the NMOS transistor Tr3, are both connected to the output terminal OUT.

Next, FIG. 40 shows a second example of configuration of an inverter using basic cells. FIG. 40 shows a mask pattern for the inverter. The various shadings in FIG. 40 each have the same meaning as in FIG. 37.

This inverter comprises two basic cells. The wiring of one of the basic cells is similar to that shown in FIG. 37. The wiring of the PMOS transistors Tr5 and Tr6 comprised by the other basic cell is similar to the wiring of the PMOS transistors Tr1 and Tr2 shown in FIG. 37. The gates G5 and G6 of the PMOS transistors Tr5, Tr6 are connected to the input terminal IN via the first metal layer 44. The active region 20 between the gates of the PMOS transistors Tr5 and Tr6 is connected to the power supply VDD via the first and second through-holes 50, and the other active regions 20 are connected to the output terminal OUT via the second metal layer 62.

FIG. 41 is a circuit diagram showing the connections of the inverter shown in FIG. 40. As shown in FIG. 41, each of the channels of the PMOS transistors Tr1, Tr2, Tr5 and Tr6 is connected in parallel between the power supply VDD and ground GND. Also, each of the channels of these PMOS transistors is connected in series with the channel of the NMOS transistor Tr3 between the power supply VDD and ground GND. The gates of each of transistors Tr1 through Tr6 are connected to the input terminal IN. The points of connection of the channels of each of the PMOS transistors with the channel of the NMOS transistor Tr3 are connected to the output terminal OUT.

However, in order to make the capacity of the PMOS and NMOS transistors equal, the gate width of PMOS gates must be made from double to quadruple the gate width of the NMOS transistor gate. Here "make the capacity of the PMOS and NMOS transistors equal" means that, for the example of an inverter, when the circuit threshold voltage Vth is set to ½ the power supply voltage, the channel currents for both the NMOS and PMOS transistors are the same. Hence, as shown in FIG. 37 and FIG. 40, the frequency of use of the NMOS transistor is low compared with the PMOS transistors, and so usage efficiency of elements within the basic cell is poor.

Further, in a conventional basic cell the gate length and gate width are fixed, so that fine adjustments to Vth and Tpd cannot be made. In particular, recently there have been increasingly frequent cases of special I/O cells developed using gate arrays; the inability to make fine adjustments to dimensions is a disadvantage.

SUMMARY OF THE INVENTION

Hence one object of this invention is to improve the efficiency of use of elements in basic cells, and to enable fine adjustments to Vth and Tpd.

In order to achieve this object, the semiconductor integrated circuit of this invention is provided with the unique configuration described below.

The semiconductor integrated circuit of this invention is manufactured by forming the wiring on a bulk chip comprising a plurality of basic cells arranged in an array. Basic cells comprise first and second P-channel MOS (hereafter "PMOS") transistors, and first and second N-channel MOS (hereafter "NMOS") transistors. The second PMOS transistor and the first PMOS transistor are juxtaposed. The second NMOS transistor and the first NMOS transistor are juxtaposed. The gates of each of the transistors are mutually parallel. The gate of the first PMOS transistor and the gate of the first NMOS transistor are provided in a line. The gate of the second PMOS transistor and the gate of the second NMOS transistor are provided in a line. The gate width W1 of the gate of the first PMOS transistor, the gate width W2 of the gate of the second PMOS transistor, the gate width W3 of the gate of the first NMOS transistor, and the gate width W4 of the gate of the second NMOS transistor, are such that $$W1:W2:W3:W4=2:2:1:1.$$

Here "juxtaposed" means provided in a state of proximity, and arranged in a row. Also, "provided in a line" means provided so as to form a straight line.

By means of this configuration, the usage efficiency of elements within basic cells is improved, and fine adjustment of Vth and Tpd becomes possible.

In the semiconductor integrated circuit of this invention, it is desirable that the gate of the first PMOS transistor and the gate of the first NMOS transistor be connected in a line, and that the gate of the second PMOS transistor and the gate of the second NMOS transistor be connected in a line.

Here, "connected in a line" means connected so as to form a line.

By means of this configuration, there is no longer a need to connect with metal the gates of the PMOS and NMOS transistors, and so labor is eliminated in the drawing of diagrams (creation of mask patterns). Further, the size of basic cells is reduced, and the size of the overall circuit can also be reduced.

In the semiconductor integrated circuit of another invention, a basic cell comprises first, second and third PMOS transistors, and first and second NMOS transistors. The second and third PMOS transistors and the first PMOS transistor are juxtaposed. The second NMOS transistor and the first NMOS transistor are juxtaposed. The gates of each of the transistors are mutually parallel. The gate of the second PMOS transistor and the gate of the third PMOS transistor are connected in a line. The gate of the first PMOS transistor and the gate of the first NMOS transistor are provided in a line.

The gate of the third PMOS transistor and the gate of the second NMOS transistor are provided in a line. The gate width $W1$ of the gate of the first PMOS transistor, the gate width $W2$ of the gate of the second PMOS transistor, the gate width $W3$ of the gate of the third PMOS transistor, the gate width $W4$ of the gate of the first NMOS transistor, and the gate width $W5$ of the gate of the second NMOS transistor are, substantially, selected such that $$W1:W2:W3:W4:W5=2:1:1:1:1.$$

By means of this configuration, the usage efficiency of elements within basic cells is improved, and fine adjustment of Vth and Tpd becomes possible.

In the semiconductor integrated circuit of this invention, it is desirable that the gate of the first PMOS transistor and the gate of the first NMOS transistor be connected in a line, and that the gate of the third PMOS transistor and the gate of the second NMOS transistor be connected in a line.

By means of this configuration, there is no longer a need to connect with metal the gates of the PMOS and. NMOS transistors, and so labor is eliminated in the drawing of diagrams. Further, the size of basic cells is reduced, and the size of the overall circuit can also be reduced.

In the semiconductor integrated circuit of still another invention, a basic cell comprises first, second, third and fourth PMOS transistors, and first and second NMOS transistors. The second PMOS transistor and the first PMOS transistor are juxtaposed. The third PMOS transistor and the fourth PMOS transistor are juxtaposed. The second NMOS transistor and the first NMOS transistor are juxtaposed. The gates of each of the transistors are mutually parallel. The gate of the first PMOS transistor and the gate of the third PMOS transistor are connected in a line. The gate of the second PMOS transistor and the gate of the fourth PMOS transistor are connected in a line. The gate of the third PMOS transistor and the gate of the first NMOS transistor are provided in a line. The gate of the fourth PMOS transistor and the gate of the second NMOS transistor are provided in a line. The gate width $W1$ of the gate of the first PMOS transistor, the gate width $W2$ of the gate of the second PMOS transistor, the gate width $W3$ of the gate of the third PMOS transistor, the gate width $W4$ of the gate of the fourth PMOS transistor, the gate width $W5$ of the gate of the first NMOS transistor, and the gate width $W6$ of the gate of the second NMOS transistor are selected such that $$W1:W2:W3:W4:W5:W6=1:1:1:1:1:1.$$

By means of this configuration, the usage efficiency of elements within basic cells is improved, and fine adjustment of Vth and Tpd becomes possible.

In the semiconductor integrated circuit of this invention, it is desirable that the gate of the third PMOS transistor and the gate of the first NMOS transistor be connected in a line, and that the gate of the fourth PMOS transistor and the gate of the second NMOS transistor be connected in a line.

By means of this configuration, there is no longer a need to connect with metal the gates of the PMOS and NMOS transistors, and so labor is eliminated in the drawing of diagrams. Further, the size of basic cells is reduced, and the size of the overall circuit can also be reduced.

In the semiconductor integrated circuit of still another invention, a basic cell comprises first, second, third, fourth and fifth PMOS transistors, and first and second NMOS transistors. The second and third PMOS transistors are juxtaposed with respect to the first PMOS transistor. The fifth PMOS transistor is juxtaposed with respect to the fourth PMOS transistor. The second NMOS transistor is juxtaposed with respect to the first NMOS transistor. The gates of each of the transistors are mutually parallel. The gate of the first PMOS transistor and the gate of the fourth PMOS transistor are connected in a line. The gate of the second PMOS transistor, the gate of the third PMOS transistor, and the gate of the fifth PMOS transistor are connected in a line. The gate of the fourth PMOS transistor and the gate of the first NMOS transistor are provided in a line. The gate of the fifth PMOS transistor and the gate of the second NMOS transistor are provided in a line. The gate width $W1$ of the gate of the first PMOS transistor, the gate width $W2$ of the gate of the second PMOS transistor, the gate width $W3$ of the gate of the third PMOS transistor, the gate width $W4$ of the gate of the fourth PMOS transistor, the gate width $W5$ of the gate of the fifth PMOS transistor, the gate width $W6$ of the gate of the first NMOS transistor, and the gate width $W7$ of the gate of the second NMOS transistor are selected such that $$W1:W2:W3:W4:W5:W6:W7=1:\tfrac{1}{3}:\tfrac{1}{3}:1:1:1:1.$$

By means of this configuration, the usage efficiency of elements within basic cells is improved, and fine adjustment of Vth and Tpd becomes possible.

In the semiconductor integrated circuit of this invention, it is desirable that the gate of the fourth PMOS transistor and the gate of the first NMOS transistor be connected in a line, and that the gate of the fifth PMOS transistor and the gate of the second NMOS transistor be connected in a line.

By means of this configuration, there is no longer a need to connect with metal the gates of the PMOS and NMOS transistors, and so labor is eliminated in the drawing of diagrams. Further, the size of basic cells is reduced, and the size of the overall circuit can also be reduced.

In the semiconductor integrated circuit of still another invention, a basic cell comprises first, second, third, fourth, fifth and sixth PMOS transistors, and first and second NMOS transistors. The second PMOS transistor and the first PMOS transistor are juxtaposed. The fourth PMOS transistor and the third PMOS transistor are juxtaposed. The sixth PMOS transistor and the fifth PMOS transistor are juxtaposed. The second NMOS transistor and the first NMOS transistor are juxtaposed. The gates of each of the transistors are mutually parallel. The gate of the first PMOS transistor, the gate of the third PMOS transistor, and the gate of the fifth PMOS transistor are connected in a line. The gate of the second PMOS transistor, the gate of the fourth PMOS transistor, and the gate of the sixth PMOS transistor are connected in a line.

The gate of the fifth PMOS transistor and the gate of the first NMOS transistor are provided in a line. The gate of the sixth PMOS transistor and the gate of the second NMOS transistor are provided in a line. The gate width W1 of the gate of the first PMOS transistor, the gate width W2 of the gate of the second PMOS transistor, the gate width W3 of the gate of the third PMOS transistor, the gate width W4 of the gate of the fourth PMOS transistor, the gate width W5 of the gate of the fifth PMOS transistor, the gate width W6 of the gate of the sixth PMOS transistor, the gate width W7 of the gate of the first NMOS transistor, and the gate width W8 of the gate of the second NMOS transistor are selected such that $$W1:W2:W3:W4:W5:W6:W7:W8=1/3:1/3:1/3:1/3:1:1:1:1$$

By means of this configuration, the usage efficiency of elements within basic cells is improved, and fine adjustment of Vth and Tpd becomes possible.

In the semiconductor integrated circuit of this invention, it is desirable that the gate of the fifth PMOS transistor and the gate of the first NMOS transistor be connected in a line, and that the gate of the sixth PMOS transistor and the gate of the second NMOS transistor be connected in a line.

By means of this configuration, there is no longer a need to connect with metal the gates of the PMOS and NMOS transistors, and so labor is eliminated in the drawing of diagrams. Further, the size of basic cells is reduced, and the size of the overall circuit can also be reduced.

In the semiconductor integrated circuit of still another invention, a basic cell comprises first, second, third, fourth, fifth and sixth PMOS transistors, and first, second, third and fourth NMOS transistors. The second PMOS transistor and the first PMOS transistor are juxtaposed. The fourth PMOS transistor and the third PMOS transistor are juxtaposed. The sixth PMOS transistor and the fifth PMOS transistor are juxtaposed. The second NMOS transistor and the first NMOS transistor are juxtaposed. The fourth NMOS transistor and the third NMOS transistor are juxtaposed. The gates of each of the transistors are mutually parallel. The gate of the first PMOS transistor, the gate of the third PMOS transistor, and the gate of the fifth PMOS transistor are connected in a line. The gate of the second PMOS transistor, the gate of the fourth PMOS transistor, and the gate of the sixth PMOS transistor are connected in a line. The gate of the first NMOS transistor and the gate of the third NMOS transistor are connected in a line. The gate of the second NMOS transistor and the gate of the fourth NMOS transistor are connected in a line. The gate of the fifth PMOS transistor and the gate of the first NMOS transistor are provided in a line. The gate of the sixth PMOS transistor and the gate of the second NMOS transistor are provided in a line. The gate width W1 of the gate of the first PMOS transistor, the gate width W2 of the gate of the second PMOS transistor, the gate width W3 of the gate of the third PMOS transistor, the gate width W4 of the gate of the fourth PMOS transistor, the gate width W5 of the gate of the fifth PMOS transistor, the gate width W6 of the gate of the sixth PMOS transistor, the gate width W7 of the gate of the first NMOS transistor, the gate width W8 of the gate of the second NMOS transistor, the gate width W9 of the gate of the third NMOS transistor, and the gate width W10 of the gate of the fourth NMOS transistor are selected such that $$W1:W2:W3:W4:W5:W6:W7:W8:W9:W10=1/3:1/3:1/3:1/3:1:1:1/2:1/2:1/3:1/3.$$

By means of this configuration, the usage efficiency of elements within basic cells is improved, and fine adjustment of Vth and Tpd becomes possible.

In the semiconductor integrated circuit of this invention, it is desirable that the gate of the fifth PMOS transistor and the gate of the first NMOS transistor be connected in a line, and that the gate of the sixth PMOS transistor and the gate of the second NMOS transistor be connected in a line.

By means of this configuration, there is no longer a need to connect with metal the gates of the PMOS and NMOS transistors, and so labor is eliminated in the drawing of diagrams. Further, the size of basic cells is reduced, and the size of the overall circuit can also be reduced.

DESCRIPTION OF THE PREFERRED EMBODIMENTS

Figure 1:
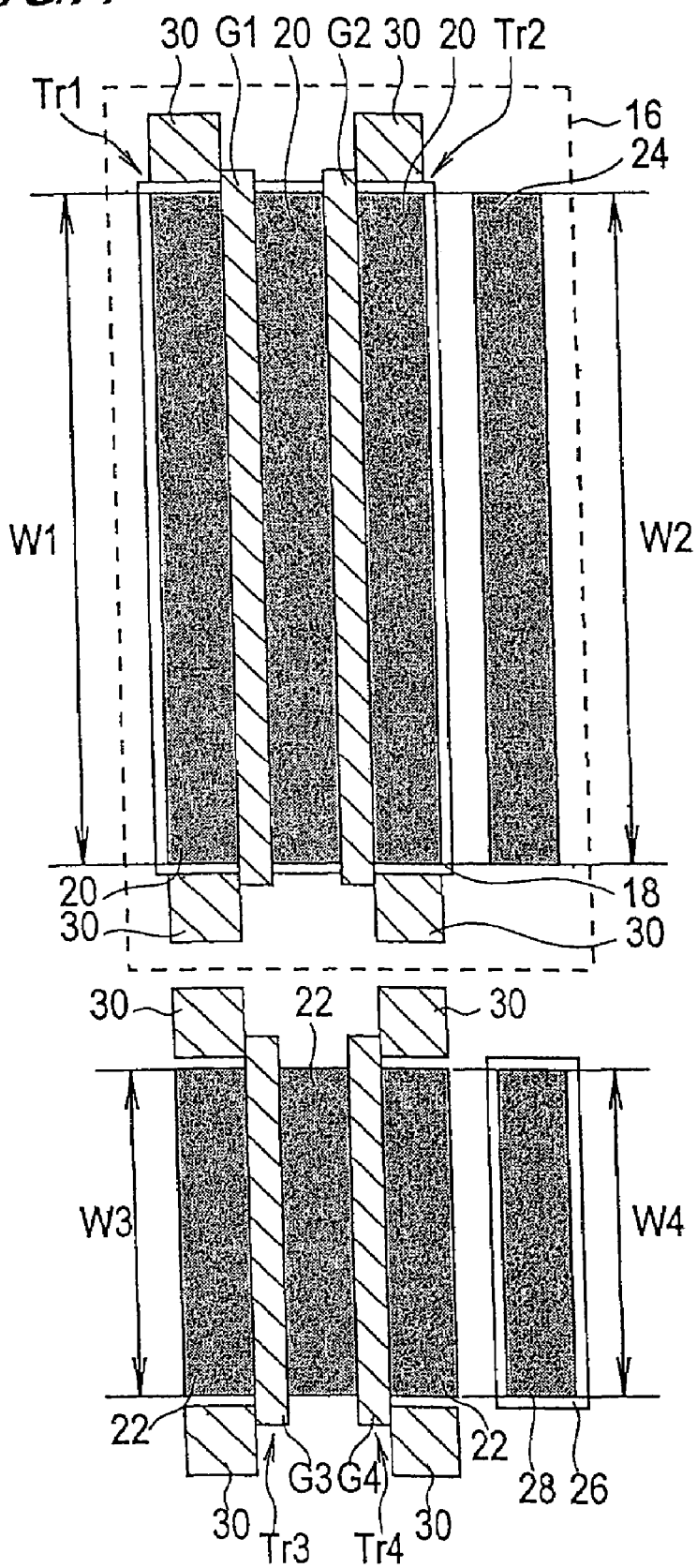
FIG. 1 is a mask pattern diagram showing a basic cell comprised by the semiconductor integrated circuit of a first embodiment.

Below, embodiments of this invention are explained, referring to the drawings. These figures schematically show the shapes, dimensions and arrangements in sufficient degree to provide an understanding of the invention. Moreover, the figures, conditions, materials and other details cited below are no more than examples. Hence the scope of this invention is not limited to these embodiments.

First Embodiment

FIG. 1 is a mask pattern diagram of a basic cell comprised by a semiconductor integrated circuit of a first embodiment of this invention. The basic cell shown in FIG. 1 comprises a first P-channel MOS (hereafter "PMOS") transistor Tr1, a second PMOS transistor Tr2, a first N-channel MOS (hereafter "NMOS") transistor Tr3, and a second NMOS transistor Tr4.

Each of the transistors Tr1 through Tr4 is formed on P-type Si substrate, not shown. PMOS transistors Tr1 and Tr2 are formed within an N-well 16 formed in the substrate. Within this N-well 16, a P-type semiconductor region 18 is formed. Within this P-type semiconductor region 18, the active regions 20 of the PMOS transistors Tr1 and Tr2 are formed. Also, two parallel stripe-shape polysilicon films are formed on these active regions 20 as the gates G1 and G2 of the PMOS transistors Tr1 and Tr2.

Adjacent to the N-well 16, the active regions 22 of the NMOS transistors Tr3 and Tr4 are formed. On these active regions 22, two parallel stripe-shape polysilicon films are formed as the gates G3 and G4 of the NMOS transistors Tr3 and Tr4.

In this way, PMOS transistor Tr2 is juxtaposed with respect to PMOS transistor Tr1, and NMOS transistor Tr4 is juxtaposed with respect to NMOS transistor Tr3. The gates of each of these transistors Tr1 through Tr4 are mutually parallel. The gate G1 of PMOS transistor Tr1 is provided in a line with the gate G3 of NMOS transistor Tr3, that is, arranged on a straight line. Similarly, the gate G2 of PMOS transistor Tr2 is provided in a line with the gate G4 of NMOS transistor Tr4.

In this embodiment, the gate width W1 of the gate G1 of PMOS transistor Tr1, the gate width W2 of the gate G2 of PMOS transistor Tr2, the gate width W3 of the gate G3 of NMOS transistor Tr3, and the gate width W4 of the gate G4 of NMOS transistor Tr4 are selected such that $$W1:W2:W3:W4=2:2:1:1.$$

Further, an active region 24 for connection of the power supply (VDD) is formed adjacent to PMOS transistor Tr2 within the N-well 16. Also, a P-type semiconductor region 26 is formed outside the N-well 16 and adjacent to NMOS transistor Tr4. In this P-type semiconductor region 26 is formed an active region 28 for connection to ground (GND).

At both ends of each of the gates G1 through G4 are provided polysilicon films 30 for wiring connection. Each of these polysilicon films 30 is provided in a state of connection to the respective gates G1 through G4.

Next, an example of configuration of an inverter configured using this basic cell is described.

Figure 2:
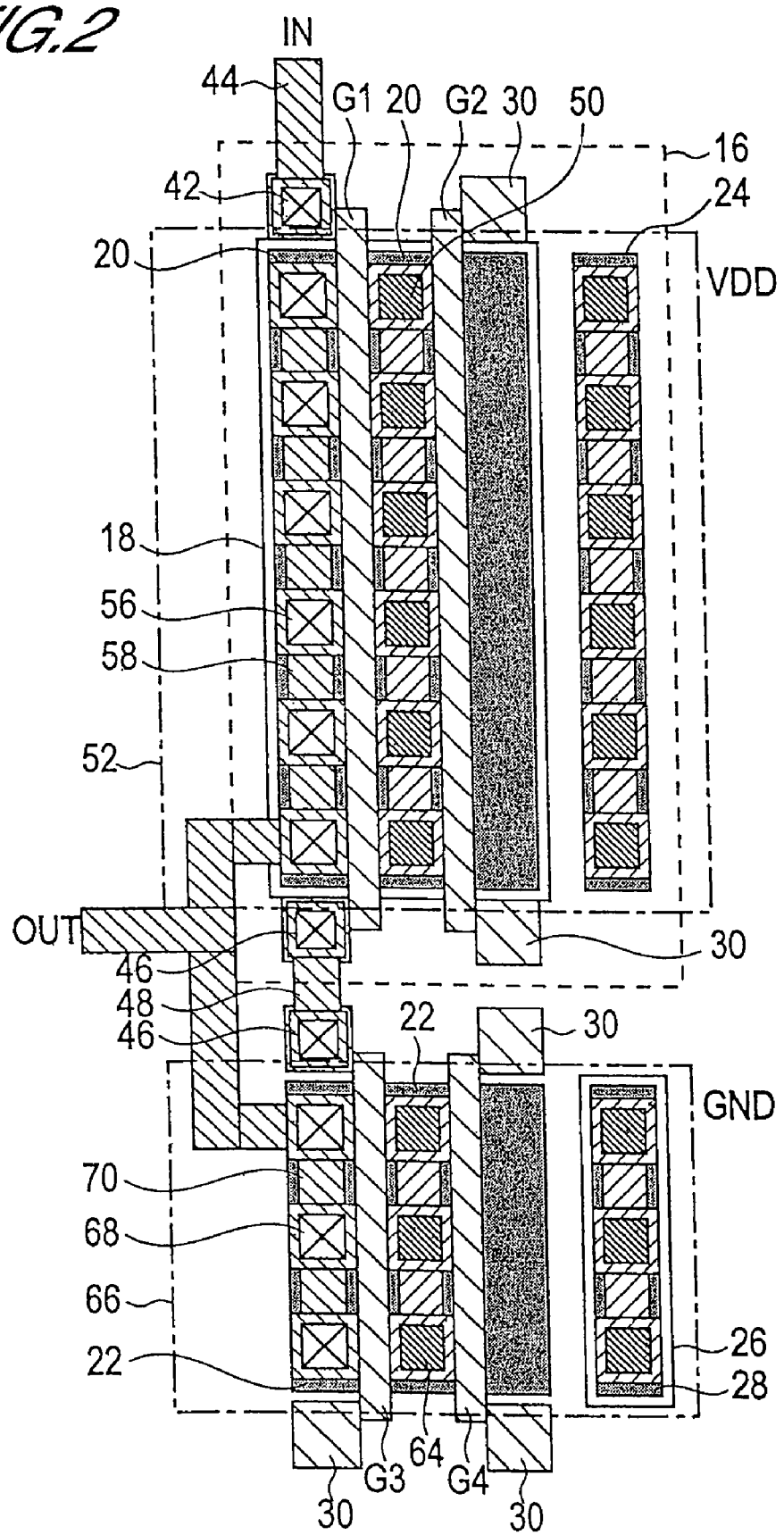
FIG. 2 is a mask pattern diagram showing a first example of the configuration of an inverter using a basic cell of the first embodiment.
Figure 37:
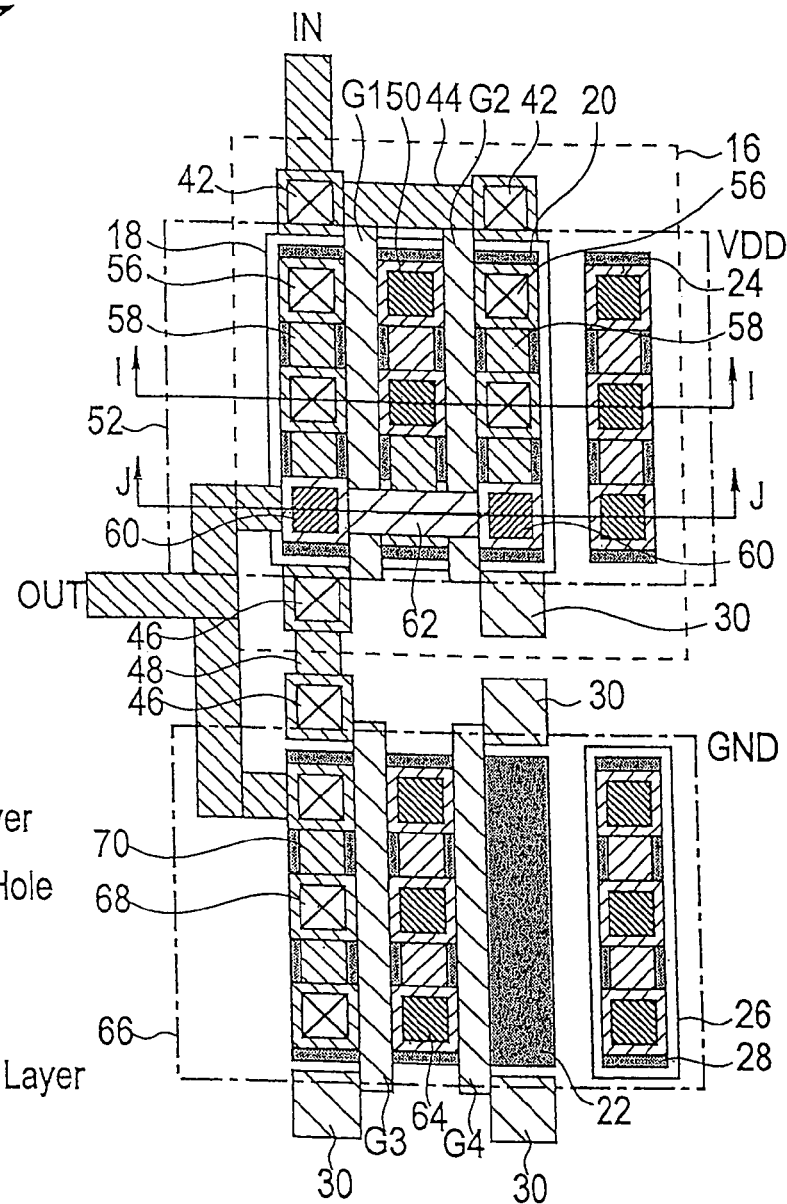
FIG. 37 is a mask pattern diagram showing a first example of the configuration of an inverter using a conventional basic cell.
Figure 38A:
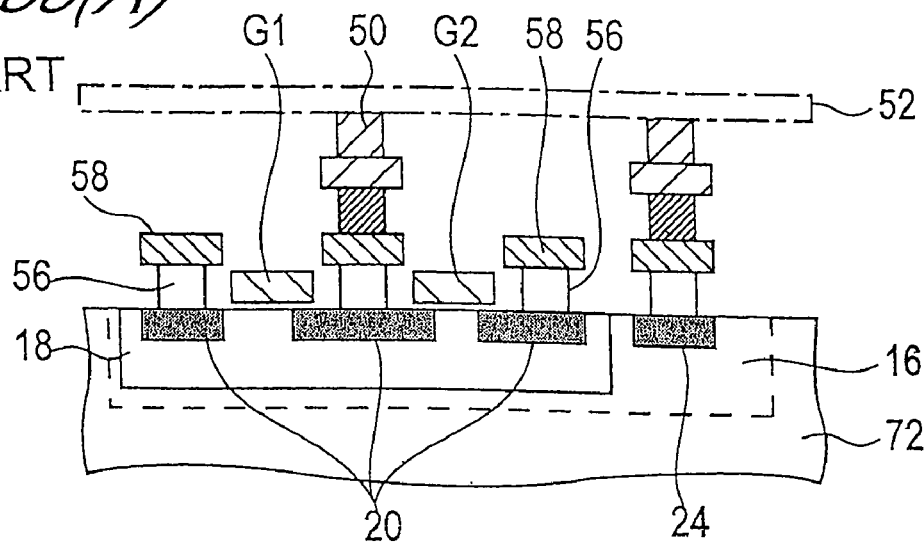
FIG. 38 (including FIGS. 38A and 38B) is a cross-sectional diagram of the first example of the configuration of an inverter using a conventional basic cell.
Figure 38B:
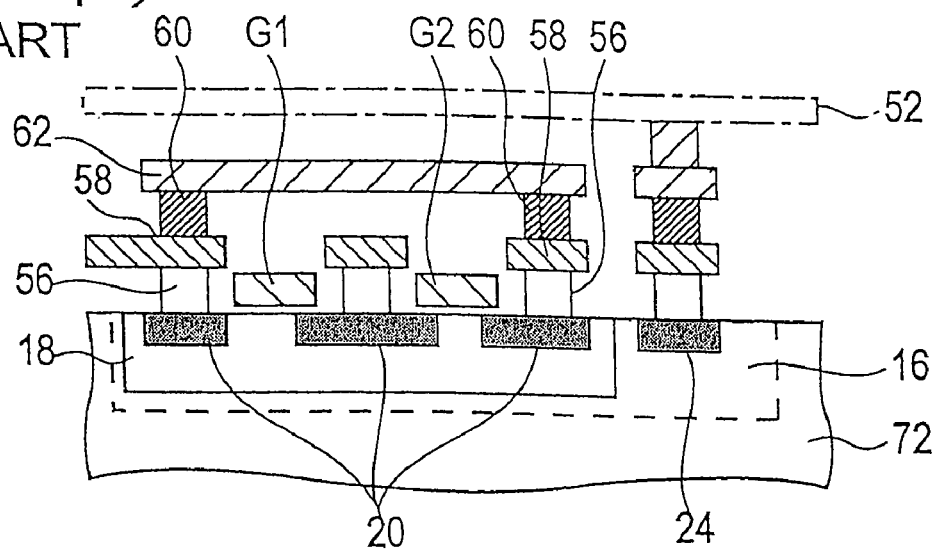

FIG. 2 is a mask pattern diagram showing a first example of the configuration of an inverter using a basic cell of the first embodiment. The various shadings in FIG. 2 each have the same meaning as in FIG. 37.

In this inverter, the gate G1 of PMOS transistor Tr1 is connected, via the contact 42 provided on the polysilicon film for wiring connection, to a first metal layer 44. This first metal layer 44 is connected to the input terminal IN.

The gate G1 of PMOS transistor Tr1 and gate G3 of NMOS transistor Tr3 are connected to a first metal layer 48 via contacts 46 provided on polysilicon film for wiring connection. These gates G1 and G3 are electrically connected by means of the first metal layer 48.

The active region 20 between the gate G1 of PMOS transistor Tr1 and the gate G2 of PMOS transistor Tr2 is connected to a third metal layer 52 via first and second through-holes 50. This third metal layer 52 is connected to the active region 24 for connection to the power supply (VDD). The other active region 20 of PMOS transistor Tr1 is connected to the first metal layer 58 via the contact 56. This first metal layer 58 is connected to the output terminal OUT.

The active region 22 between gate G3 of NMOS transistor Tr3 and gate G4 of NMOS transistor Tr4 is connected to the third metal layer 66 via first and second through-holes 64. This third metal layer 66 is connected to the active region 28 for connection to ground (GND). The other active region 22 of NMOS transistor Tr3 is connected to the first metal layer 70 via contact 68. This first metal layer 70 is connected to the output terminal OUT.

Figure 3:
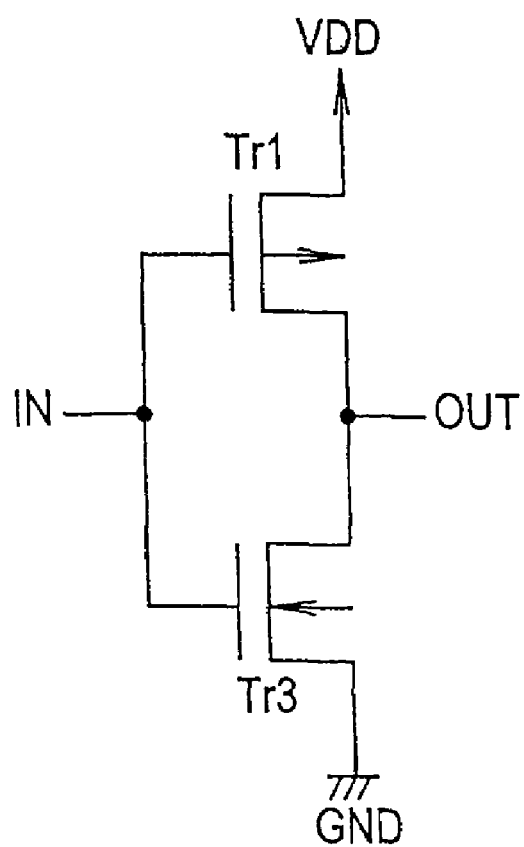
FIG. 3 is a circuit diagram showing the connections between component elements of the inverter shown in FIG. 2.

FIG. 3 is a circuit diagram showing the connections between component elements of the inverter shown in FIG. 2. As shown in FIG. 3, the channel of PMOS transistor Tr1 and the channel of NMOS transistor Tr3 are connected in series between the power supply VDD and ground GND, in this order from the side of the power supply VDD. The gates of the PMOS transistor Tr1 and the NMOS transistor Tr3 are both connected to the input terminal IN. The point of connection of the channel of the PMOS transistor Tr1 and the NMOS transistor Tr3 is connected to the output terminal OUT.

Figure 39:
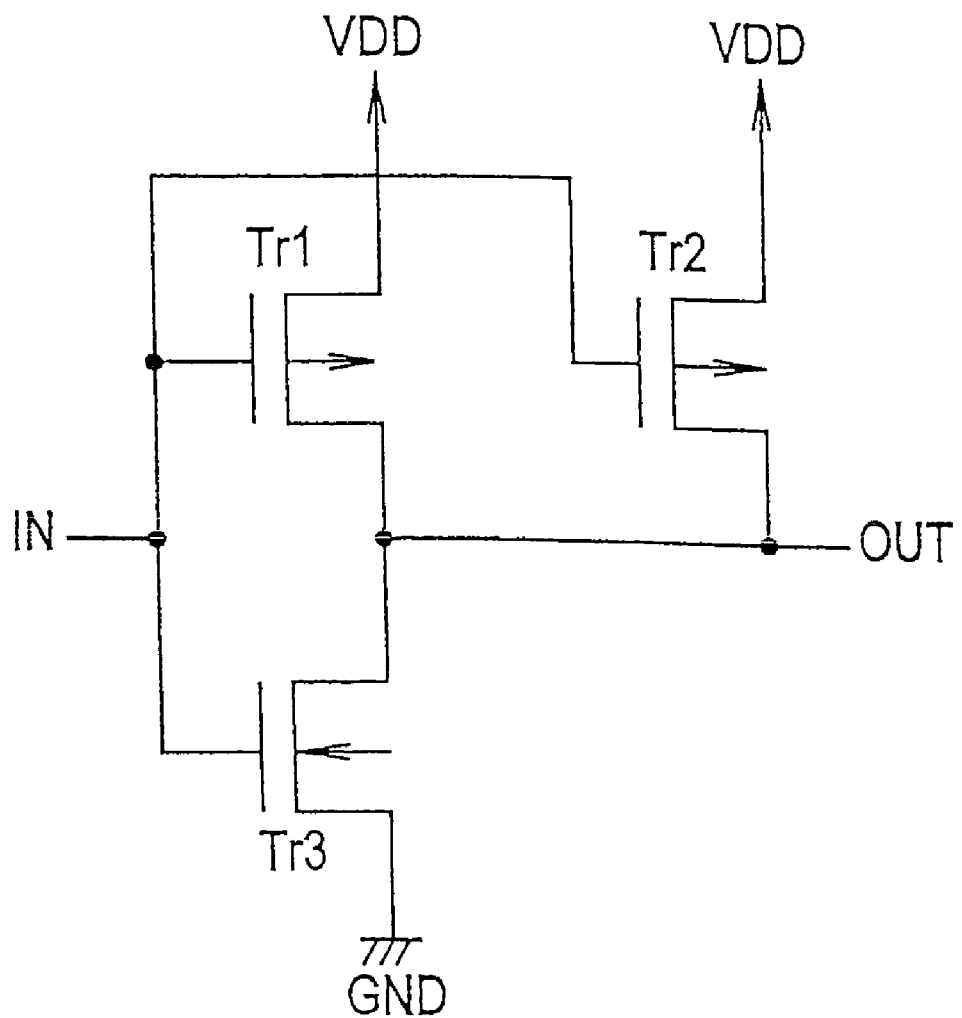
FIG. 39 is a circuit diagram showing the connections between component elements of the inverter shown in FIG. 37.
Figure 40:
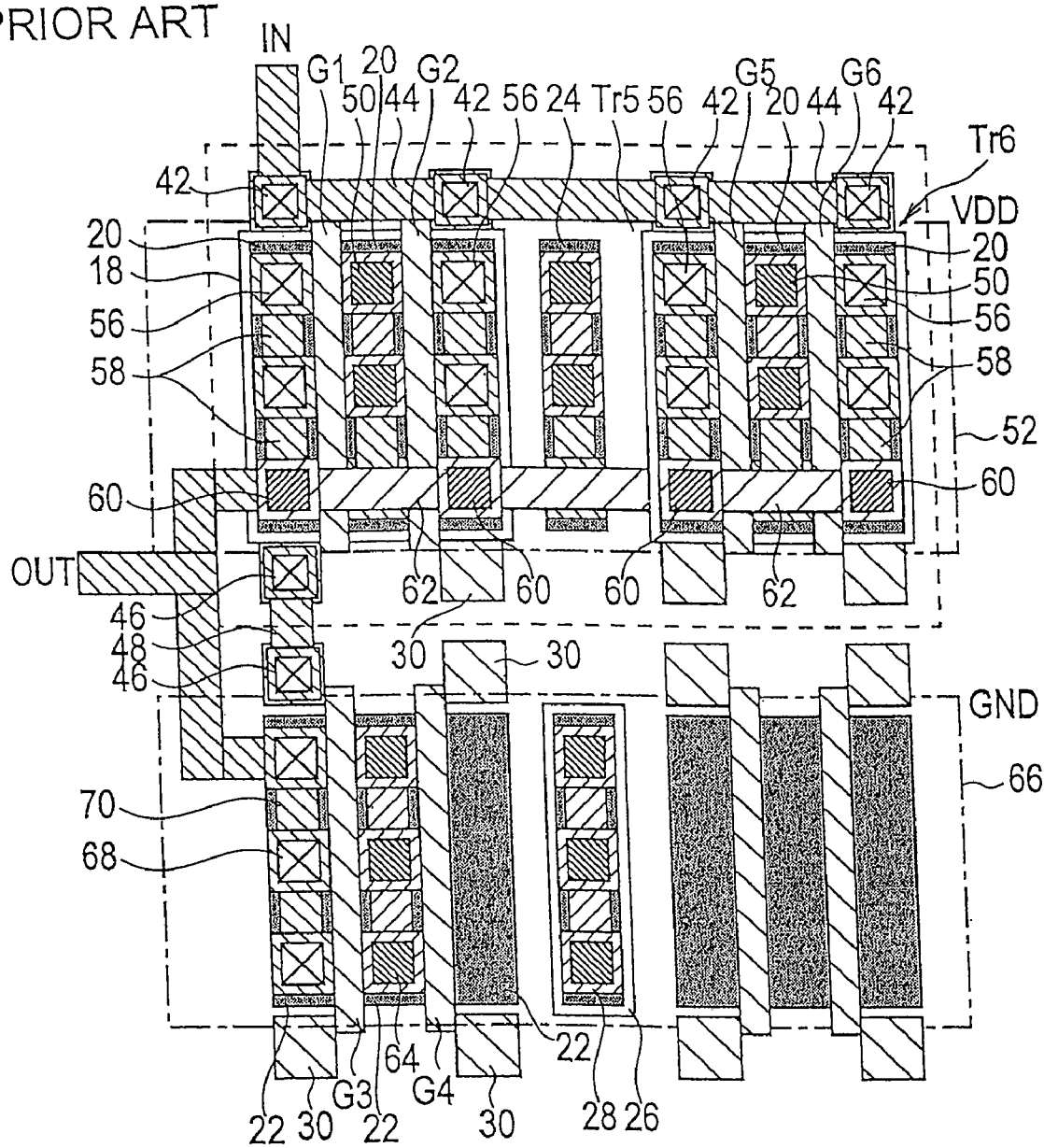
FIG. 40 is a mask pattern diagram showing a second example of the configuration of an inverter using a conventional basic cell; and, FIG. 41 is a circuit diagram showing the connections between component elements of the inverter shown in FIG. 40.

As explained above, the gate width W1 of the gate of PMOS transistor Tr1 and the gate width W3 of the gate of NMOS transistor Tr3 are such that W1:W3=2:1. Hence the inverter shown in FIG. 2 is equivalent to the circuit shown in FIG. 39. In the case of the configuration of FIG. 2, the unused PMOS transistor Tr2 and NMOS transistor Tr4 can be used to draw another inverter. In this way, basic cells of the first embodiment can be employed in efficient drawing of diagrams.

Figure 4:
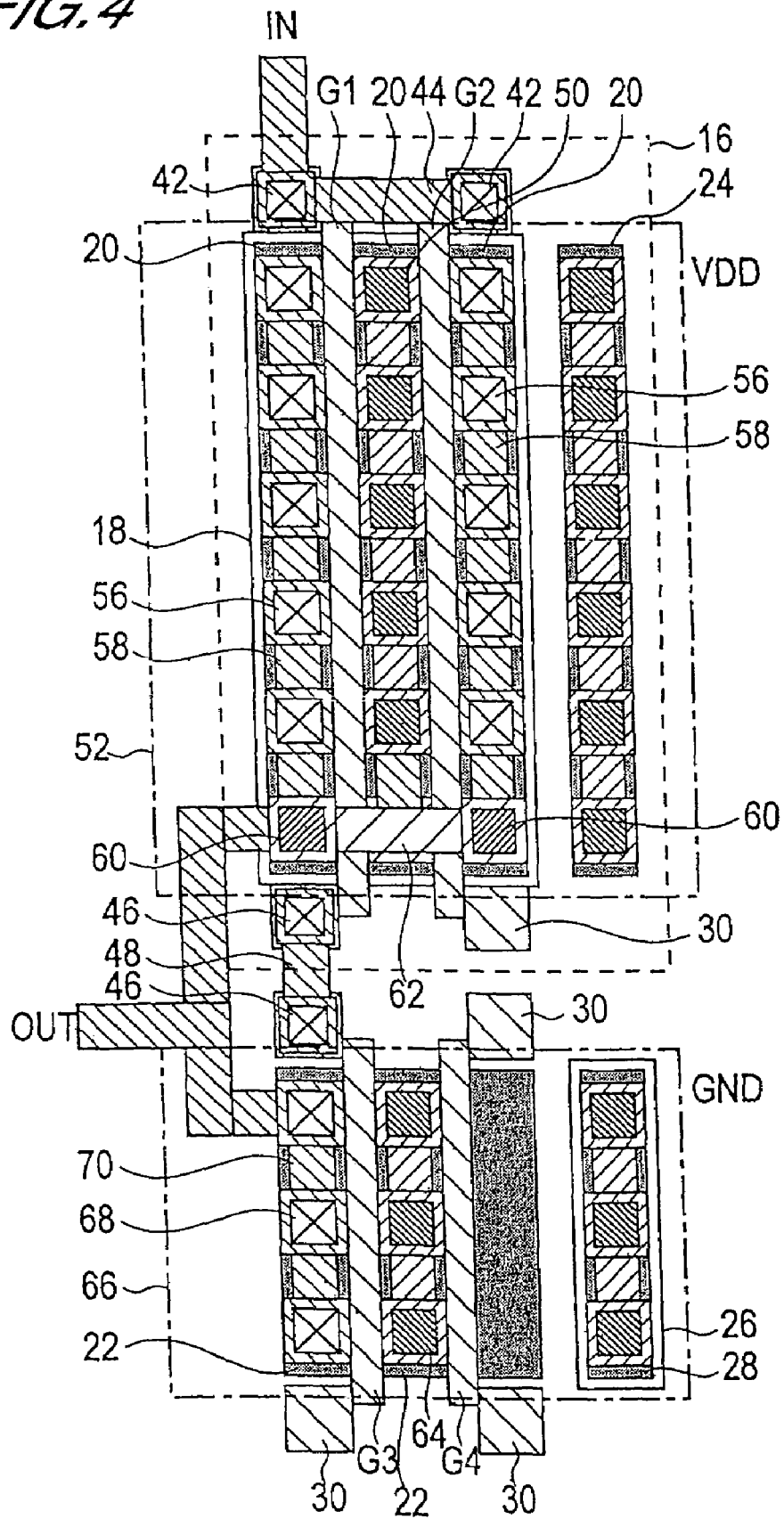
FIG. 4 is a mask pattern diagram showing a second example of the configuration of an inverter using a basic cell of the first embodiment.

Next, FIG. 4 is a mask pattern diagram showing a second example of the configuration of an inverter using a basic cell of the first embodiment. The various shadings in FIG. 4 each have the same meaning as in FIG. 37.

In this inverter, the gate G1 of PMOS transistor Tr1 and the gate G2 of PMOS transistor Tr2 are connected to the first metal layer 44 via contacts 42 provided on polysilicon films for wiring connection. These gates G1 and G2 are electrically connected via the first metal layer 44, and this first metal layer 44 is connected to the input terminal IN.

The gate G1 of PMOS transistor Tr1 and gate G3 of NMOS transistor Tr3 are connected to the first metal layer 48 via contacts 46 provided on polysilicon film for wiring connection. These gates G1 and G3 are electrically connected via the first metal layer 48.

The active region 20 between the gate G1 of PMOS transistor Tr1 and gate G2 of PMOS transistor Tr2 is connected to the third metal layer 52 via first and second through-holes 50. The third metal layer 52 is connected to the active region 24 for connection to the power supply (VDD).

The other active regions 20 of PMOS transistors Tr1 and Tr2 are connected to the first metal layers 58 via contacts 56. These first metal layers 58 on these active regions 20 are connected, via the second through-hole 60, to the second metal layer 62 on the gates G1 and G2. The first metal layers 58 on these active regions 20 are connected to each other by this second metal layer 62. The first metal layers 58 are connected to the output terminal OUT.

The active region 22 between the gate G3 of NMOS transistor Tr3 and gate G4 of NMOS transistor Tr4 is connected to the third metal layer 66 via first and second through-holes 64. This third metal layer 66 is connected to the active region 28 for connection to ground (GND). The other active region 22 of NMOS transistor Tr3 is connected to the first metal layer 70 via the contact 68. This first metal layer 70 is connected to the output terminal OUT.

Figure 5:
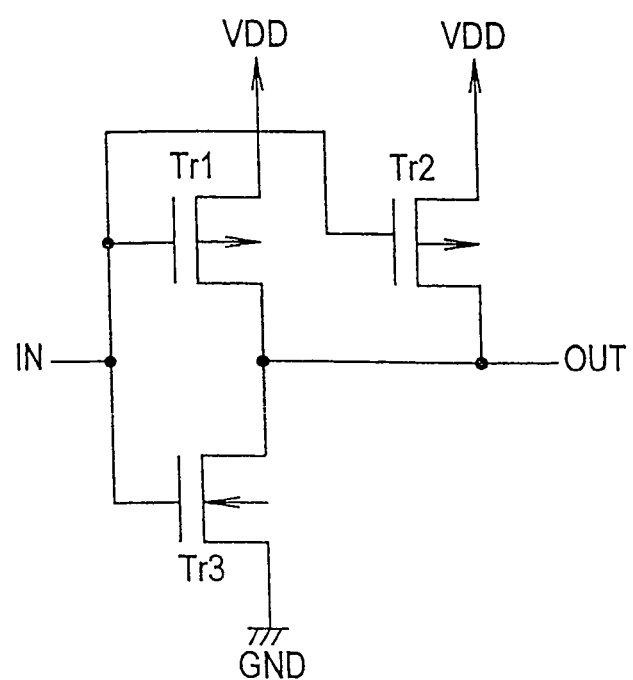
FIG. 5 is a circuit diagram showing the connections between component elements of the inverter shown in FIG. 4.

FIG. 5 is a circuit diagram showing the connections between component elements of the inverter shown in FIG. 4. As shown in FIG. 5, the channel of PMOS transistor Tr1 and channel of NMOS transistor Tr3 are connected in series between the power supply VDD and ground GND, in this order from the side of the power supply VDD. Also, the channel of PMOS transistor Tr2 and channel of NMOS transistor Tr3 are connected in series between the power supply VDD and ground GND, in this order from the side of the power supply VDD. The gates of each of transistors Tr1 through Tr3 are connected to the input terminal IN. The point of connection of the channel of PMOS transistor Tr1 and the channel of NMOS transistor Tr3, and the point of connection of the channel of PMOS transistor Tr2 and the channel of NMOS transistor Tr3, are both connected to the output terminal OUT.

Figure 41:
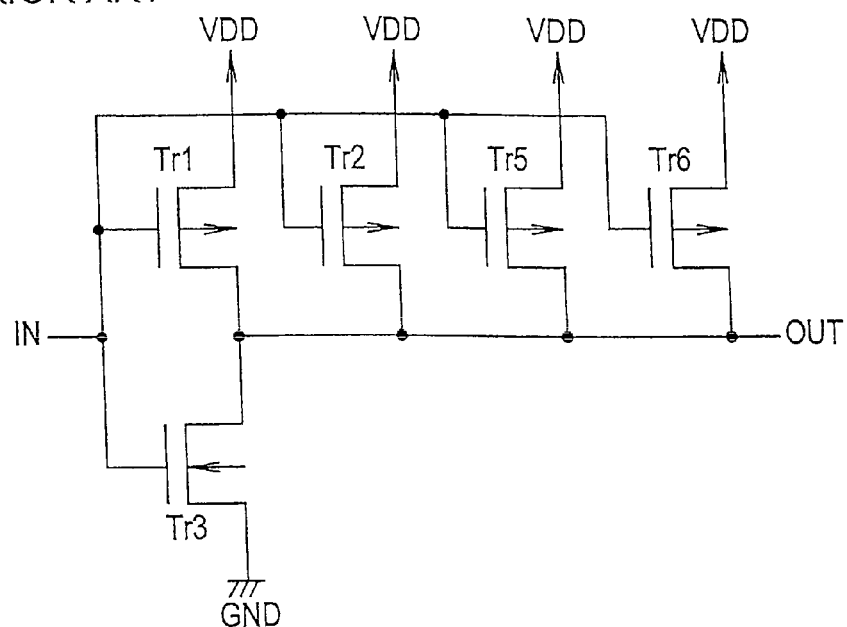

As explained above, the gate width W1 of the gate of PMOS transistor Tr1, the gate width W2 of the gate of PMOS transistor Tr2, and the gate width W3 of the gate of NMOS transistor Tr3 are selected such that W1:W2:W3=2:2:1. Hence the inverter shown in FIG. 4 is equivalent to the circuit shown in FIG. 41. In the case of the configuration of FIG. 4, the number of unused NMOS transistors is reduced compared with the configuration shown in FIG. 41. In this way, basic cells of the first embodiment can be employed in efficient drawing of diagrams.

Figure 6:
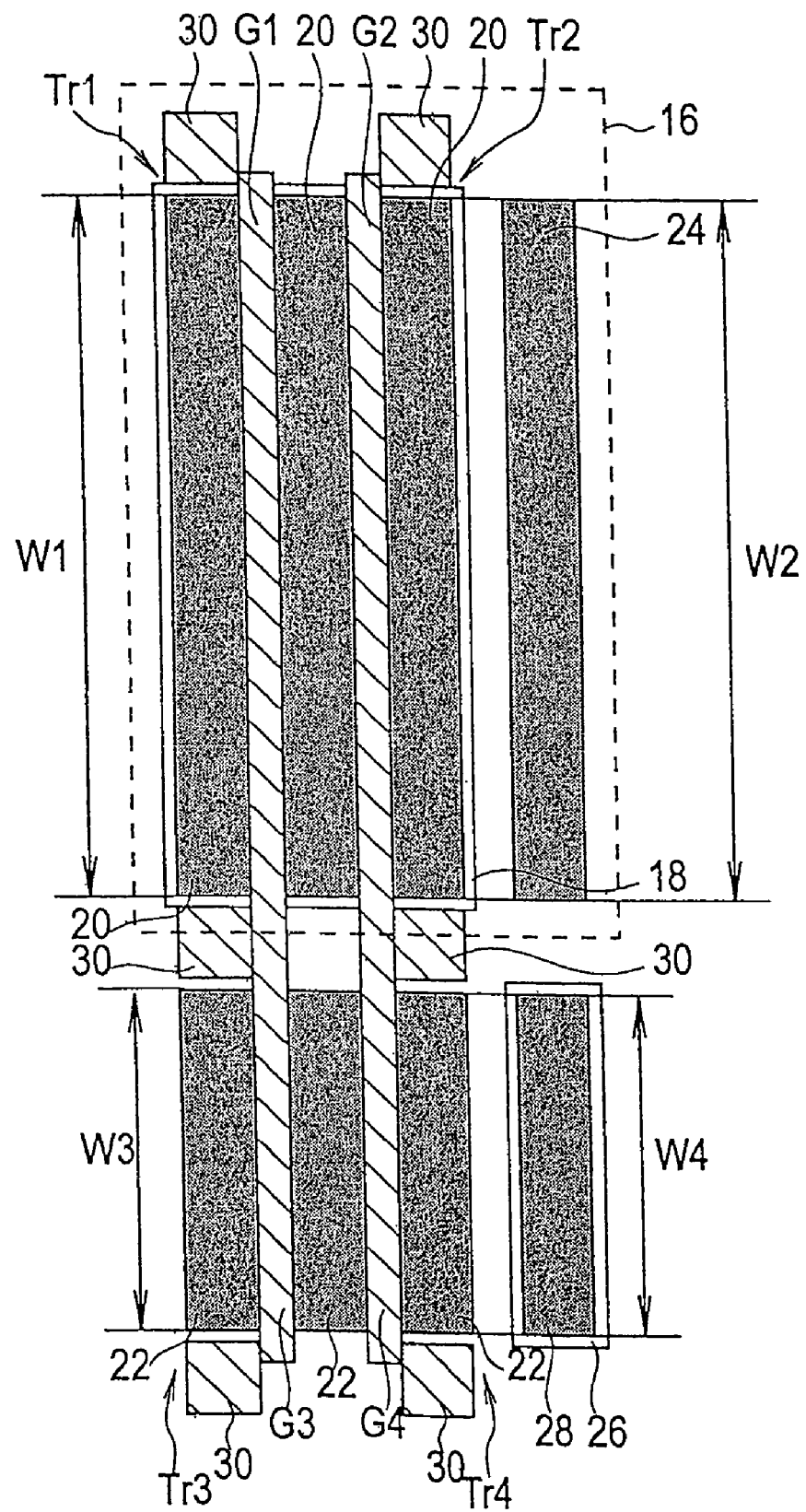
FIG. 6 is a mask pattern diagram showing a modified example of a basic cell of the first embodiment.

Next, a modified example of the basic cell of the first embodiment is shown in the mask pattern diagram of FIG. 6. The basic cell of FIG. 6 is the basic cell shown in FIG. 1, wherein the gate G1 of the first PMOS transistor Tr1 is connected in a line with the gate G3 of the first NMOS transistor Tr3, and the gate G2 of the second PMOS transistor Tr2 is connected in a line with the gate G4 of the second NMOS transistor Tr4. That is, the gates G1 and G3 comprise a single stripe-shaped polysilicon film and the gates G2 and G4 comprise a single stripe-shaped polysilicon film.

Similarly to the configuration shown in FIG. 1, polysilicon films 30 for wiring connection are provided at both ends of the polysilicon film constituting gates G1 and G3, and at both ends of the polysilicon film constituting gates G2 and G4. In addition, polysilicon films 30 for wiring connection are provided at the center of the polysilicon film constituting gates G1 and G3 (between transistors Tr1 and Tr3), and at the center of the polysilicon film constituting gates G2 and G4 (between transistors Tr2 and Tr4). Each of these polysilicon films 30 is provided in a state of connection with the respective gates G1 through G4.

Next, an example of an inverter configured using the basic cell shown in FIG. 6 is described.

Figure 7:
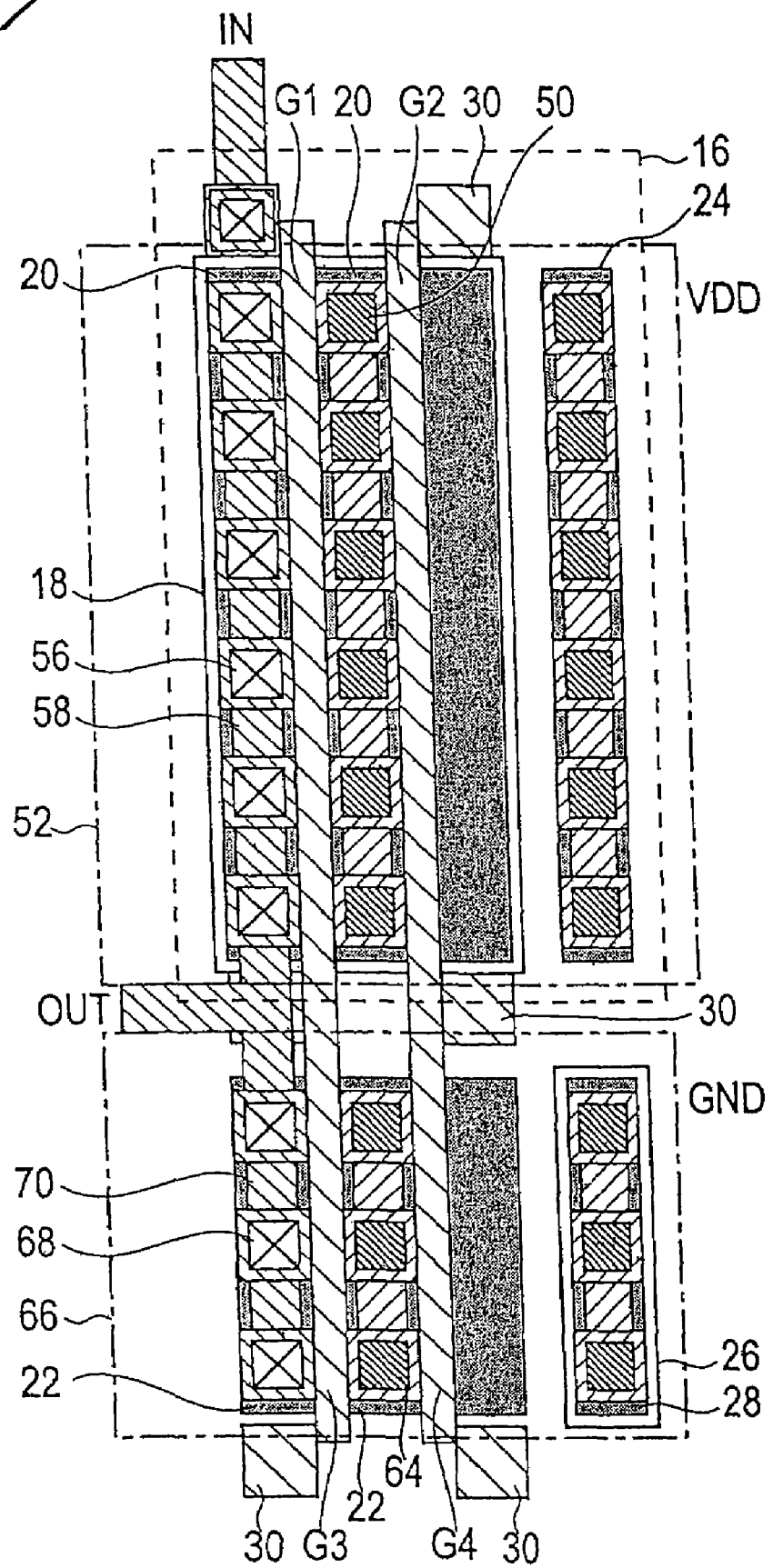
FIG. 7 is a mask pattern diagram showing a first example of the configuration of an inverter using the modified example of the basic cell of the first embodiment.

FIG. 7 is a mask pattern diagram showing a first example of the configuration of an inverter using the modified example of the basic cell of the first embodiment. The various shadings in FIG. 7 each have the same meaning as in FIG. 37.

The wiring of the inverter shown in FIG. 7 is similar to the wiring of the inverter shown in FIG. 2. The difference is that, in FIG. 7, there is no need for connection of the gate G1 of PMOS transistor Tr1 and gate G3 of NMOS transistor Tr3. This connection shown in FIG. 2 is replaced in FIG. 7 by a first metal layer 58 (70) which connects the active region 20 of PMOS transistor Tr1 and the active region 22 of NMOS transistor Tr3. Connections in the inverter of FIG. 7 are as shown in FIG. 3.

Figure 8:
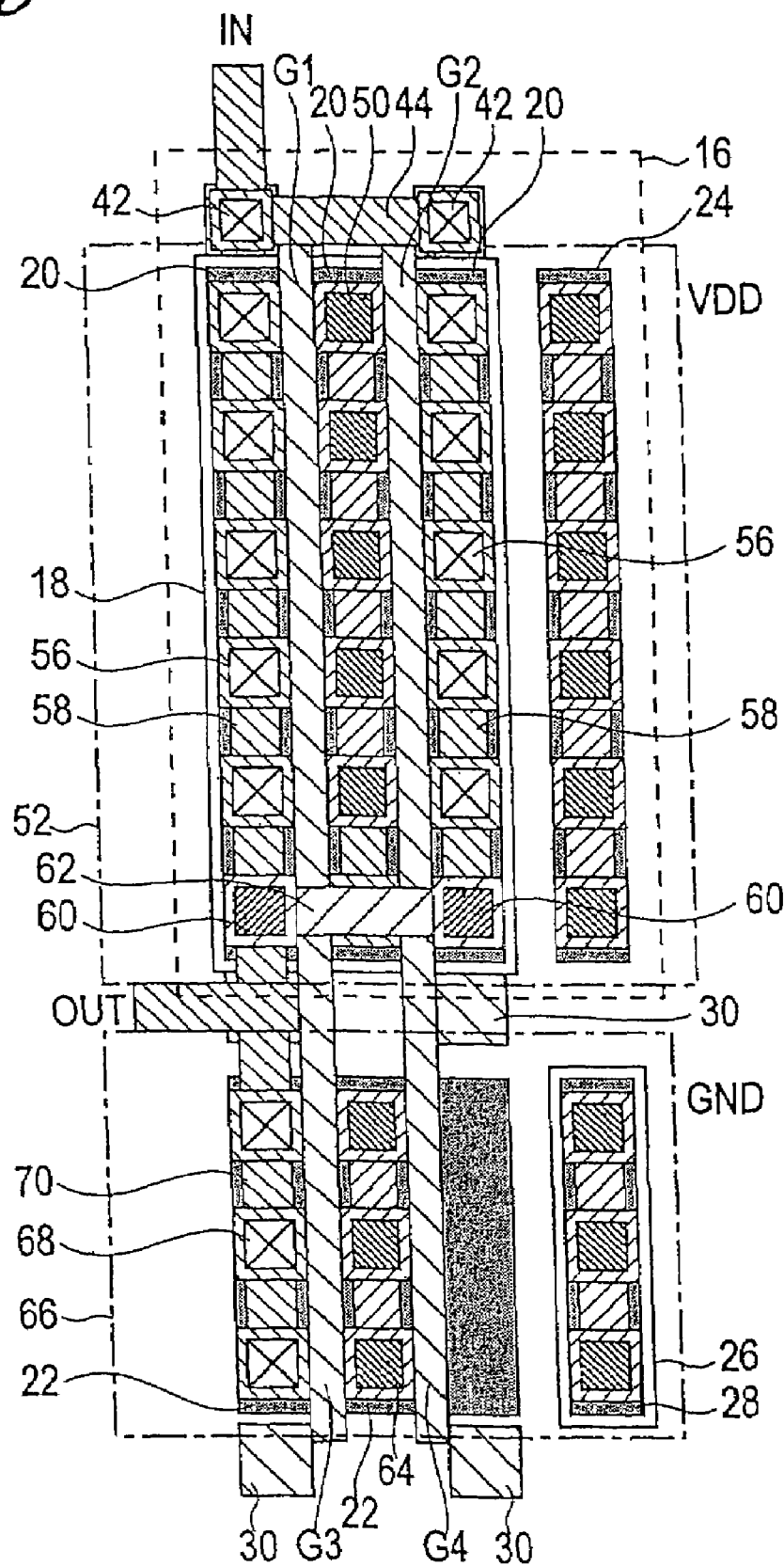
FIG. 8 is a mask pattern diagram showing a second example of the configuration of an inverter using the modified example of the basic cell of the first embodiment.

FIG. 8 is a mask pattern diagram showing a second example of the configuration of an inverter using the modified example of the basic cell of the first embodiment. The various shadings in FIG. 8 each have the same meaning as in FIG. 37.

The wiring of the inverter shown in FIG. 8 is similar to the wiring of the inverter shown in FIG. 4. The difference is that, in FIG. 8, there is no need for connection of the gate G1 of PMOS transistor Tr1 and gate G3 of NMOS transistor Tr3. This connection shown in FIG. 4 is replaced in FIG. 8 by a first metal layer 58 (70) which connects the active region 20 of PMOS transistor Tr1 and the active region 22 of NMOS transistor Tr3. Connections in the inverter of FIG. 8 are as shown in FIG. 5.

In this way, by means of the modified example of the basic cell of the first embodiment, there is no longer a need to connect the gates of the PMOS and NMOS transistors, and so labor is eliminated in the drawing of diagrams. There is the further advantage that the size of basic cells is reduced.

Second Embodiment

Figure 9:
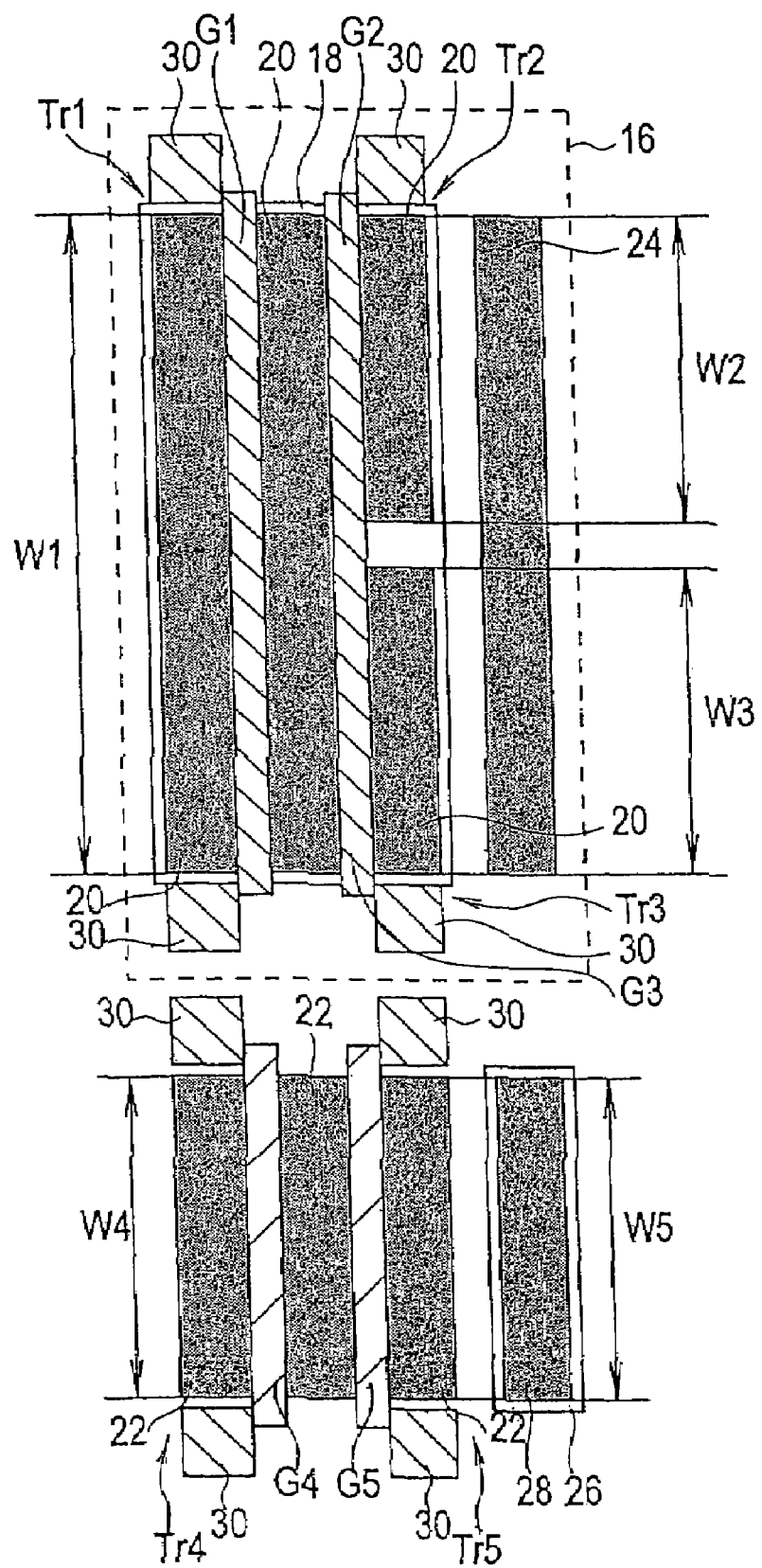
FIG. 9 is a mask pattern diagram showing a basic cell comprised by the semiconductor integrated circuit of a second embodiment.

FIG. 9 is a mask pattern diagram showing a basic cell comprised by the semiconductor integrated circuit of a second embodiment. The basic cell shown in FIG. 9 comprises a first PMOS transistor Tr1, a second PMOS transistor Tr2, a third PMOS transistor Tr3, a first NMOS transistor Tr4, and a second NMOS transistor Tr5.

Each of the transistors Tr1 through Tr5 is formed on P-type Si substrate, not shown. PMOS transistors Tr1, Tr2 and Tr3 are formed within an N-well 16 formed in the substrate. Within this N-well 16, a P-type semiconductor region 18 is formed. Within this P-type semiconductor region 18, the active regions 20 of the PMOS transistors Tr1, Tr2 and Tr3 are formed. Also, two parallel stripe-shape polysilicon films are formed on these active regions 20 as the gates G1, G2 and G3 of the PMOS transistors Tr1, Tr2 and Tr3. One of the polysilicon films is used as the gate G1 of PMOS transistor Tr1, and the other polysilicon film is used as the gates G2 and G3 of PMOS transistors Tr2 and Tr3.

In this way, in this example, PMOS transistors Tr2 and Tr3 are juxtaposed with respect to PMOS transistor Tr1. The gate G2 of PMOS transistor Tr2 is connected in a line with the gate G3 of PMOS transistor Tr3.

On the other hand, the active regions 22 of NMOS transistors Tr4 and Tr5 are formed in a region adjacent to the N-well 16. On these active regions 22 are provided two parallel stripe-shaped polysilicon films, as the gates G4 and G5 of the NMOS transistors Tr4 and Tr5. As shown in FIG. 9, the NMOS transistor Tr5 and NMOS transistor Tr4 are juxtaposed.

The gates of each of these transistors Tr1 through Tr5 are mutually parallel. The gate G1 of PMOS transistor Tr1 is provided in a line with the gate G4 of NMOS transistor Tr4, that is, arranged on a straight line. Similarly, the gate G3 of PMOS transistor Tr3 is provided in a line with the gate G5 of NMOS transistor Tr5.

In this embodiment, the gate width W1 of the gate G1 of the first PMOS transistor Tr1, the gate width W2 of the gate G2 of the second PMOS transistor Tr2, the gate width W3 of the gate G3 of the third PMOS transistor Tr3, the gate width W4 of the gate G4 of the first NMOS transistor Tr4, and the gate width W5 of the gate G5 of the second NMOS transistor Tr5 are, substantially, selected such that $$W1:W2:W3:W4:W5=2:1:1:1:1.$$

Further, an active region 24 for connection of the power supply (VDD) is formed within the N-well 16 and adjacent to PMOS transistors Tr2 and Tr3. A P-type semiconductor region 26 is formed outside the N-well 16 and adjacent to NMOS transistor Tr5. In this P-type semiconductor region 26 is formed an active region 28 for connection to ground (GND).

Polysilicon films 30 for wiring connection are provided at both ends of each of the gates G1 through G5. Each of these polysilicon films 30 is provided in a state of connection to the respective gates G1 through G5.

Next, an example of an inverter configured from this basic cell is described.

Figure 10:
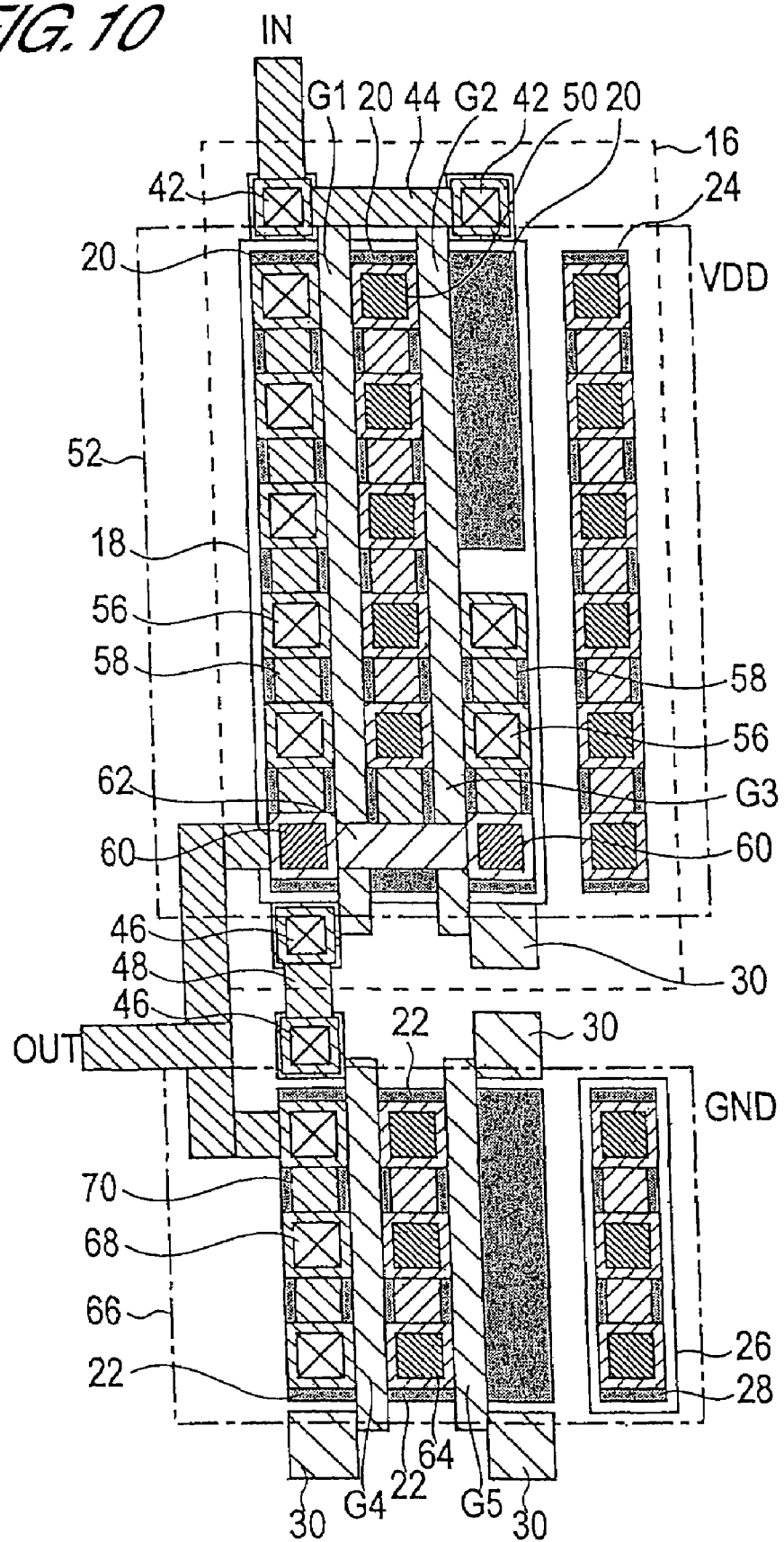
FIG. 10 is a mask pattern diagram showing an example of the configuration of an inverter using a basic cell of the second embodiment.

FIG. 10 is a mask pattern diagram showing an example of the configuration of an inverter using a basic cell of the second embodiment. The various shadings in FIG. 10 each have the same meaning as in FIG. 37.

In this inverter, the gate G1 of PMOS transistor Tr1 and gate G3 of PMOS transistor Tr3 are connected to the first metal layer 44 via contacts 42 provided on polysilicon films for wiring connection. These gates G1 and G3 are electrically connected by the first metal layer 44, and this first metal layer 44 is connected to the input terminal IN.

The gate G1 of PMOS transistor Tr1 and gate G4 of NMOS transistor Tr4 are connected to the first metal layer 48 via contacts 46 provided on polysilicon films for wiring connection. These gates G1 and G4 are electrically connected by the first metal layer 48.

The active region 20 between gate G1 of PMOS transistor Tr1 and the gate G3 of PMOS transistor Tr3 is connected to the third metal layer 52 via the first and second through-holes 50. This third metal layer 52 is connected to the active region 24 for connection to the power supply (VDD).

The other active regions 20 of the PMOS transistors Tr1 and Tr3 are connected to the first metal layers 58 via contacts 56. The first metal layers 58 on these active regions 20 are connected to the second metal layer 62 on gates G1 and G3 via a second through-hole 60. The first metal layers 58 on these active regions 20 are mutually connected by means of the second metal layer 62. The first metal layers 58 are connected to the output terminal OUT.

The active region 22 between the gate G4 of NMOS transistor Tr4 and gate G5 of NMOS transistor Tr5 is connected to the third metal layer 66 via first and second through-holes 64. This third metal layer 66 is connected to the active region 28 for connection to ground (GND). The other active region 22 of NMOS transistor Tr4 is connected to the first metal layer 70 via contact 68. This first metal layer 70 is connected to the output terminal OUT.

Figure 11:
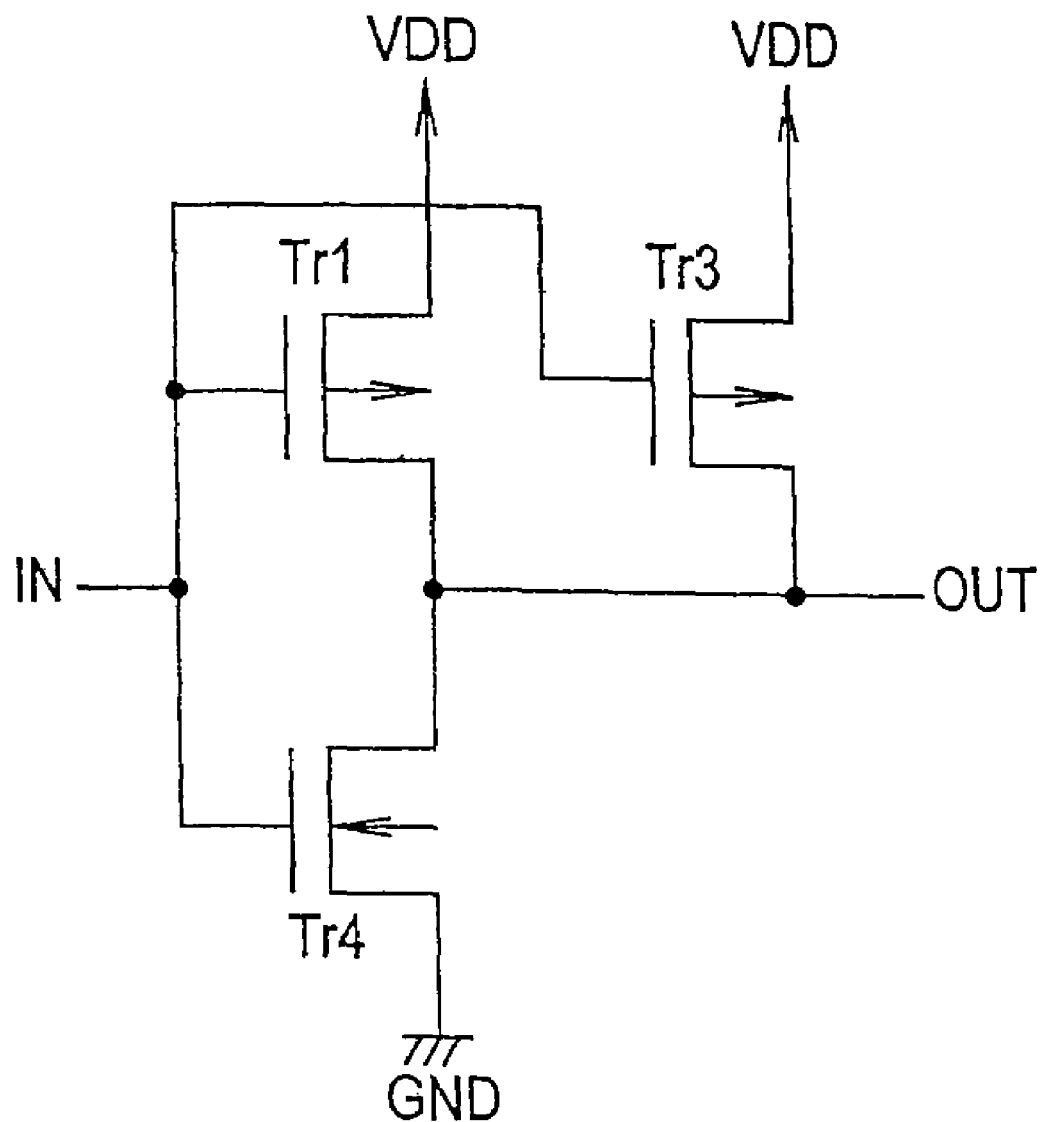
FIG. 11 is a circuit diagram showing the connections between component elements of the inverter shown in FIG. 10.

FIG. 11 is a circuit diagram showing the connections between component elements of the inverter shown in FIG. 10. As shown in FIG. 11, the channel of PMOS transistor Tr1 and the channel of NMOS transistor Tr4 are connected in series between the power supply VDD and ground GND, in this order from the power supply VDD. Further, the channel of PMOS transistor Tr3 and the channel of NMOS transistor Tr4 are connected in series between the power supply VDD and ground GND, in this order from the power supply VDD. The gates of each of the transistors Tr1, Tr3 and Tr4 are connected to the input terminal IN. The point of connection of the channel of PMOS transistor Tr1 and the channel of NMOS transistor Tr4, and the point of connection of PMOS transistor Tr3 and the channel of NMOS transistor Tr4, are both connected to the output terminal OUT.

As explained above, by means of this configuration of the basic cell, finer adjustment of the threshold voltage Vth and delay time Tpd becomes possible.

Figure 12:
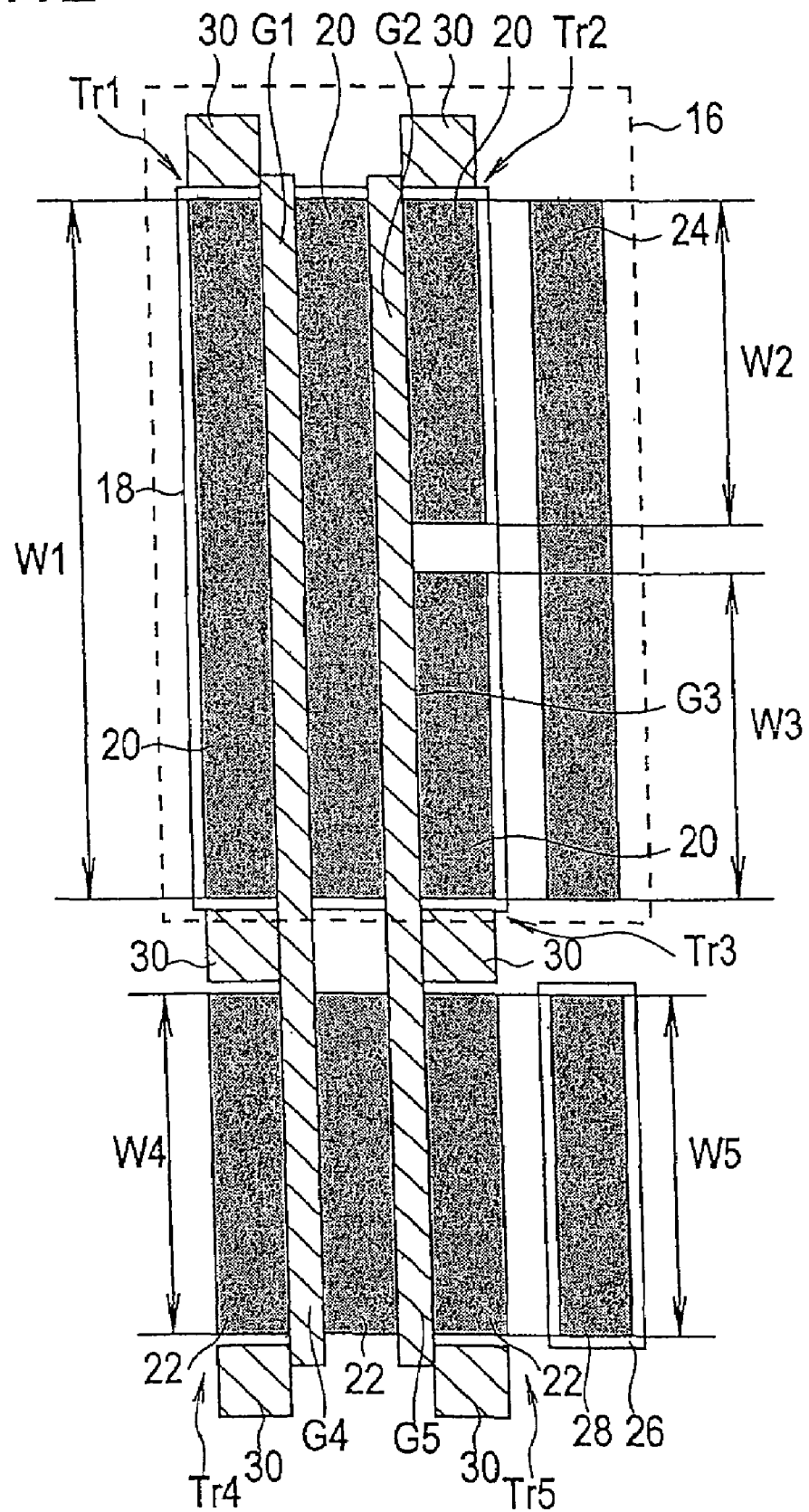
FIG. 12 is a mask pattern diagram showing a modified example of a basic cell of the second embodiment.

Next, a modified example of the basic cell of the second embodiment is shown in the mask pattern diagram of FIG. 12. The basic cell of FIG. 12 is the basic cell shown in FIG. 9, wherein the gate G1 of PMOS transistor Tr1 is connected in a line with gate G4 of NMOS transistor Tr4, and moreover gate G3 of PMOS transistor Tr3 is connected in a line with gate G5 of NMOS transistor Tr5. That is, gates G1 and G4 comprise a single stripe-shaped polysilicon film, and gates G2, G3 and G5 comprise a single stripe-shaped polysilicon film.

Similarly to the configuration shown in FIG. 9, polysilicon films 30 for wiring connection are provided at both ends of the polysilicon film constituting gates G1 and G4, and at both ends of the polysilicon film constituting gates G2, G3 and G5. In addition, polysilicon films 30 for wiring connection are provided at the center of the polysilicon film constituting gates G1 and G4 (between transistors Tr1 and Tr4), and at the center of the polysilicon film constituting gates G2, G3 and G5 (between transistors Tr3 and Tr5). Each of these polysilicon films 30 is provided in a state of connection with the respective gates G1 through G5.

Figure 13:
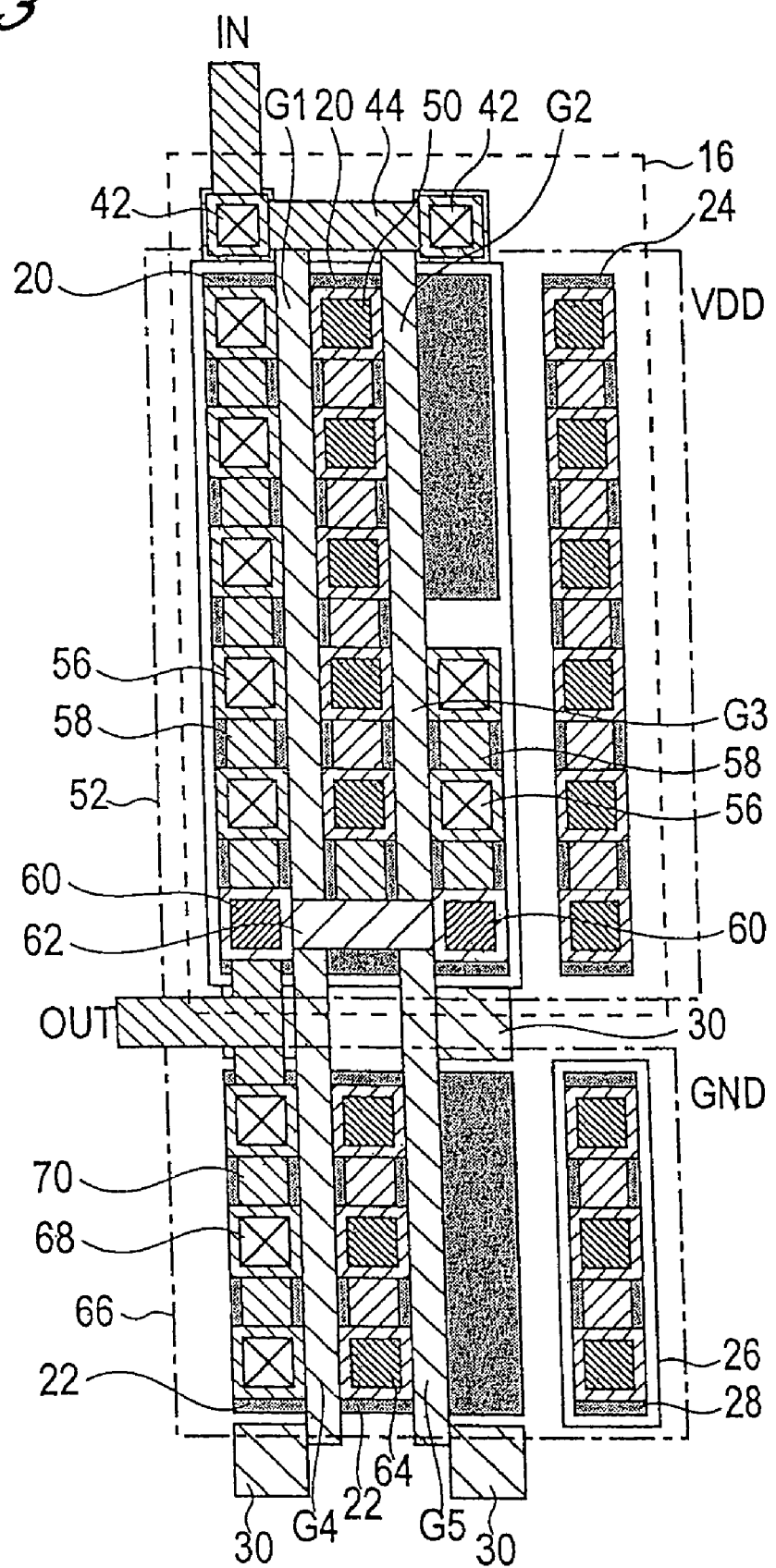
FIG. 13 is a mask pattern diagram showing an example of the configuration of an inverter using the modified example of the basic cell of the second embodiment.

FIG. 13 is a mask pattern diagram showing an example of the configuration of an inverter using the modified example of the basic cell of the second embodiment. The various shadings in FIG. 13 each have the same meaning as in FIG. 37.

The wiring of the inverter shown in FIG. 13 is similar to the wiring of the inverter shown in FIG. 10. The difference is that, in FIG. 13, there is no need for connection of the gate G1 of PMOS transistor Tr1 and gate G4 of NMOS transistor Tr4. This connection shown in FIG. 10 is replaced in FIG. 13 by a first metal layer 58 (70) which connects the active region 20 of PMOS transistor Tr1 and the active region 22 of NMOS transistor Tr4. Connections in the inverter of FIG. 13 are as shown in FIG. 11.

In this way, by means of the modified example of the basic cell of the second embodiment, there is no longer a need to connect the gates of the PMOS and NMOS transistors, and so labor is eliminated in the drawing of diagrams. There is the further advantage that the size of basic cells is reduced.

Third Embodiment

Figure 14:
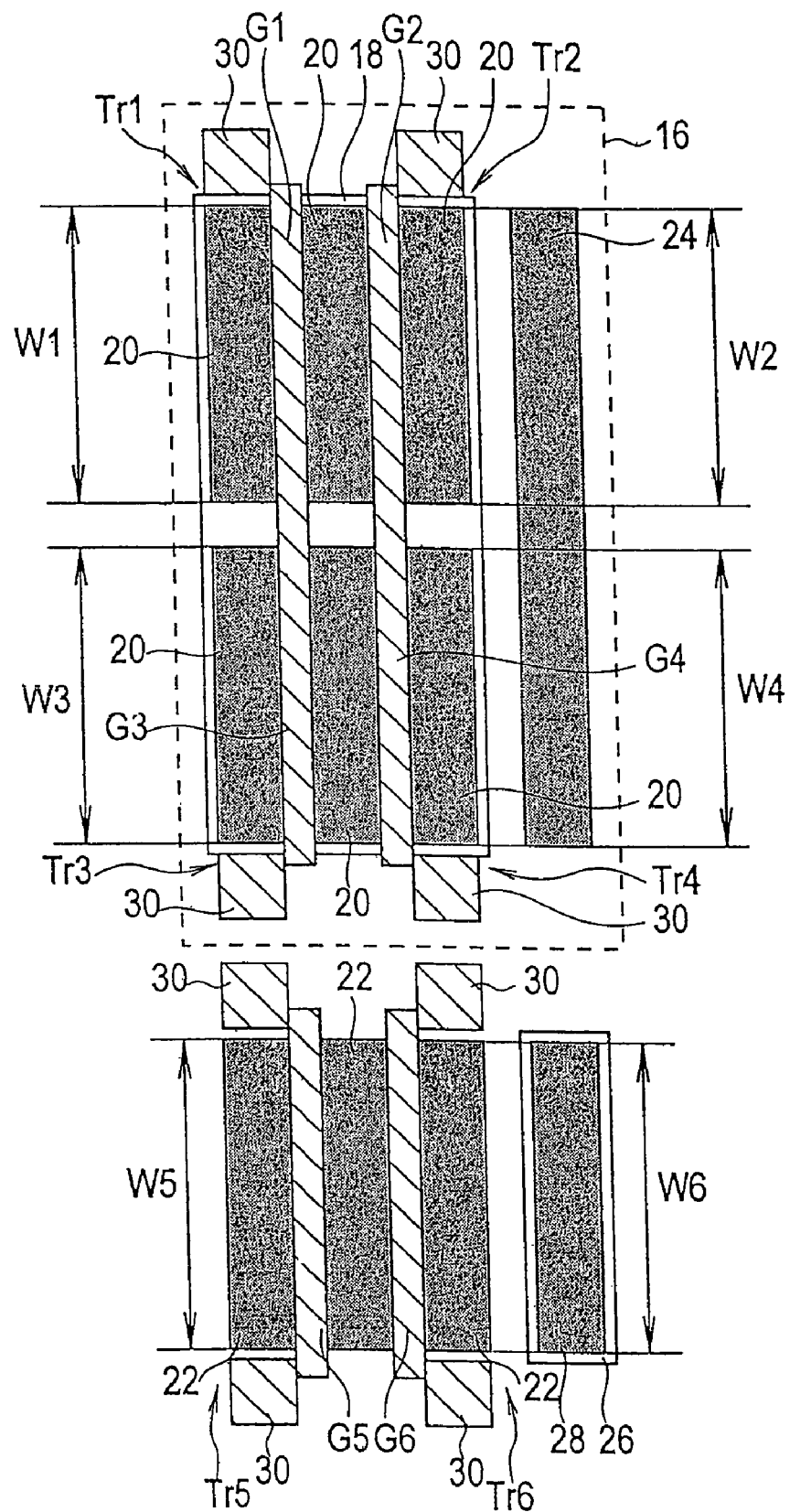
FIG. 14 is a mask pattern diagram showing a basic cell comprised by the semiconductor integrated circuit of a third embodiment.

FIG. 14 is a mask pattern diagram showing a basic cell comprised by the semiconductor integrated circuit of a third embodiment. The basic cell shown in FIG. 14 comprises a first PMOS transistor Tr1, a second PMOS transistor Tr2, a third PMOS transistor Tr3, a fourth PMOS transistor Tr4, a first NMOS transistor Tr5, and a second NMOS transistor Tr6.

Each of the transistors Tr1 through Tr6 is formed oh P-type Si substrate, not shown. PMOS transistors Tr1 through Tr4 are formed within an N-well 16 formed in the substrate. Within this N-well 16, a P-type semiconductor region 18 is formed. Within this P-type semiconductor region 18, the active regions 20 of the PMOS transistors Tr1 through Tr4 are formed. Also, two parallel stripe-shape polysilicon films are formed on these active regions 20 as the gates G1, G2, G3 and G4 of the PMOS transistors Tr1 through Tr4. One of the polysilicon films is used as the gates G1 and G3 of PMOS transistors Tr1 and Tr3, and the other polysilicon film is used as the gates G2 and G4 of PMOS transistors Tr2 and Tr4.

In this way, in this example, PMOS transistor Tr2 and PMOS transistor Tr1 are juxtaposed, and PMOS transistor Tr4 and PMOS transistor Tr3 are juxtaposed. The gate G1 of PMOS transistor Tr1 is connected in a line with the gate G3 of PMOS transistor Tr3, and the gate G2 of PMOS transistor Tr2 is connected in a line with the gate G3 of PMOS transistor Tr3.

On the other hand, the active regions 22 of NM OS transistors Tr5 and Tr6 are formed in a region adjacent to the N-well 16. On these active regions 22 are provided two parallel stripe-shaped polysilicon films, as the gates G5 and G6 of the NMOS transistors Tr5 and Tr6. As shown in FIG. 14, the NMOS transistor Tr6 and NMOS transistor Tr5 are juxtaposed.

The gates of each of these transistors Tr1 through Tr6 are mutually parallel. The gate G3 of PMOS transistor Tr3 is provided in a line with the gate G5 of NMOS transistor Tr5, that is, arranged on a straight line. Similarly, the gate G4 of PMOS transistor Tr4 is provided in a line with the gate G6 of NMOS transistor Tr6.

In this embodiment, the gate width W1 of the gate G1 of the first PMOS transistor Tr1, the gate width W2 of the gate G2 of the second PMOS transistor Tr2, the gate width W3 of the gate G3 of the third PMOS transistor Tr3, the gate width W4 of the gate G4 of the fourth PMOS transistor Tr4, the gate width W5 of the gate G5 of the first NMOS transistor Tr5, and the gate width W6 of the gate G6 of the second NMOS transistor Tr6 are selected such that $W1:W2:W3:W4:W5:W6=1:1:1:1:1:1$.

Further, an active region 24 for connection of the power supply (VDD) is formed within the N-well 16 and adjacent to PMOS transistors Tr2 and Tr4. A P-type semiconductor region 26 is formed outside the N-well 16 and adjacent to NMOS transistor Tr6. In this P-type semiconductor region 26 is formed an active region 28 for connection to ground (GND).

Polysilicon films 30 for wiring connection are provided at both ends of each of the gates G1 through G6. Each of these polysilicon films 30 is provided in a state of connection to the respective gates G1 through G6.

Next, an example of an inverter configured from this basic cell is described.

Figure 15:
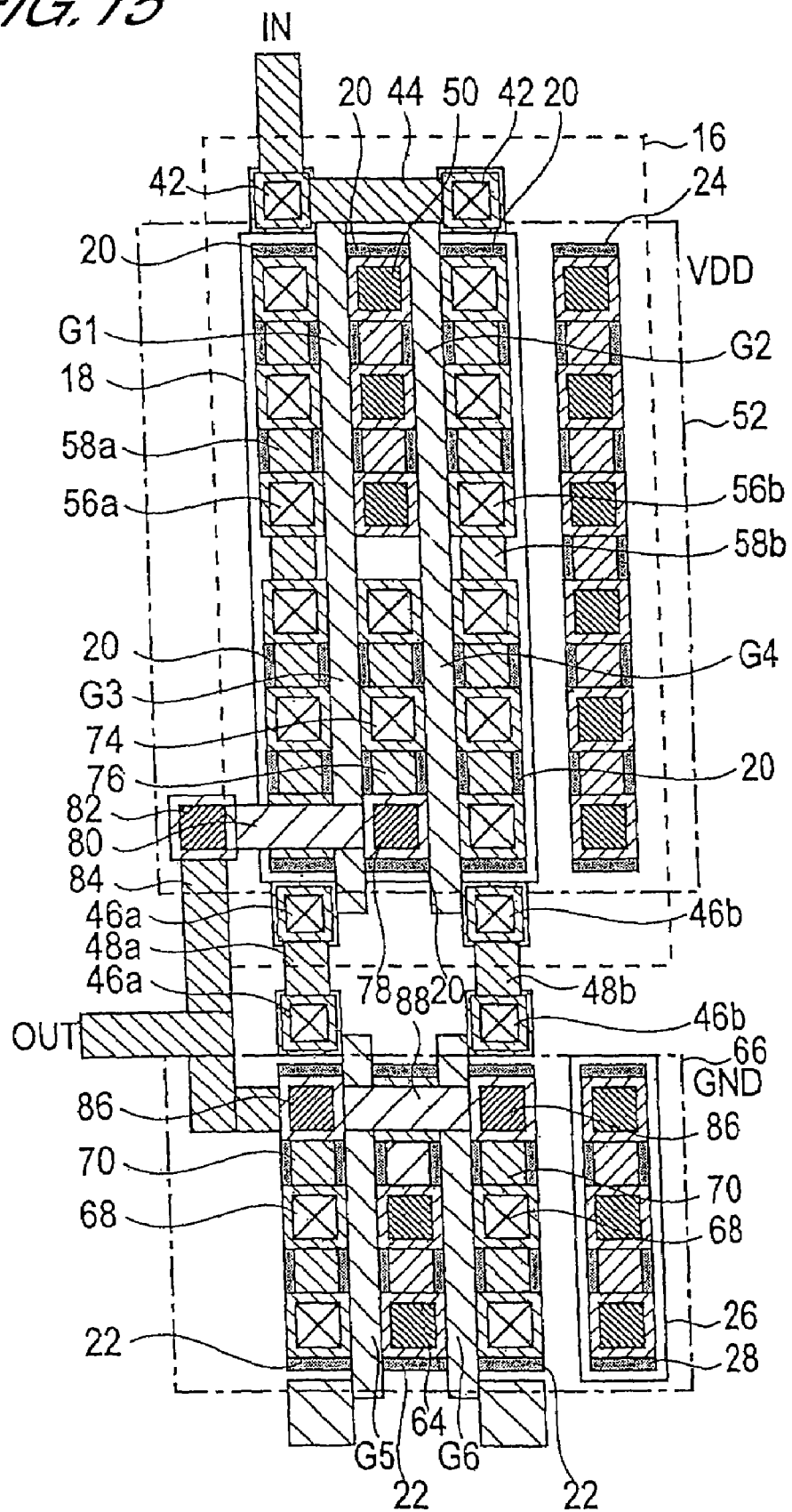
FIG. 15 is a mask pattern diagram showing an example of the configuration of an inverter using a basic cell of the third embodiment.

FIG. 15 is a mask pattern diagram showing an example of the configuration of an inverter using a basic cell of the third embodiment. The various shadings in FIG. 15 each have the same meaning as in FIG. 37.

In this inverter, the gate G1 of PMOS transistor Tr1 (gate G3 of PMOS transistor Tr3) and gate G2 of PMOS transistor Tr2 (gate G4 of PMOS transistor Tr4) are connected to the first metal layer 44 via contacts 42 provided on polysilicon films for wiring connection. These gates G1 through G4 are electrically connected by the first metal layer 44, and this first metal layer 44 is connected to the input terminal IN.

The gate G1 of PMOS transistor Tr1 (gate G3 of PMOS transistor Tr3) and gate G5 of NMOS transistor Tr5 are connected to the first metal layer 48a via contacts 46a provided on polysilicon films for wiring connection. These gates G1, G3 and G5 are electrically connected by the first metal layer 48a.

The gate G2 of PMOS transistor Tr2 (gate G4 of PMOS transistor Tr4) and gate G6 of NMOS transistor Tr6 are connected to the first metal layer 48b via contacts 46b provided on polysilicon films for wiring connection. These gates G2, G4 and G6 are electrically connected by the first metal layer 48b.

The active region 20 between gate G1 of PMOS transistor Tr1 and the gate G2 of PMOS transistor Tr2 is connected to the third metal layer 52 via the first and second through-holes 50. This third metal layer 52 is connected to the active region 24 for connection to the power supply (VDD).

The active region 20 between the gate G3 of PMOS transistor Tr3 and gate G4 of PMOS transistor Tr4 is connected to the first metal layer 76 via contacts 74. This first metal layer 76 is connected to the second metal layer 80 on gate G3 via the second through-hole 78. This second metal layer 80 is connected to the first metal layer 84 via the second through-hole 82. This first metal layer 84 is connected to the output terminal OUT.

The other active regions 20 of the PMOS transistors Tr1 and Tr3 are connected to the first metal layer 58a via contacts 56a. These active regions 20 are electrically connected by the first metal layer 58a.

The other active regions 20 of PMOS transistors Tr2 and Tr4 are connected to the first metal layer 58b via the contacts 56b. These active regions 20 are electrically connected by the first metal layer 58b.

The active region 22 between the gate G5 of NMOS transistor Tr5 and gate G6 of NMOS transistor Tr6 is connected to the third metal layer 66 via the first and second through-holes 64. This third metal layer 66 is connected to the active region 28 for connection to ground (GND).

The other active regions 22 of the NMOS transistors Tr5 and Tr6 are connected to the first metal layers 70 via the contacts 68. The first metal layers 70 on top of these active regions 22 are connected to the second metal layer 88 oh top of the gates G5 and G6, via the second through-holes 86. The first metal layers 70 of these active regions 22 are mutually connected by the second metal layer 88. The first metal layers 70 are connected to the output terminal OUT.

Figure 16:
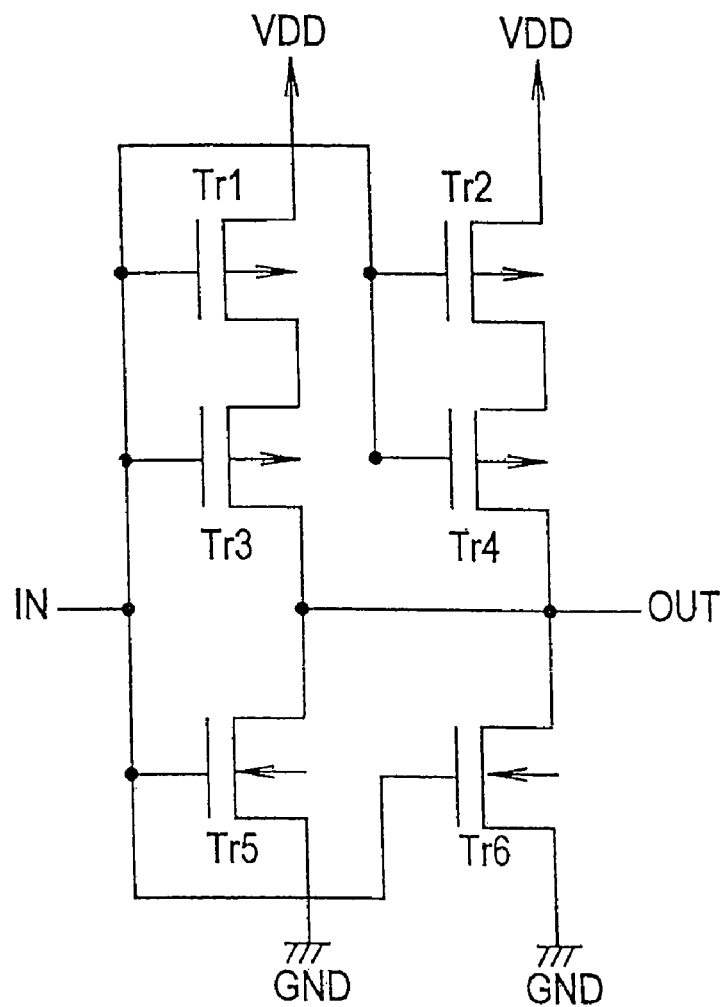
FIG. 16 is a circuit diagram showing the connections between component elements of the inverter shown in FIG. 15.

FIG. 16 is a circuit diagram showing the connections between component elements of the inverter shown in FIG. 15. As shown in FIG. 16, the channel of PMOS transistor Tr1, the channel of PMOS transistor Tr3, and the channel of NMOS transistor Tr5 are connected in series between the power supply VDD and ground GND, in this order from the power supply VDD. Further, the channel of PMOS transistor Tr2, the channel of PMOS transistor Tr4, and the channel of NMOS transistor Tr6 are connected in series between the power supply VDD and ground GND, in this order from the power supply VDD. The gates of each of the transistors Tr1 through Tr6 are connected to the input terminal IN. The point of connection of the channel of PMOS transistor Tr3 and the channel of NMOS transistor Tr5, and the point of connection of PMOS transistor Tr4 and the channel of NMOS transistor Tr6, are both connected to the output terminal OUT.

As explained above, by means of this configuration of the basic cell, finer adjustment of the threshold voltage Vth and delay time Tpd becomes possible.

Figure 17:
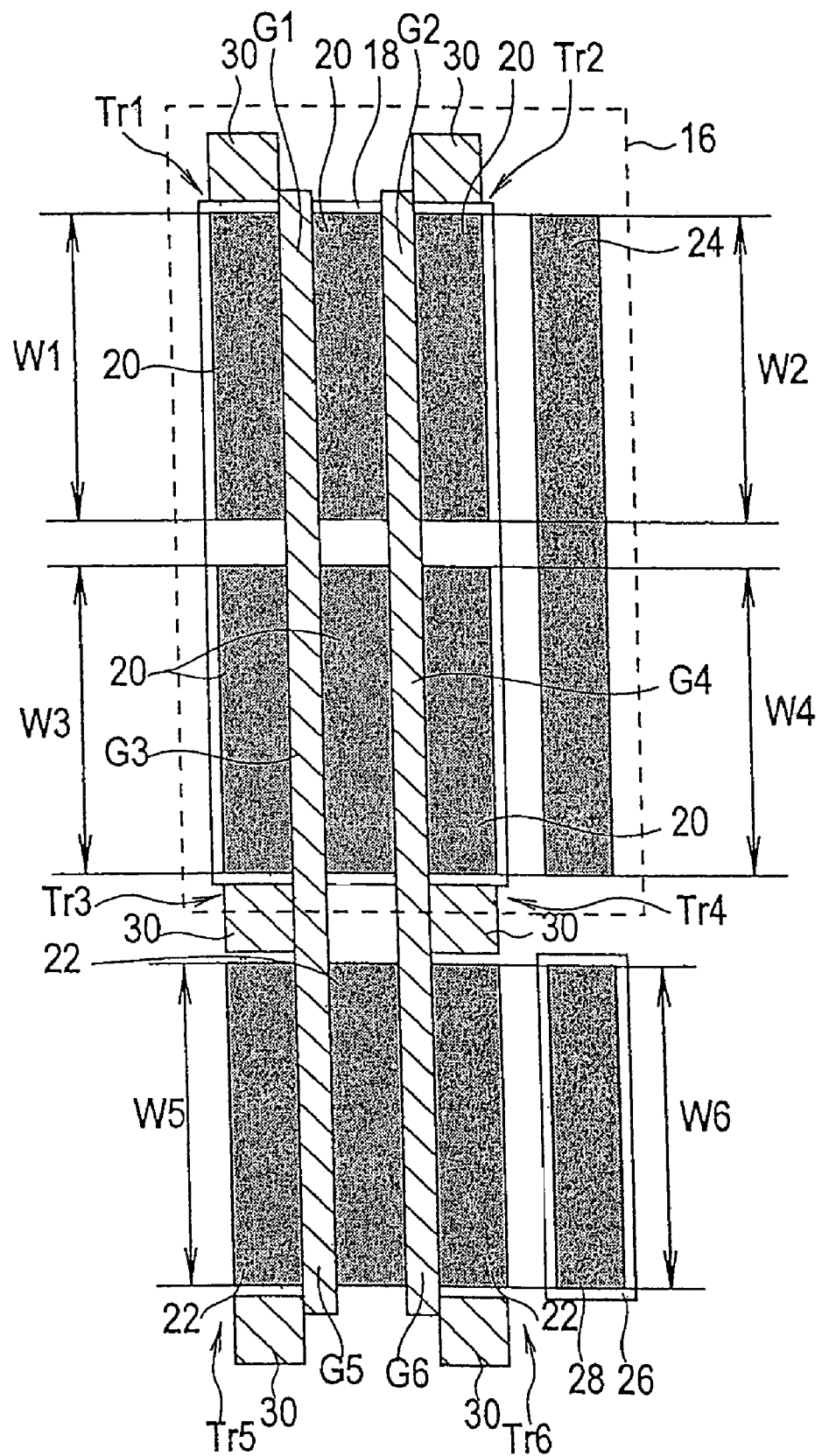
FIG. 17 is a mask pattern diagram showing a modified example of a basic cell of the third embodiment.

Next, a modified example of the basic cell of the third embodiment is shown in the mask pattern diagram of FIG. 17. The basic cell of FIG. 17 is the basic cell shown in FIG. 14, wherein the gate G3 of PMOS transistor Tr3 is connected in a line with gate G5 of NMOS transistor Tr5, and moreover gate G4 of PMOS transistor Tr4 is connected in a line with gate G6 of NMOS transistor Tr6. That is, gates G1, G3 and G5 are constituted by a single stripe-shaped polysilicon film, and gates G2, G4 and G6 are constituted by a single stripe-shaped polysilicon film.

Similarly to the configuration shown in FIG. 14, polysilicon films 30 for wiring connection are provided at both ends of the polysilicon film constituting gates G1, G3 and G5, and at both ends of the polysilicon film constituting gates G2, G4 and G6. In addition, polysilicon films 30 for wiring connection are provided at the center of the polysilicon film constituting gates G1, G3 and G5 (between transistors Tr3 and Tr5), and at the center of the polysilicon film constituting gates G2, G4 and G6 (between transistors Tr4 and Tr6). Each of these polysilicon films 30 is provided in a state of connection with the respective gates G1 through G6.

Figure 18:
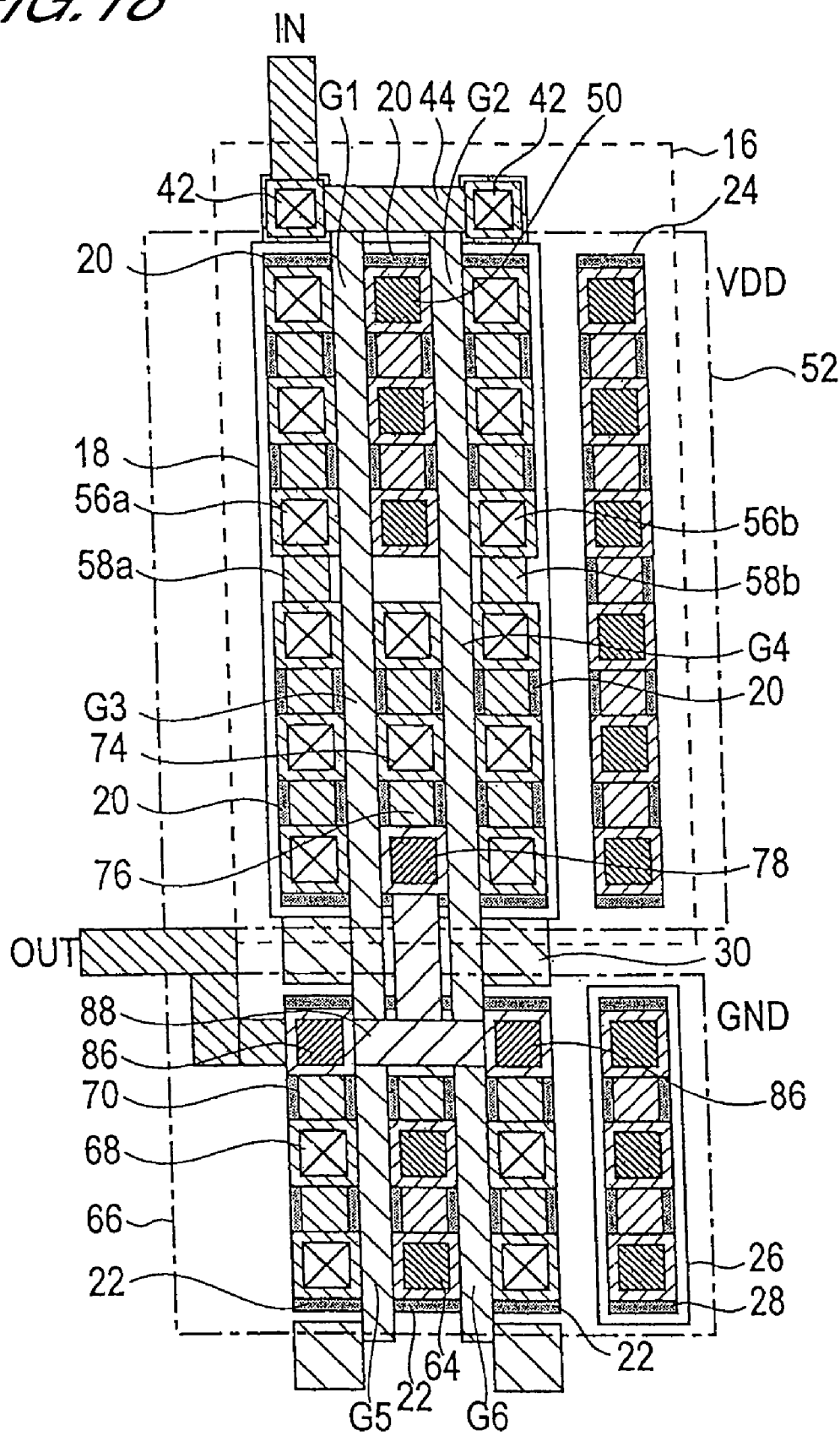
FIG. 18 is a mask pattern diagram showing an example of the configuration of an inverter using the modified example of the basic cell of the third embodiment.

FIG. 18 is a mask pattern diagram showing an example of the configuration of an inverter using the modified example of the basic cell of the third embodiment. The various shadings in FIG. 18 each have the same meaning as in FIG. 37.

The wiring of the inverter shown in FIG. 18 is similar to the wiring of the inverter shown in FIG. 15. The differences are that, in FIG. 18, there is no need for connection of the gate G3 of PMOS transistor Tr3 and gate G5 of NMOS transistor Tr5, and there is no need for connection of the gate G4 of PMOS transistor Tr4 and gate G6 of NMOS transistor Tr6. Also in FIG. 18, the active region 20 between gate G3 of PMOS transistor Tr3 and gate G4 of PMOS transistor Tr4 is connected to the first metal layer 76 via contacts 74, and this first metal layer 76 is connected to the second metal layer 88 on the NMOS side via the second through-hole 78. The connections of the inverter of FIG. 18 are as shown in FIG. 16.

In this way, by means of the modified example of the basic cell of the third embodiment, there is no longer a need to connect the gates of the PMOS and NMOS transistors, and so labor is eliminated in the drawing of diagrams. There is the further advantage that the size of basic cells is reduced.

Fourth Embodiment

Figure 19:
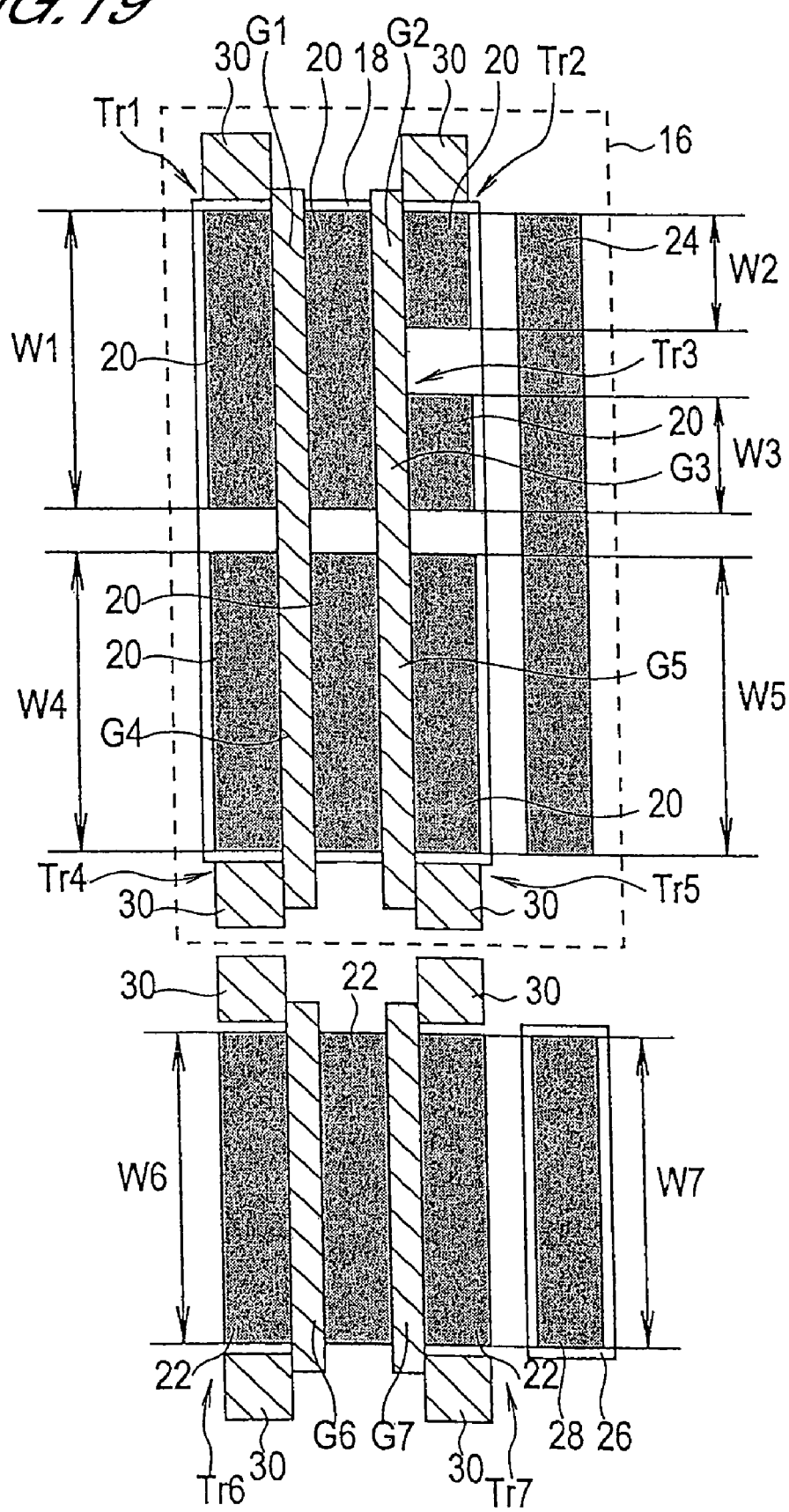
FIG. 19 is a mask pattern diagram showing a basic cell comprised by the semiconductor integrated circuit of a fourth embodiment.

FIG. 19 is a mask pattern diagram showing a basic cell comprised by the semiconductor integrated circuit of a fourth embodiment. The basic cell shown in FIG. 19 comprises a first PMOS transistor Tr1, a second PMOS transistor Tr2, a third PMOS transistor Tr3, a fourth PMOS transistor Tr4, a fifth PMOS transistor Tr5, a first NMOS transistor Tr6, and a second NMOS transistor Tr7.

Each of the transistors Tr1 through Tr7 is formed on P-type Si substrate, not shown. PMOS transistors Tr1 through Tr5 are formed within an N-well 16 formed in the substrate. Within this N-well 16, a P-type semiconductor region 18 is formed. Within this P-type semiconductor region 18, the active regions 20 of the PMOS transistors Tr1 through Tr5 are formed. Also, two parallel stripe-shape polysilicon films are formed on these active regions 20 as the gates G1, G2, G3, G4 and G5 of the PMOS transistors Tr1 through Tr5. One of the polysilicon films is used as the gates G1 and G4 of PMOS transistors Tr1 and Tr4, and the other polysilicon film is used as the gates G2, G3 and G5 of PMOS transistors Tr2, Tr3 and Tr5.

In this way, in this example, PMOS transistors Tr2 and Tr3 and PMOS transistor Tr1 are juxtaposed, and PMOS transistor Tr5 and PMOS transistor Tr4 are juxtaposed. The gate G1 of PMOS transistor Tr1 is connected in a line with the gate G4 of PMOS transistor Tr4, and the gate G2 of PMOS transistor Tr2, the gate G3 of PMOS transistor Tr3, and the gate G5 of PMOS transistor Tr5 are connected in a line.

On the other hand, the active regions 22 of NMOS transistors Tr6 and Tr7 are formed in a region adjacent to the N-well 16. On these active regions 22 are provided two parallel stripe-shaped polysilicon films, as the gates G6 and G7 of the NMOS transistors Tr6 and Tr7. As shown in FIG. 19, the NMOS transistor Tr7 and NMOS transistor Tr6 are juxtaposed.

The gates of each of these transistors Tr1 through Tr7 are mutually parallel. The gate G4 of PMOS transistor Tr4 is provided in a line with the gate G6 of NMOS transistor Tr6, that is, arranged on a straight line. Similarly, the gate G5 of PMOS transistor Tr4 is provided in a line with the gate G7 of NMOS transistor Tr7.

In this embodiment, the gate width W1 of the gate G1 of the PMOS transistor Tr1, the gate width W2 of the gate G2 of the PMOS transistor Tr2, the gate width W3 of the gate G3 of the PMOS transistor Tr3, the gate width W4 of the gate G4 of the PMOS transistor Tr4, the gate width W5 of the gate G5 of the PMOS transistor Tr5, the gate width W6 of the gate G6 of the NMOS transistor Tr6, and the gate width W7 of the gate G7 of the NMOS transistor Tr7 are selected such that

W1:W2:W3:W4:W5:W6:W7=1:⅓:⅓:1:1:1:1.

Further, an active region 24 for connection of the power supply (VDD) is formed within the N-well 16 and adjacent to PMOS transistors Tr2, Tr3 and Tr5. A P-type semiconductor region 26 is formed outside the N-well 16 and adjacent to NMOS transistor Tr7. In this P-type semiconductor region 26 is formed an active region 28 for connection to ground (GND).

Polysilicon films 30 for wiring connection are provided at both ends of each of the gates G1 through G7. Each of these polysilicon films 30 is provided in a state of connection to the respective gates G1 through G7.

Next, an example of an inverter configured from this basic cell is described.

Figure 20:
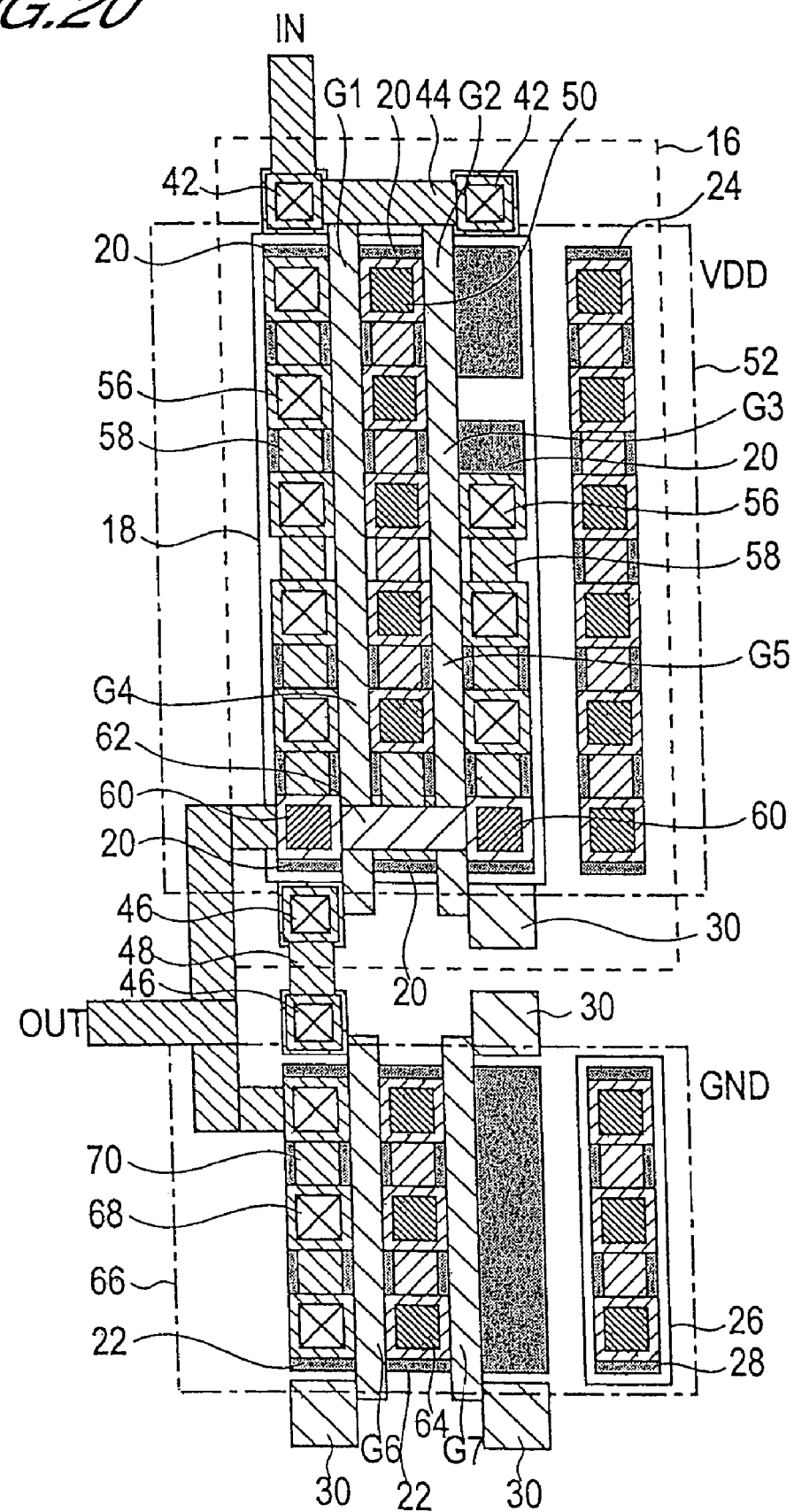
FIG. 20 is a mask pattern diagram showing an example of the configuration of an inverter using a basic cell of the fourth embodiment.

FIG. 20 is a mask pattern diagram showing an example of the configuration of an inverter using a basic cell of the fourth embodiment. The various shadings in FIG. 20 each have the same meaning as in FIG. 37.

In this inverter, the gate G1 of PMOS transistor Tr1 (gate G4 of PMOS transistor Tr4) and gate G2 of PMOS transistor Tr2 (gate G3 of PMOS transistor Tr3, gate G5 of PMOS transistor Tr5) are connected to the first metal layer 44 via contacts 42 provided on polysilicon films for wiring connection. These gates G1 through G5 are electrically connected by the first metal layer 44, and this first metal layer 44 is connected to the input terminal IN.

The gate G1 of PMOS transistor Tr1 (gate G4 of PMOS transistor Tr4) and gate G6 of NMOS transistor Tr6 are connected to the first metal layer 48 via contacts 46 provided on polysilicon films for wiring connection. These gates G1, G4 and G6 are electrically connected by the first metal layer 48.

The active region 20 between gate G1 of PMOS transistor Tr1, and gates G2 and G3 of PMOS transistors Tr2 and Tr3, and the active region 20 between gate G4 of PMOS transistor Tr4 and gate G5 of PMOS transistor Tr5, are connected to the third metal layer 52 via first and second through-holes 50. This third metal layer 52 is connected to the active region 24 for connection to the power supply (VDD).

The other active regions 20 of PMOS transistors Tr1, Tr3, Tr4 and Tr5 are connected to the first metal layers 58 via contacts 56. The first metal layers 58 on these active regions 20 are connected to the second metal layer 62 on gates G4 and G5 via the second through-holes 60. These first metal layers 58 on these active regions 20 are mutually connected by the second metal layer 62. The first metal layers 58 are connected to the output terminal OUT.

The active region 22 between gate G6 of NMOS transistor Tr6 and gate G7 of NMOS transistor Tr7 is connected to the third metal layer 66 via the first and second through-holes 64. This third metal layer 66 is connected to the active region 28 for connection to ground (GND).

The other active region 22 of the NMOS transistor Tr6 is connected to the first metal layer 70 via the contact 68. The first metal layer 70 is connected to the output terminal OUT.

Figure 21:
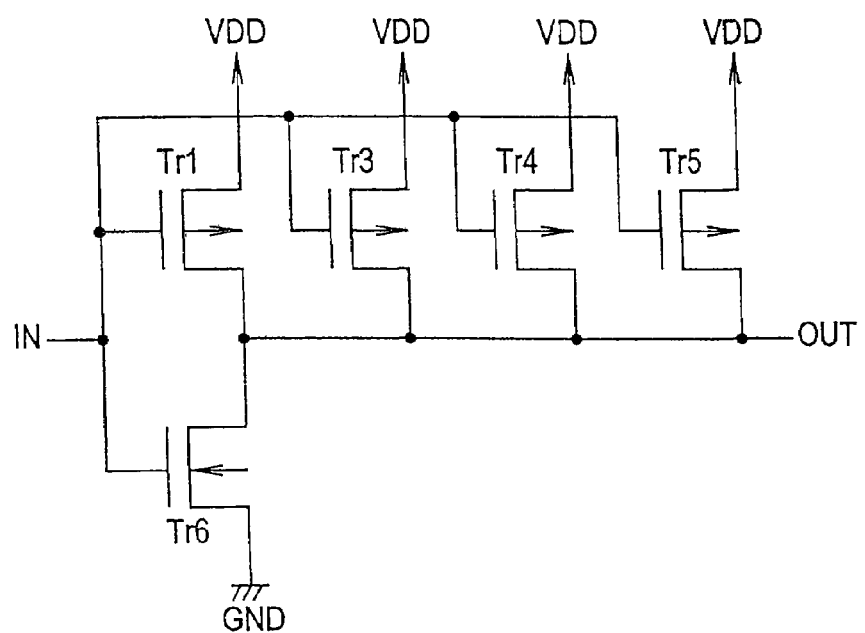
FIG. 21 is a circuit diagram showing the connections between component elements of the inverter shown in FIG. 20.

FIG. 21 is a circuit diagram showing the connections between component elements of the inverter shown in FIG. 20. As shown in FIG. 21, the channel of PMOS transistor Tr1 and the channel of NMOS transistor Tr6 are connected in series between the power supply VDD and ground GND, in this order from the power supply VDD. Further, the channel of PMOS transistor Tr3 and the channel of NMOS transistor Tr6 are connected in series between the power supply VDD and ground GND, in this order from the power supply VDD. Further, the channel of PMOS transistor Tr4 and the channel of NMOS transistor Tr6 are connected in series between the power supply VDD and ground GND, in this order from the power supply VDD. Further, the channel of PMOS transistor Tr5 and the channel of NMOS transistor Tr6 are connected in series between the power supply VDD and ground GND, in this order from the power supply VDD. The gates of each of the transistors Tr1, Tr3, Tr4, Tr5 and Tr6 are connected to the input terminal IN. The points of connection of the channels of each of the PMOS transistors Tr1, Tr3, Tr4 and Tr5 with the channel of NMOS transistor Tr5 are connected to the output terminal OUT.

As explained above, by means of this configuration of the basic cell, finer adjustment of the threshold voltage Vth and delay time Tpd becomes possible.

Figure 22:
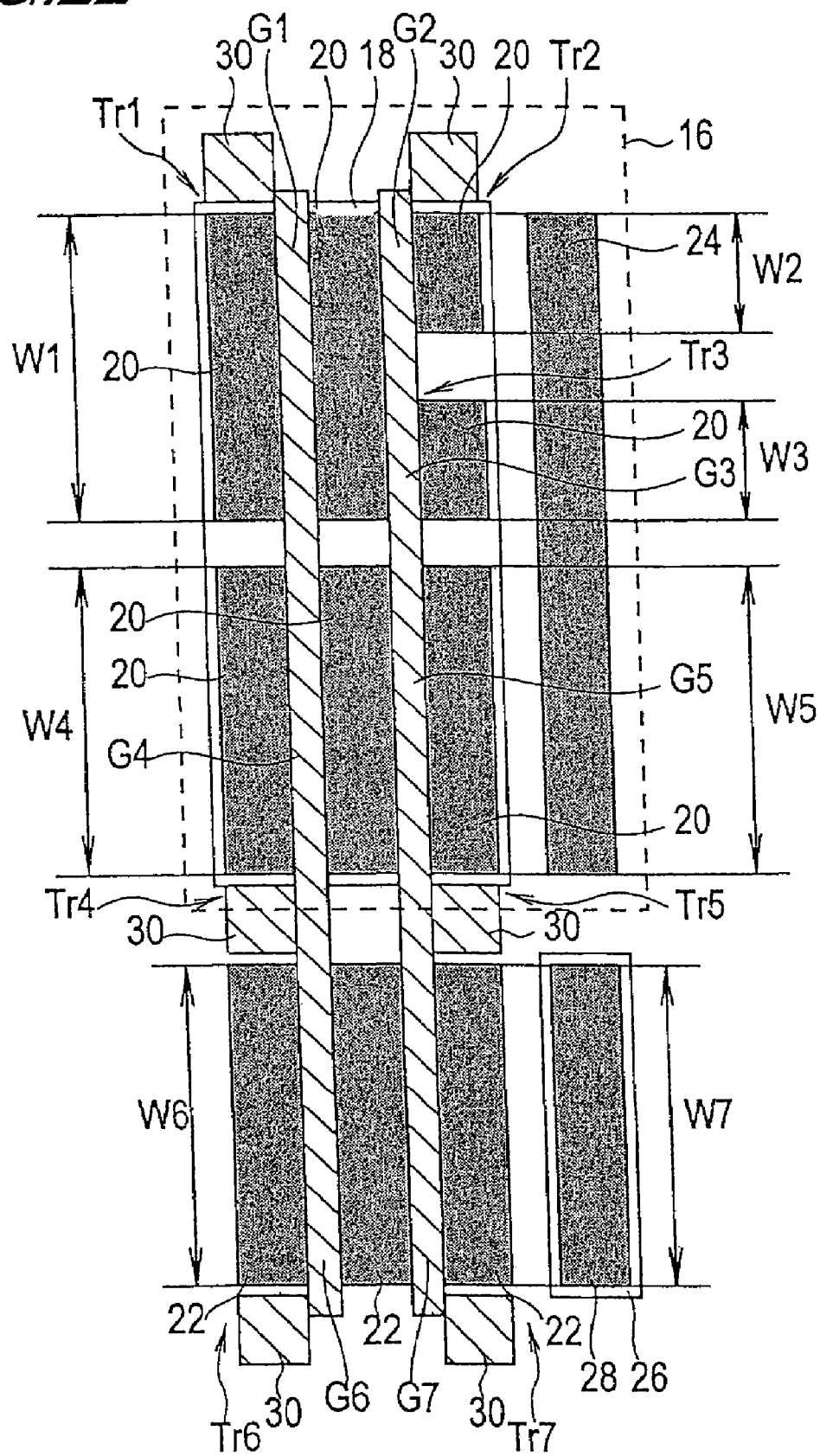
FIG. 22 is a mask pattern diagram showing a modified example of a basic cell of the fourth embodiment.

Next, a modified example of the basic cell of the fourth embodiment is shown in the mask pattern diagram of FIG. 22. The basic cell of FIG. 22 is the basic cell shown in FIG. 19, wherein the gate G4 of PMOS transistor Tr4 is connected in a line with gate G6 of NMOS transistor Tr6, and moreover gate G5 of PMOS transistor Tr5 is connected in a line with gate G7 of NMOS transistor Tr7. That is, gates G1, G4 and G6 are constituted by a single stripe-shaped polysilicon film, and gates G2, G3, G5 and G7 are constituted by a single stripe-shaped polysilicon film.

Similarly to the configuration shown in FIG. 19, polysilicon films 30 for wiring connection are provided at both ends of the polysilicon film constituting gates G1, G4 and G6, and at both ends of the polysilicon film constituting gates G2, G3, G5 and G7. In addition, polysilicon films 30 for wiring connection are provided at the center of the polysilicon film constituting gates G1, G4 and G6 (between transistors Tr4 and Tr6), and at the center of the polysilicon film constituting gates G2, G3, G5 and G7 (between transistors Tr5 and Tr7). Each of these polysilicon films 30 is provided in a state of connection with the respective gates G1 through G7.

Figure 23:
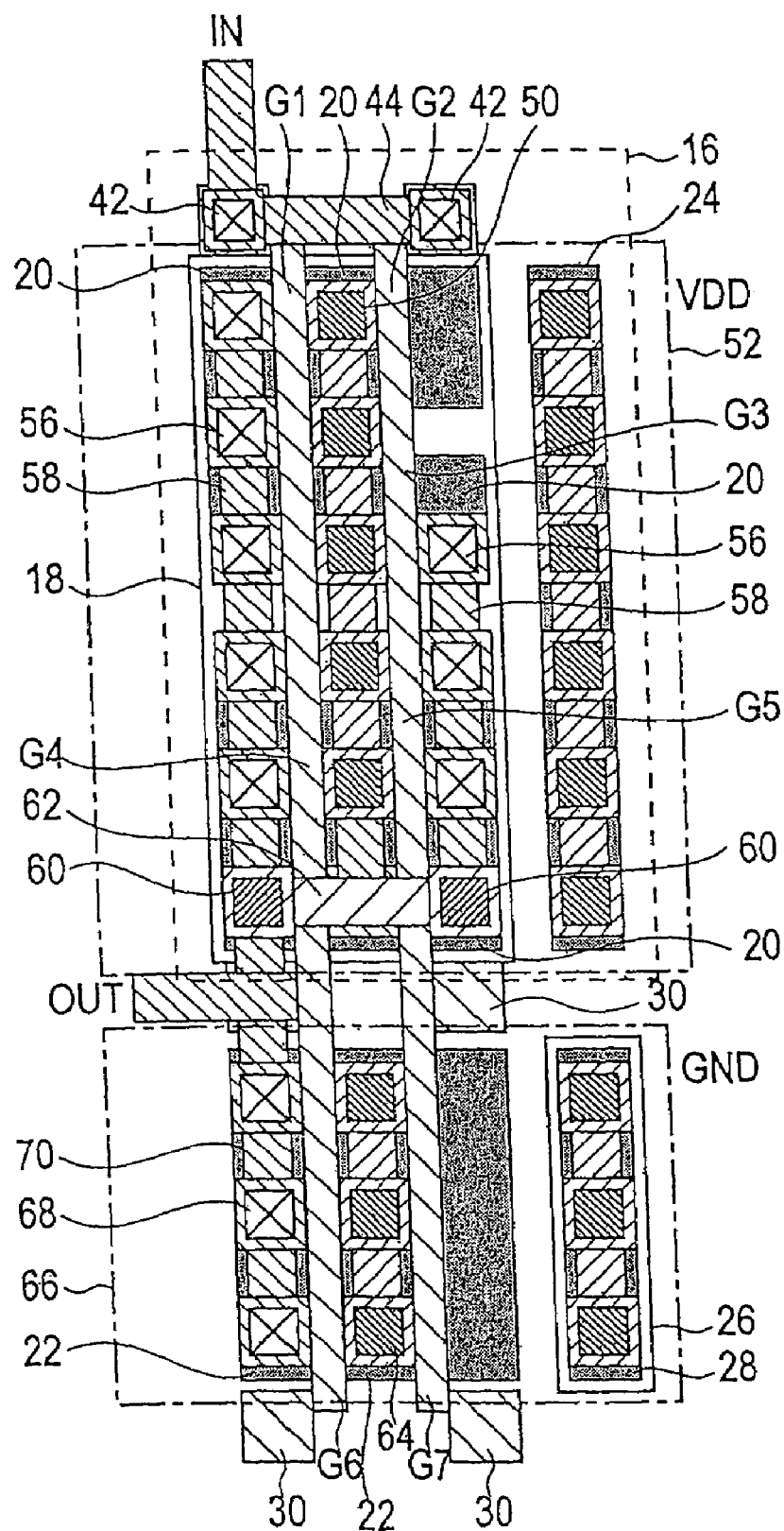
FIG. 23 is a mask pattern diagram showing an example of the configuration of an inverter using the modified example of the basic cell of the fourth embodiment.

FIG. 23 is a mask pattern diagram showing an example of the configuration of an inverter using the modified example of the basic cell of the fourth embodiment. The various shadings in FIG. 23 each have the same meaning as in FIG. 37.

The wiring of the inverter shown in FIG. 23 is similar to the wiring of the inverter shown in FIG. 20. The difference is that, in FIG. 23, there is no need for connection of the gate G4 of PMOS transistor Tr4 and gate G6 of NMOS transistor Tr6. This connection shown in FIG. 20 is replaced in FIG. 23 by a first metal layer 58 (70) which connects the active region 20 of PMOS transistor Tr4 and the active region 22 of NMOS transistor Tr6. The connections of the inverter of FIG. 23 are as shown in FIG. 21.

In this way, by means of the modified example of the basic cell of the fourth embodiment, there is no longer a need to connect the gates of the PMOS and NMOS transistors, and so labor is eliminated in the drawing of diagrams. There is the further advantage that the size of basic cells is reduced.

Fifth Embodiment

Figure 24:
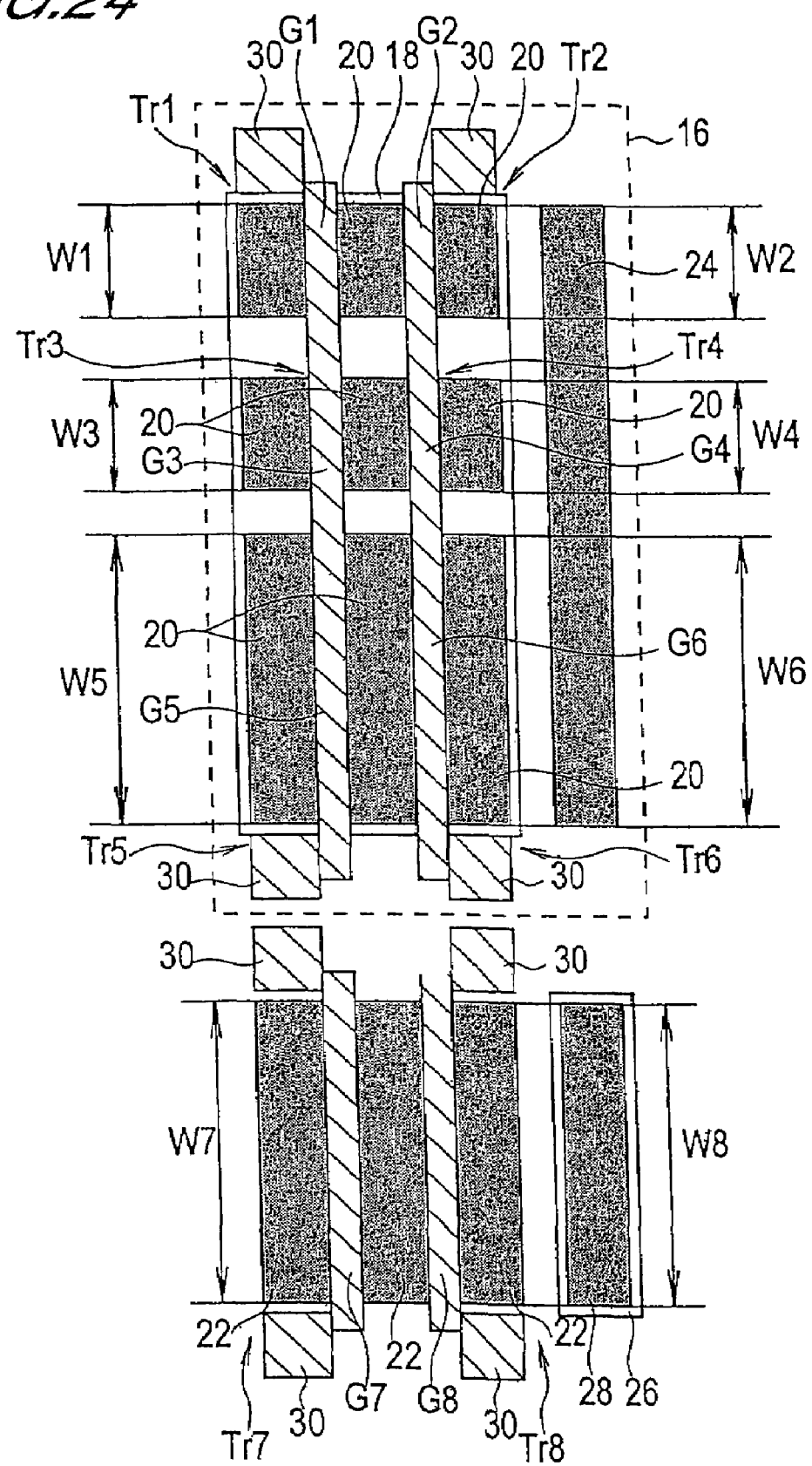
FIG. 24 is a mask pattern diagram showing a basic cell comprised by the semiconductor integrated circuit of a fifth embodiment.

FIG. 24 is a mask pattern diagram showing a basic cell constituted by the semiconductor integrated circuit of a fifth embodiment. The basic cell shown in FIG. 24 comprises a first PMOS transistor Tr1, a second PMOS transistor Tr2, a third PMOS transistor Tr3, a fourth PMOS transistor Tr4, a fifth PMOS transistor Tr5, a sixth PMOS transistor Tr6, a first NMOS transistor Tr7, and a second NMOS transistor Tr8.

Each of the transistors Tr1 through Tr8 is formed on P-type Si substrate, not shown. PMOS transistors Tr1 through Tr6 are formed within an N-well 16 formed in the substrate. Within this N-well 16, a P-type semiconductor region 18 is formed. Within this P-type semiconductor region 18, the active regions 20 of the PMOS transistors Tr1 through Tr6 are formed. Also, two parallel stripe-shape polysilicon films are formed on these active regions 20 as the gates G1, G2, G3, G4, G5 and G6 of the PMOS transistors Tr1 through Tr6. One of the polysilicon films is used as the gates G1, G3 and G5 of PMOS transistors Tr1, Tr3 and Tr5, and the other polysilicon film is used as the gates G2, G4 and G6 of PMOS transistors Tr2, Tr4 and Tr6.

In this way, in this example, PMOS transistor Tr2 and PMOS transistor Tr1 are juxtaposed, and PMOS transistor Tr6 and PMOS transistor Tr5 are juxtaposed. The gate G1 of PMOS transistor Tr1, the gate G3 of PMOS transistor Tr3, and the gate G5 of transistor Tr5 are connected in a line; and the gate G2 of PMOS transistor Tr2, the gate G4 of PMOS transistor Tr4, and the gate G6 of PMOS transistor Tr6 are connected in a line.

On the other hand, the active regions 22 of NMOS transistors Tr7 and Tr8 are formed in a region adjacent to the N-well 16. On these active regions 22 are provided two parallel stripe-shaped polysilicon films, as the gates G7 and G8 of the NMOS transistors Tr7 and Tr8. As shown in FIG. 24, the NMOS transistor Tr8 and NMOS transistor Tr7 are juxtaposed.

The gates of these transistors Tr1 through Tr8 are mutually parallel. The gate G5 of PMOS transistor Tr5 is provided in a line with the gate G7 of NMOS transistor Tr7, that is, arranged on a straight line. Similarly, the gate G6 of PMOS transistor Tr6 is provided in a line with the gate G8 of NMOS transistor Tr8.

In this embodiment, the gate width W1 of the gate G1 of the PMOS transistor Tr1, the gate width W2 of the gate G2 of the PMOS transistor Tr2, the gate width W3 of the gate G3 of the PMOS transistor Tr3, the gate width W4 of the gate G4 of the PMOS transistor Tr4, the gate width W5 of the gate G5 of the PMOS transistor Tr5, the gate width W6 of the gate G6 of the PMOS transistor Tr6, the gate width W7 of the gate G7 of the NMOS transistor Tr7, and the gate width W8 of the gate G8 of the NMOS transistor Tr8 are selected such that $$W1:W2:W3:W4:W5:W6:W7:W8 = 1/3:1/3:1/3:1/3:1:1:1:1$$

Further, an active region 24 for connection of the power supply (VDD) is formed within the N-well 16 and adjacent to PMOS transistors Tr2, Tr4 and Tr6. A P-type semiconductor region 26 is formed outside the N-well 16 and adjacent to NMOS transistor Tr8. In this P-type semiconductor region 26 is formed an active region 28 for connection to ground (GND).

Polysilicon films 30 for wiring connection are provided at both ends of each of the gates G1 through G8. Each of these polysilicon films 30 is provided in a state of connection to the respective gates G1 through G8.

Next, an example of an inverter configured from this basic cell is described.

Figure 25:
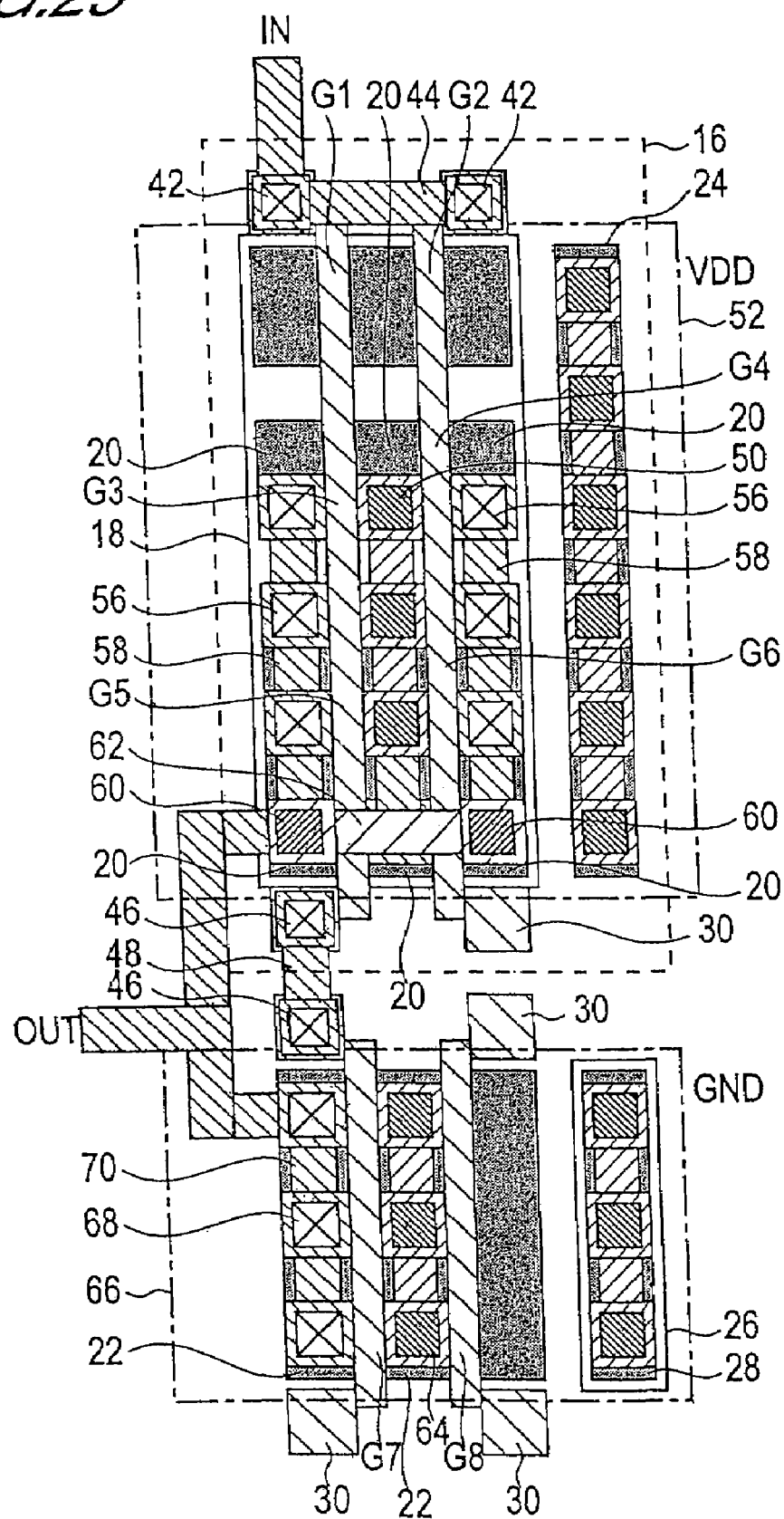
FIG. 25 is a mask pattern diagram showing an example of the configuration of an inverter using a basic cell of the fifth embodiment.

FIG. 25 is a mask pattern diagram showing an example of the configuration of an inverter using a basic cell of the fifth embodiment. The various shadings in FIG. 25 each have the same meaning as in FIG. 37.

In this inverter, the gate G1 of PMOS transistor Tr1 (gate G3 of PMOS transistor Tr3, gate G5 of PMOS transistor Tr5) and gate G2 of PMOS transistor Tr2 (gate G4 of PMOS transistor Tr4, gate G6 of PMOS transistor Tr6) are electrically connected to the first metal layer 44 via contacts 42 provided on polysilicon films for wiring connection. These gates GC through G6 are electrically connected by the first metal layer 44, and this first metal layer 44 is connected to the input terminal IN.

The gate G1 of PMOS transistor Tr1 (gate G3 of PMOS transistor Tr3, gate G5 of PMOS transistor Tr5) and gate G7 of NMOS transistor Tr7 are connected to the first metal layer 48 via contacts 46 provided on polysilicon films for wiring connection. These gates G1, G3, G5 and G7 are electrically connected by the first metal layer 48.

The active region 20 between gate G3 of PMOS transistor Tr3 and gate G4 of PMOS transistor Tr4, and the active region 20 between gate G5 of PMOS transistor Tr5 and gate G6 of PMOS transistor Tr6, are connected to the third metal layer 52 via first and second through-holes 50. This third metal layer 52 is connected to the active region 24 for connection to the power supply (VDD).

The other active regions 20 of PMOS transistors Tr3, Tr4, Tr5 and Tr6 are connected to the first metal layers 58 via contacts 56. The first metal layers 58 on these active regions 20 are connected to the second metal layer 62 on gates G5 and G6 via the second through-holes 60. These first metal layers 58 on these active regions 20 are mutually connected by the second metal layer 62. The first metal layers 58 are connected to the output terminal OUT.

The active region 22 between gate G7 of NMOS transistor Tr7 and gate G8 of NMOS transistor Tr8 is connected to the third metal layer 66 via the first and second through-holes 64. This third metal layer 66 is connected to the active region 28 for connection to ground (GND).

The other active region 22 of the NMOS transistor Tr7 is connected to the first metal layer 70 via the contact 68. The first metal layer 70 is connected to the output terminal OUT.

Figure 26:
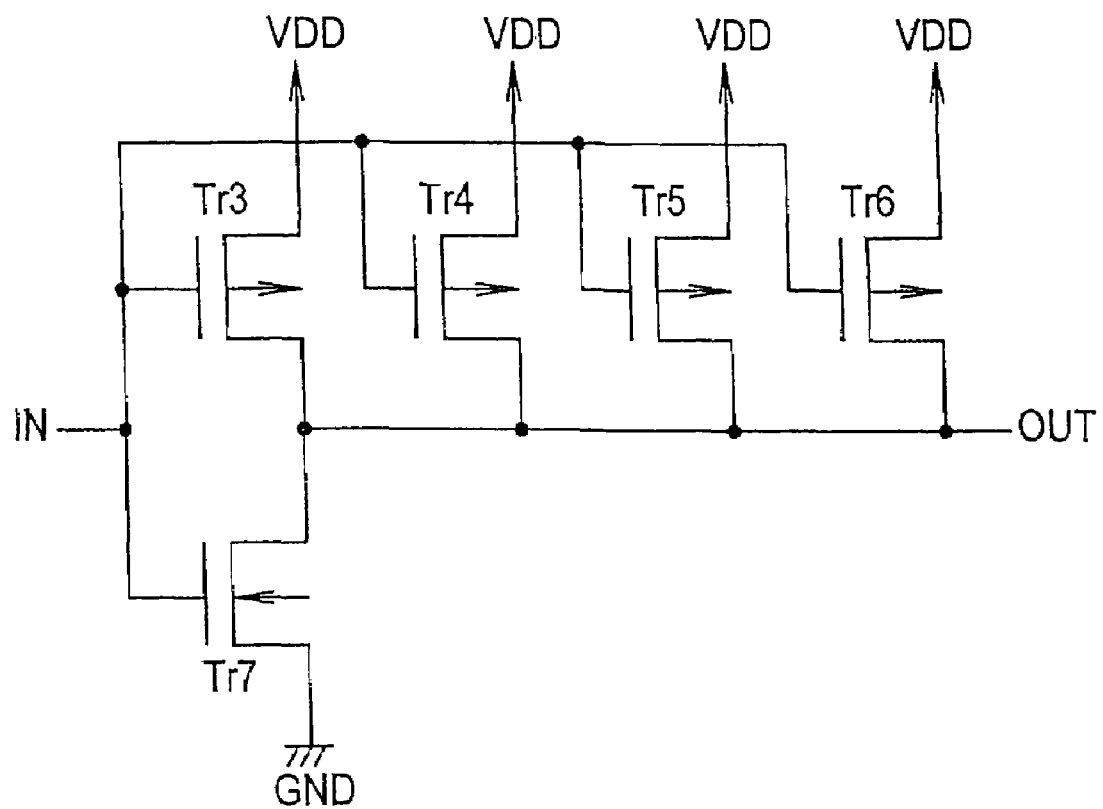
FIG. 26 is a circuit diagram showing the connections between component elements of the inverter shown in FIG. 25.

FIG. 26 is a circuit diagram showing the connections between component elements of the inverter shown in FIG. 25. As shown in FIG. 26, the channel of PMOS transistor Tr3 and the channel of NMOS transistor Tr7 are connected in series between the power supply VDD and ground GND, in this order from the power supply VDD. Further, the channel of PMOS transistor Tr4 and the channel of NMOS transistor Tr7 are connected in series between the power supply VDD and ground GND, in this order from the power supply VDD. Further, the channel of PMOS transistor Tr5 and the channel of NMOS transistor Tr7 are connected in series between the power supply VDD and ground GND, in this order from the power supply VDD. Further, the channel of PMOS transistor Tr6 and the channel of NMOS transistor Tr7 are connected in series between the power supply VDD and ground GND, in this order from the power supply VDD. The gates of each of the transistors Tr3, Tr4, Tr5, Tr6 and Tr7 are connected to the input terminal IN. The points of connection of the channels of each of the PMOS transistors Tr3, Tr4, Tr5 and Tr6 with the channel of NMOS transistor Tr7 are connected to the output terminal OUT.

As explained above, by means of this configuration of the basic cell, finer adjustment of the threshold voltage Vth and delay time Tpd becomes possible.

Figure 27:
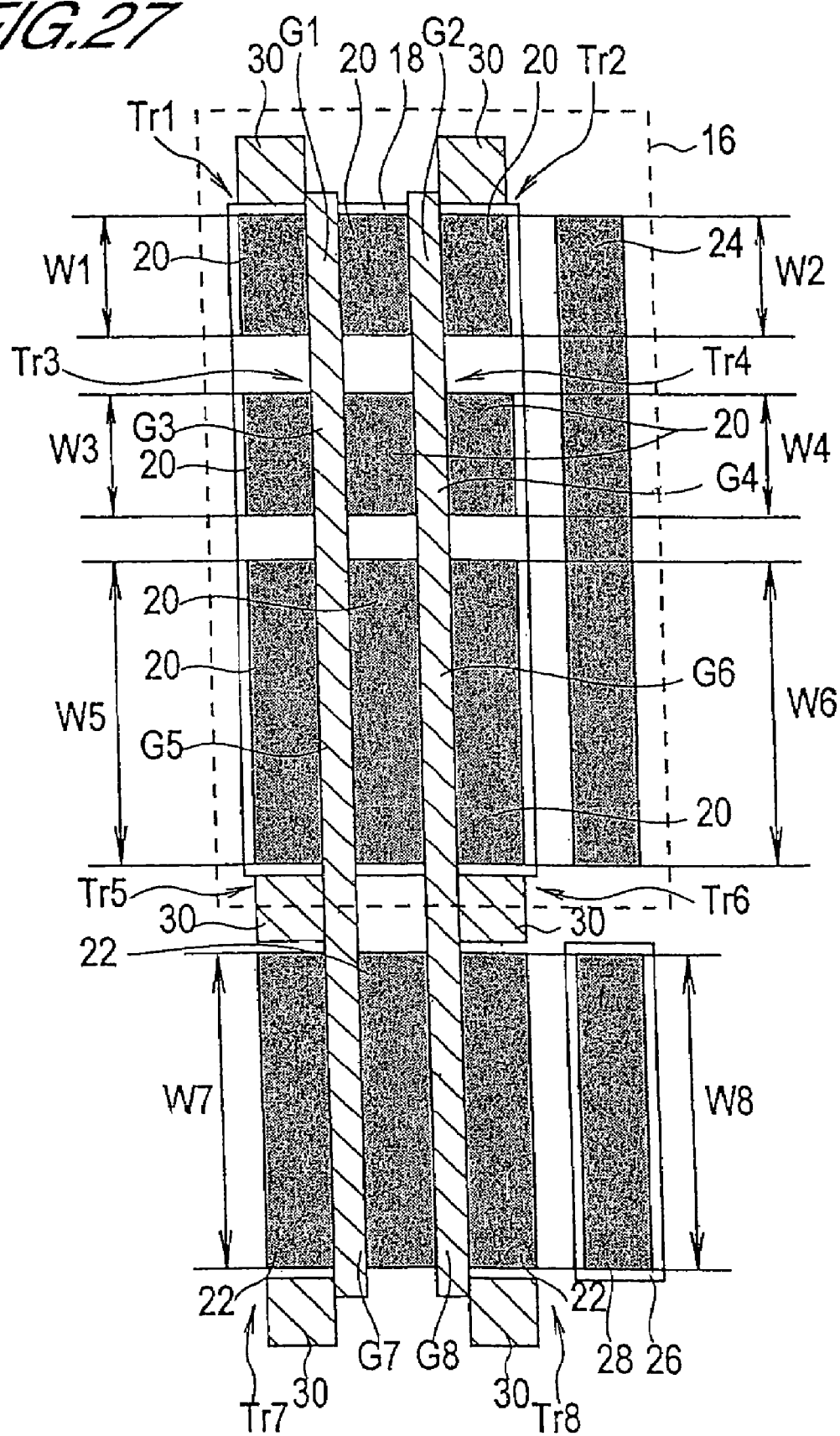
FIG. 27 is a mask pattern diagram showing a modified example of a basic cell of the fifth embodiment.

Next, a modified example of the basic cell of the fifth embodiment is shown in the mask pattern diagram of FIG. 27. The basic cell of FIG. 27 is the basic cell shown in FIG. 24, wherein the gate G5 of PMOS transistor Tr5 is connected in a line with gate G7 of NMOS transistor Tr7, and moreover gate G6 of PMOS transistor Tr6 is connected in a line with gate G8 of NMOS transistor Tr8. That is, gates G1, G3, G5 and G7 comprise a single stripe-shaped polysilicon film, and gates G2, G4, G6 and G8 comprise a single stripe-shaped polysilicon film.

Similarly to the configuration shown in FIG. 24, polysilicon films 30 for wiring connection are provided at both ends of the polysilicon film constituting gates G1, G3, G5 and G7, and at both ends of the polysilicon film constituting gates G2, G4, G6 and G8. In addition, polysilicon films 30 for wiring connection are provided at the center of the polysilicon film constituting gates G1, G3, G5 and G7 (between transistors Tr5 and Tr7), and at the center of the polysilicon film constituting gates G2, G4, G6 and G8 (between transistors Tr6 and Tr8). Each of these polysilicon films 30 is provided in a state of connection with the respective gates G1 through G8.

Figure 28:
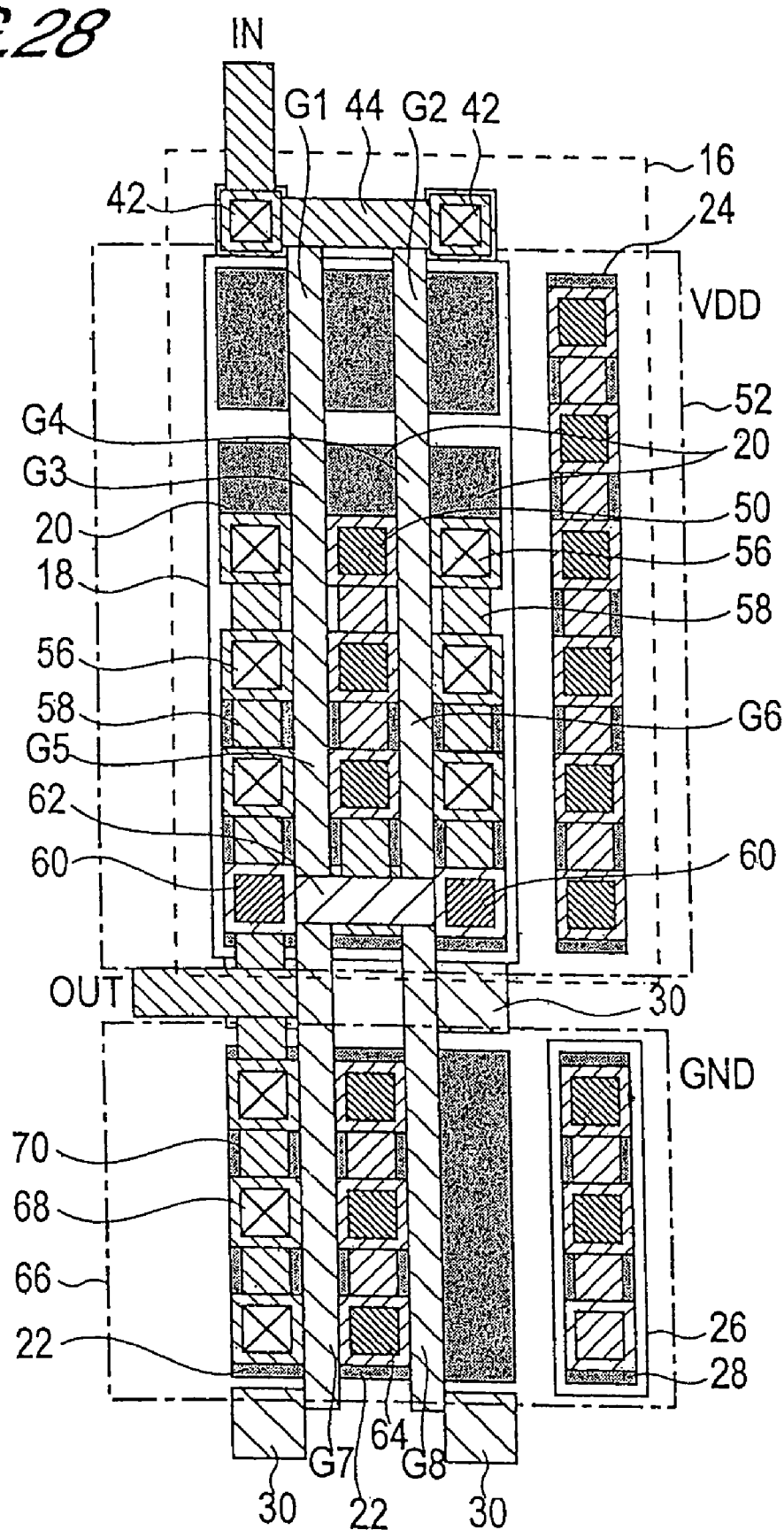
FIG. 28 is a mask pattern diagram showing an example of the configuration of an inverter using the modified example of the basic cell of the fifth embodiment.

FIG. 28 is a mask pattern diagram showing an example of the configuration of an inverter using the modified example of the basic cell of the fifth embodiment. The various shadings in FIG. 28 each have the same meaning as in FIG. 37.

The wiring of the inverter shown in FIG. 28 is generally similar to the wiring of the inverter shown in FIG. 25. The difference is that, in FIG. 28, there is no need for connection of the gate G5 of PMOS transistor Tr5 and gate G7 of NMOS transistor Tr7. This connection shown in FIG. 25 is replaced in FIG. 28 by a first metal layer 58 (70) which connects the active region 20 of PMOS transistor Tr5 and the active region 22 of NMOS transistor Tr7. The connections of the inverter of FIG. 28 are as shown in FIG. 26.

In this way, by means of the modified example of the basic cell of the fifth embodiment, there is no longer a need to connect the gates of the PMOS and NMOS transistors, and so labor is eliminated in the drawing of diagrams. There is the further advantage that the size of basic cells is reduced.

Sixth Embodiment

Figure 29:
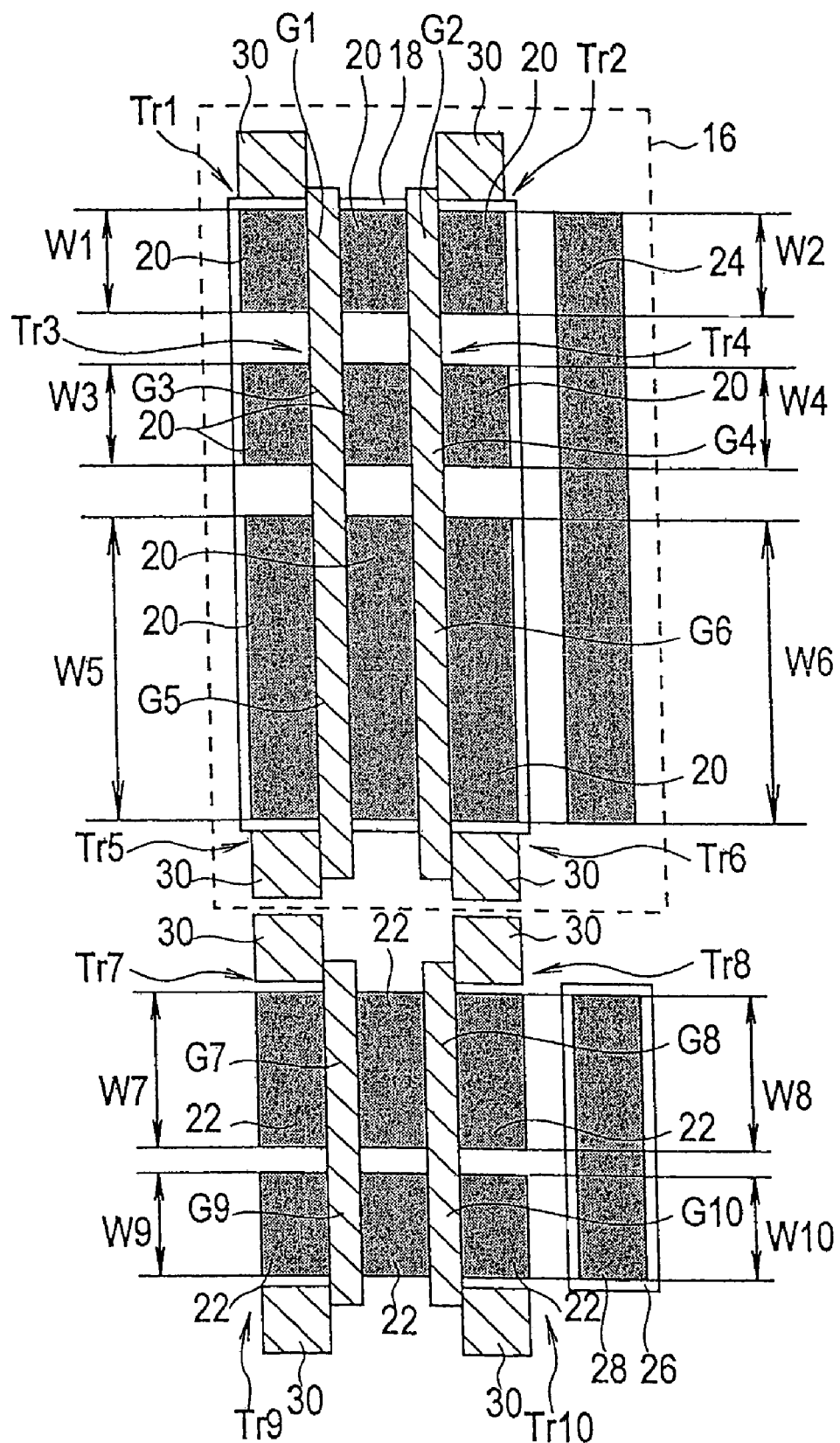
FIG. 29 is a mask pattern diagram showing a basic cell comprised by the semiconductor integrated circuit of a sixth embodiment.

FIG. 29 is a mask pattern diagram showing a basic cell comprised by the semiconductor integrated circuit of a sixth embodiment. The basic cell shown in FIG. 29 comprises a first PMOS transistor Tr1, a second PMOS transistor Tr2, a third PMOS transistor Tr3, a fourth PMOS transistor Tr4, a fifth PMOS transistor Tr5, a sixth PMOS transistor Tr6, a first NMOS transistor Tr7, a second NMOS transistor Tr8, a third NMOS transistor Tr9, and a fourth NMOS transistor Tr10.

Each of the transistors Tr1 through Tr10 is formed on P-type Si substrate, not shown. PMOS transistors Tr1 through Tr6 are formed within an N-well 16 formed in the substrate. Within this N-well 16, a P-type semiconductor region 18 is formed. Within this P-type semiconductor region 18, the active regions 20 of the PMOS transistors Tr1 through Tr6 are formed. Also, two parallel stripe-shape polysilicon films are formed on these active regions 20 as the gates G1, G2, G3, G4, G5 and G6 of the PMOS transistors Tr1 through Tr6. One of the polysilicon films is used as the gates G1, G3 and G5 of PMOS transistors Tr1, Tr3 and Tr5, and the other polysilicon film is used as the gates G2, G4 and G6 of PMOS transistors Tr2, Tr4 and Tr6.

In this way, in this example, PMOS transistor Tr2 and PMOS transistor Tr1 are juxtaposed, and PMOS transistor Tr6 and PMOS transistor Tr5 are juxtaposed. The gate G1 of PMOS transistor Tr1, the gate G3 of PMOS transistor Tr3, and the gate G5 of transistor Tr5 are connected in a line; and the gate G2 of PMOS transistor Tr2, the gate G4 of PMOS transistor Tr4, and the gate G6 of PMOS transistor Tr6 are connected in a line.

On the other hand, the active regions 22 of NMOS transistors Tr7, Tr8, Tr9 and Tr10 are formed in a region adjacent to the N-well 16. On these active regions 22 are provided two parallel stripe-shaped polysilicon films, as the gates G7, G8, G9 and G10 of the NMOS transistors Tr7 through Tr10.

As shown in FIG. 29, the NMOS transistor Tr8 and NMOS transistor Tr7 are juxtaposed and the NMOS transistor Tr10 and NMOS transistor Tr9 are juxtaposed. The gate G7 of NMOS transistor Tr7 and gate G9 of NMOS transistor Tr9 are connected in a line, and the gate G8 of NMOS transistor Tr8 and gate G10 of NMOS transistor Tr10 are connected in a line.

The gates of each of these transistors Tr1 through Tr10 are mutually parallel. The gate G5 of PMOS transistor Tr5 is provided in a line with the gate G7 of NMOS transistor Tr7, that is, arranged on a straight line. Similarly, the gate G6 of PMOS transistor Tr6 is provided in a line with the gate G8 of NMOS transistor Tr8.

In this embodiment, the gate width W1 of the gate G1 of the PMOS transistor Tr1, the gate width W2 of the gate G2 of the PMOS transistor Tr2, the gate width W3 of the gate G3 of the PMOS transistor Tr3, the gate width W4 of the gate G4 of the PMOS transistor Tr4, the gate width W5 of the gate G5 of the PMCS transistor Tr5, the gate width W6 of the gate G6 of the PMOS transistor Tr6, the gate width W7 of the gate G7 of the NMOS transistor Tr7, the gate width W8 of the gate G8 of the NMOS transistor Tr8, the gate width W9 of the gate G9 of the NMOS transistor Tr9, and the gate width W10 of the gate G10 of the NMOS transistor T10, are selected such that W1:W2:W3:W4:W5:W6:W7:W8:W9:W10=$\frac{1}{3}$:$\frac{1}{3}$:$\frac{1}{3}$:$\frac{1}{3}$:1:1:1/2:1/2:$\frac{1}{3}$:1/3.

Further, an active region 24 for connection of the power supply (VDD) is formed within the N-well 16 and adjacent to PMOS transistors Tr2, Tr4 and Tr6. A P-type semiconductor region 26 is formed outside the N-well 16 and adjacent to NMOS transistors Tr8 and Tr10. In this P-type semiconductor region 26 is formed an active region 28 for connection to ground (GND).

Polysilicon films 30 for wiring connection are provided at both ends of each of the gates G1 through G10. Each of these polysilicon films 30 is provided in a state of connection to the respective gates G1 through G10.

Next, an example of an inverter configured from this basic cell is described.

Figure 30:
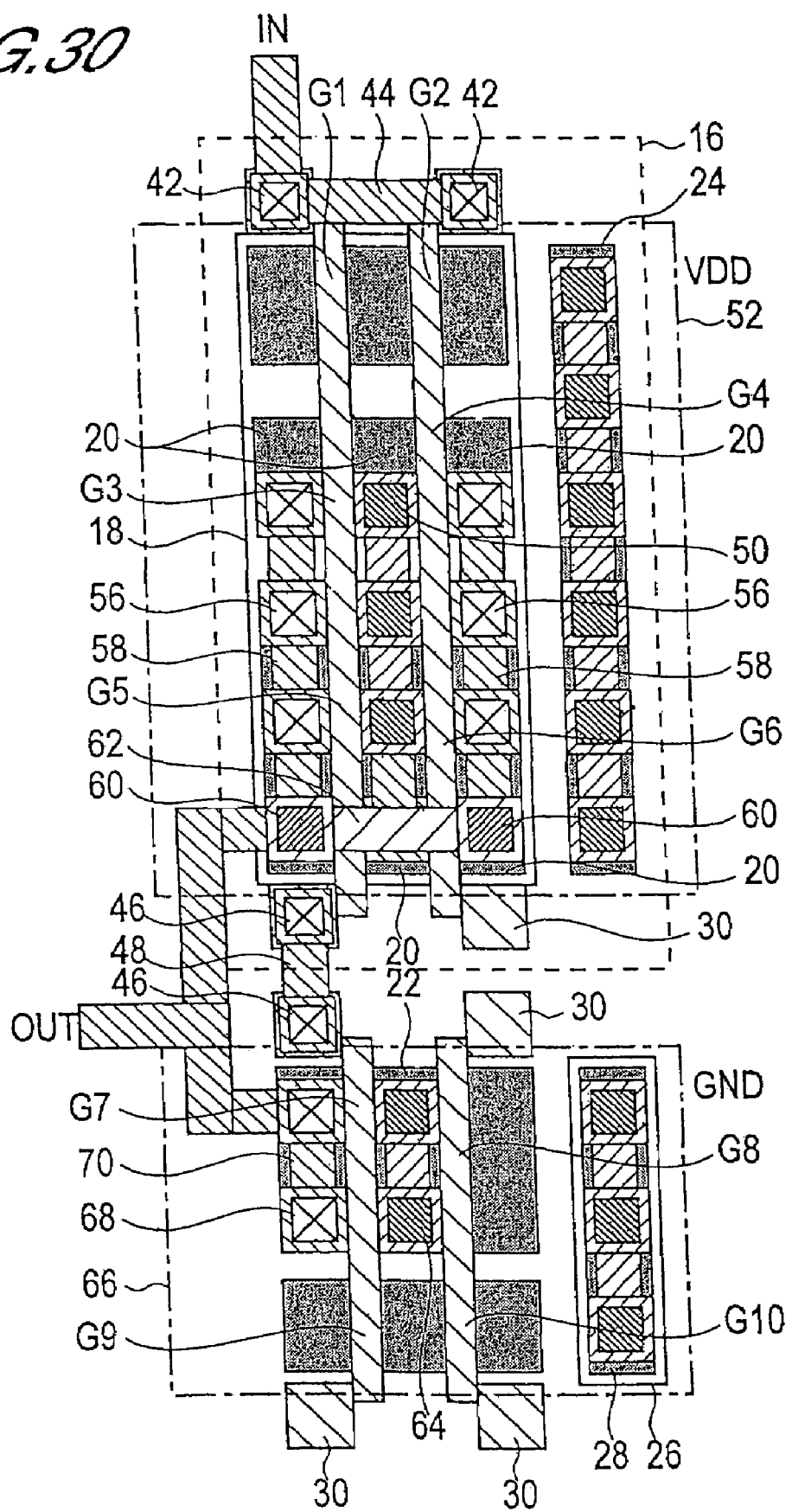
FIG. 30 is a mask pattern diagram showing an example of the configuration of an inverter using a basic cell of the sixth embodiment.

FIG. 30 is a mask pattern diagram showing an example of the configuration of an inverter using a basic cell of the sixth embodiment. The various shadings in FIG. 30 each have the same meaning as in FIG. 37.

In this inverter, the gate G1 of PMOS transistor Tr1 (gate G3 of PMOS transistor Tr3, gate G5 of PMOS transistor Tr5) and gate G2 of PMOS transistor Tr2 (gate G4 of PMOS transistor Tr4, gate G6 of PMOS transistor Tr6) are connected to the first metal layer 44 via contacts 42 provided on polysilicon films for wiring connection. These gates G1 through G6 are electrically connected by the first metal layer 44, and this first metal layer 44 is connected to the input terminal IN.

The gate G1 of PMOS transistor Tr1 (gate G3 of PMOS transistor Tr3, gate G5 of PMOS transistor Tr5) and gate G7 of NMOS transistor Tr7 (gate G9 of NMOS transistor Tr9) are connected to the first metal layer 48 via contacts 46 provided on polysilicon films for wiring connection. These gates G1, G3, G5, G7 and G9 are electrically connected by the first metal layer 48.

The active region 20 between gate G3 of PMOS transistor Tr3 and gate G4 of PMOS transistor Tr4, and the active region 20 between gate G5 of PMOS transistor Tr5 and gate G6 of PMOS transistor Tr6, are connected to the third metal layer 52 via first and second through-holes 50. This third metal layer 52 is connected to the active region 24 for connection to the power supply (VDD).

The other active regions 20 of PMOS transistors Tr3, Tr4, Tr5 and Tr6 are connected to the first metal layers 58 via contacts 56. The first metal layers 58 on these active regions 20 are connected to the second metal layer 62 on gates G5 and G6 via the second through-holes 60. These first metal layers 58 on these active regions 20 are mutually connected by the second metal layer 62. The first metal layers 58 are connected to the output terminal OUT.

The active region 22 between gate G7 of NMOS transistor Tr7 and gate G8 of NMOS transistor Tr8 is connected to the third metal layer 66 via the first and second through-holes 64. This third metal layer 66 is connected to the active region 28 for connection to ground (GND).

The other active region 22 of the NMOS transistor Tr7 is connected to the first metal layer 70 via the contact 68. The first metal layer 70 is connected to the output terminal OUT.

Figure 31:
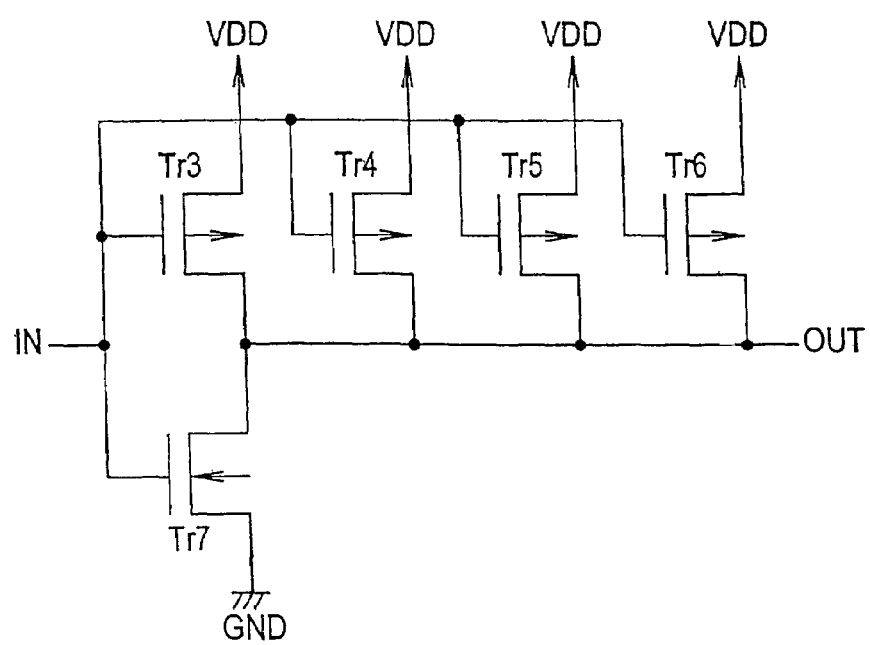
FIG. 31 is a circuit diagram showing the connections between component elements of the inverter shown in FIG. 30.

FIG. 31 is a circuit diagram showing the connections between component elements of the inverter shown in FIG. 30. As shown in FIG. 26, the channel of PMOS transistor Tr3 and the channel of NMOS transistor Tr7 are connected in series between the power supply VDD and ground GND, in this order from the power supply VDD. Further, the channel of PMOS transistor Tr4 and the channel of NMOS transistor Tr7 are connected in series between the power supply VDD and ground GND, in this order from the power supply VDD. Further, the channel of PMOS transistor Tr5 and the channel of NMOS transistor Tr7 are connected in series between the power supply VDD and ground GND, in this order from the power supply VDD. Further, the channel of PMOS transistor Tr6 and the channel of NMOS transistor Tr7 are connected in series between the power supply VDD and ground GND, in this order from the power supply VDD. The gates of each of the transistors Tr3, Tr4, Tr5, Tr6 and Tr7 are connected to the input terminal IN. The points of connection of the channels of each of the PMOS transistors Tr3, Tr4, Tr5 and Tr6 with the channel of NMOS transistor Tr7 are connected to the output terminal OUT.

As explained above, by means of this configuration of the basic cell, finer adjustment of the threshold voltage Vth and delay time Tpd becomes possible.

Figure 32:
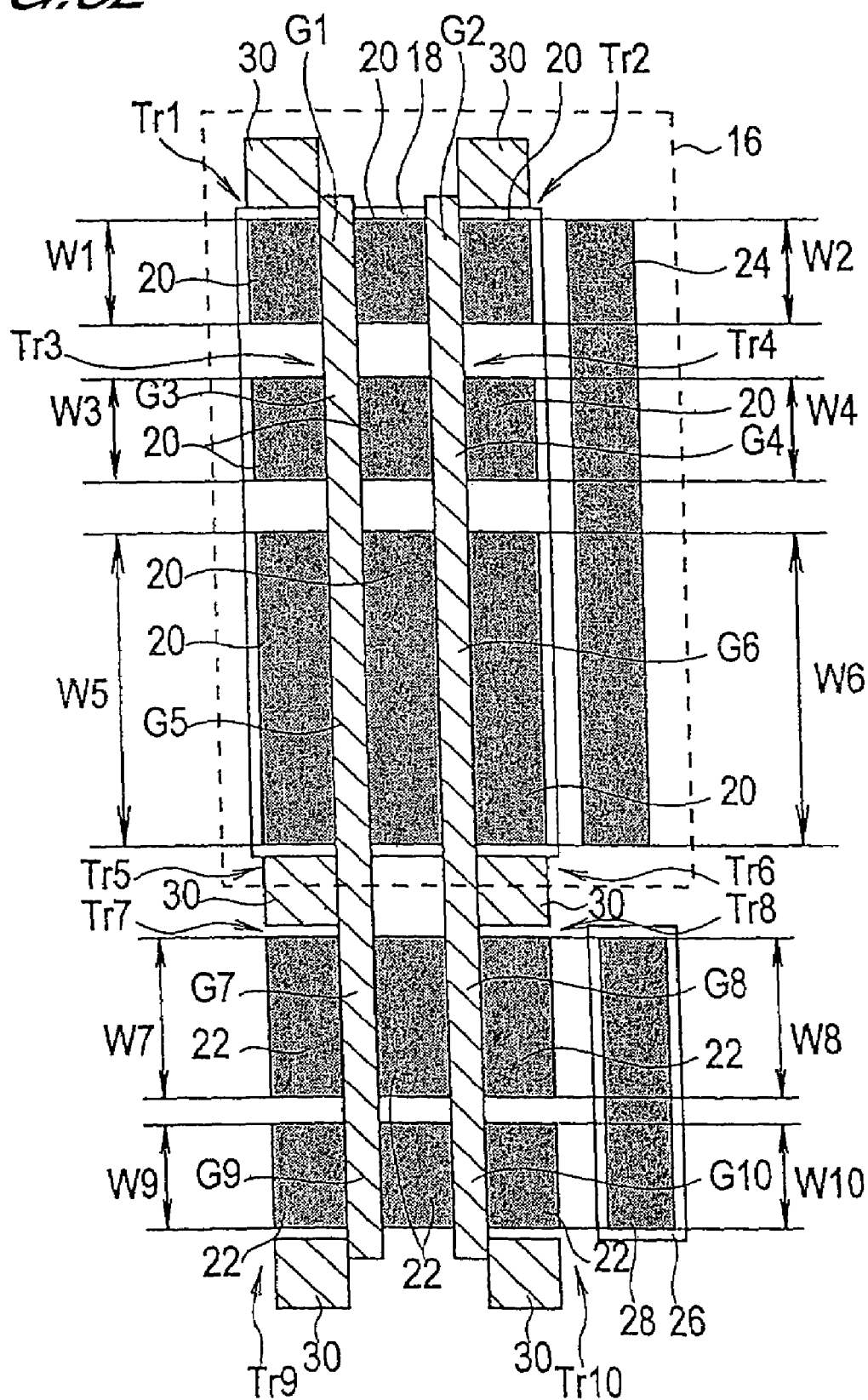
FIG. 32 is a mask pattern diagram showing a modified example of a basic cell of the sixth embodiment.

Next, a modified example of the basic cell of the sixth embodiment is shown in the mask pattern diagram of FIG. 32. The basic cell of FIG. 32 is the basic cell shown in FIG. 29, wherein the gate G5 of PMOS transistor Tr5 is connected in a line with gate G7 of NMOS transistor Tr7, and moreover gate G6 of PMOS transistor Tr6 is connected in a line with gate G8 of NMOS transistor Tr8. That is, gates G1, G3, G5, G7 and G9 comprise a single stripe-shaped polysilicon film, and gates G2, G4, G6, G8 and G10 comprise a single stripe-shaped polysilicon film.

Similarly to the configuration shown in FIG. 29, polysilicon films 30 for wiring connection are provided at both ends of the polysilicon film constituting gates G1, G3, G5, G7 and G9, and at both ends of the polysilicon film constituting gates G2, G4, G6, G8 and G10. In addition, polysilicon films 30 for wiring connection are provided at the center of the polysilicon film constituting gates G1, G3, G5, G7 and G9 (between transistors Tr5 and Tr7), and at the center of the polysilicon film constituting gates G2, G4, G6, G8 and G10 (between transistors Tr6 and Tr8). Each of these polysilicon films 30 is provided in a state of connection with the respective gates G1 through G10.

Figure 33:
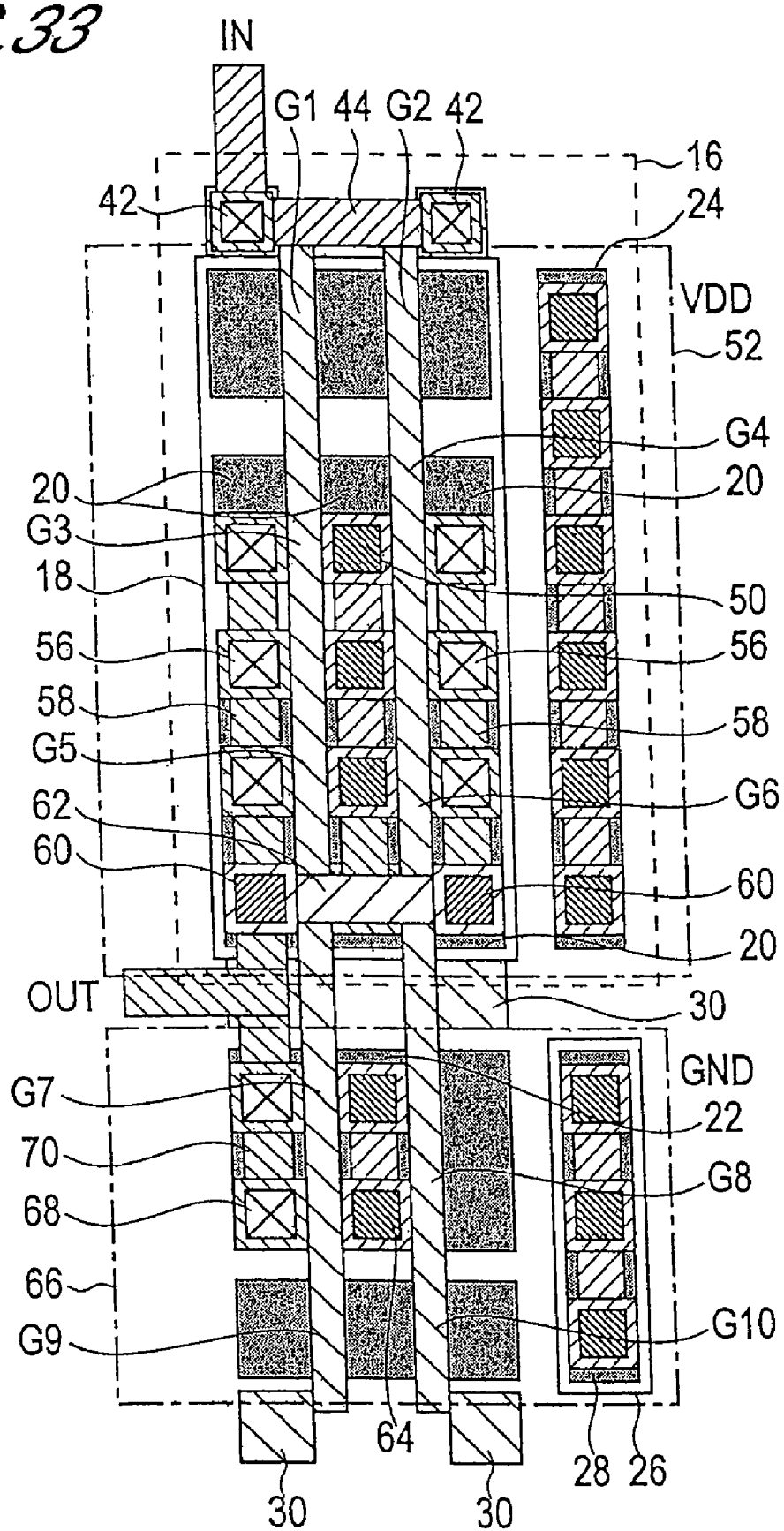
FIG. 33 is a mask pattern diagram showing an example of the configuration of an inverter using the modified example of the basic cell of the sixth embodiment.
Figure 34:
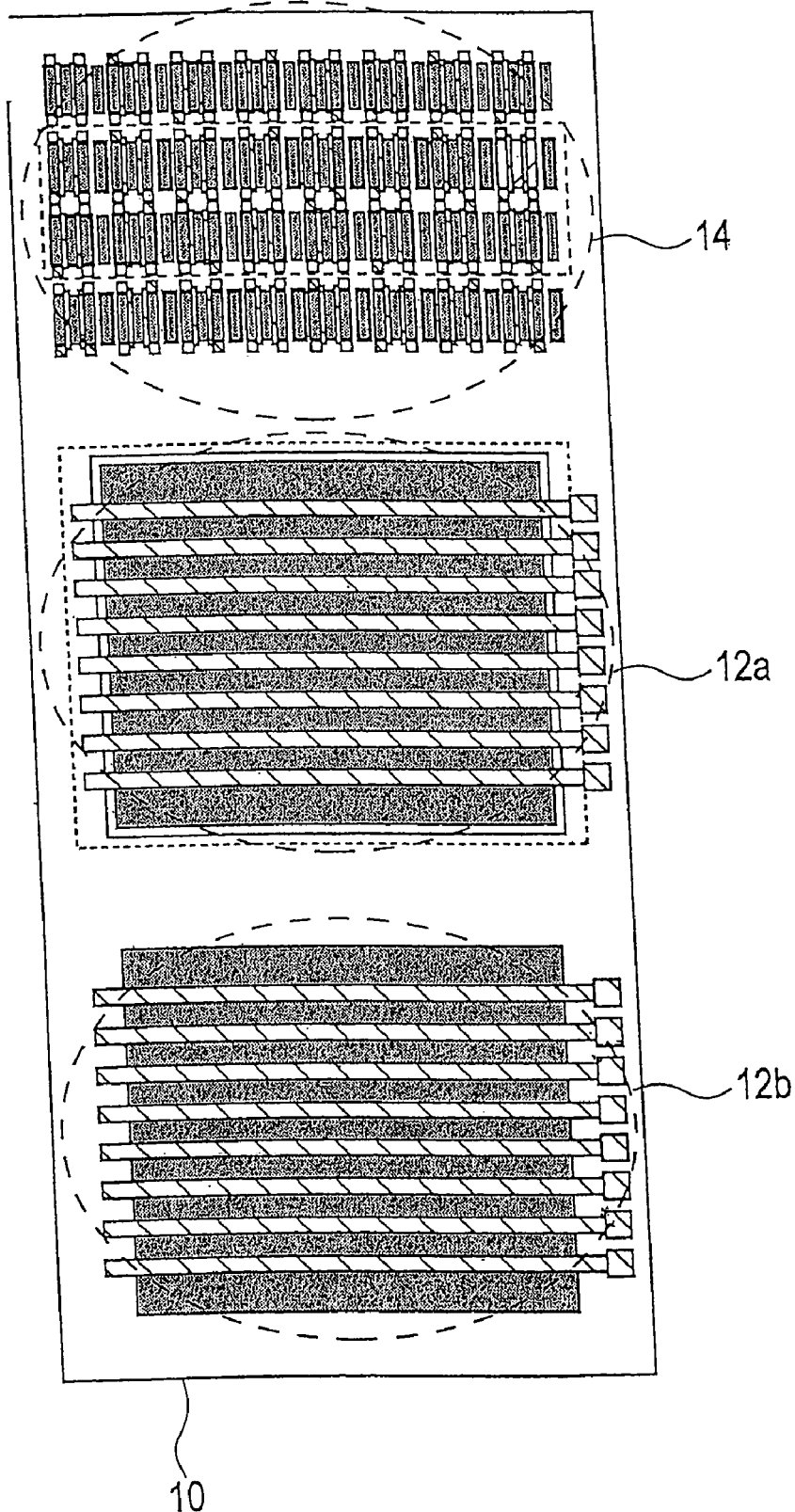
FIG. 34 is a drawing showing a bulk chip in which the input/output circuit of a semiconductor integrated circuit is formed.
Figure 35:
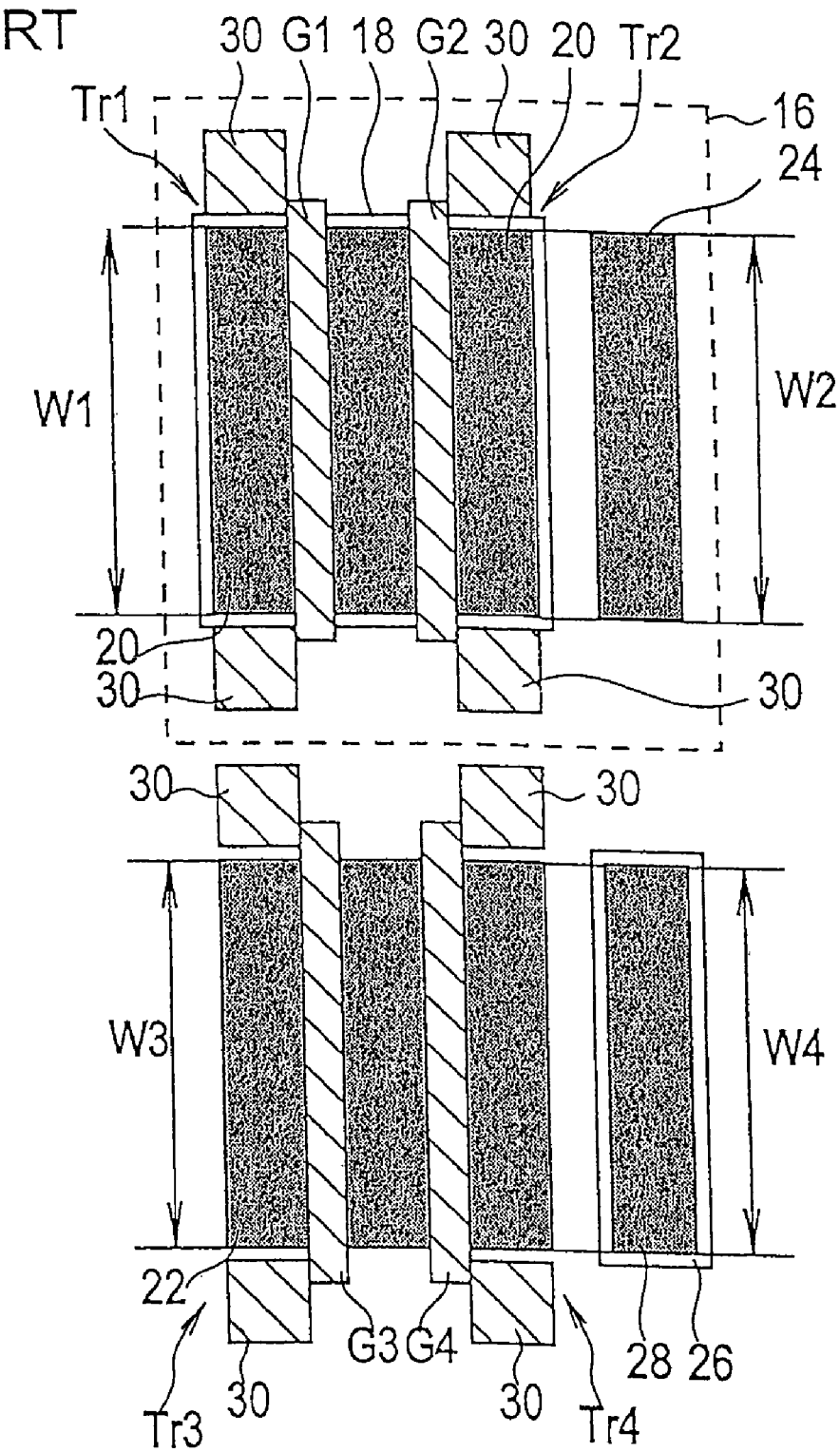
FIG. 35 is a mask pattern diagram showing a basic cell comprised by a conventional semiconductor integrated circuit.
Figure 36A:
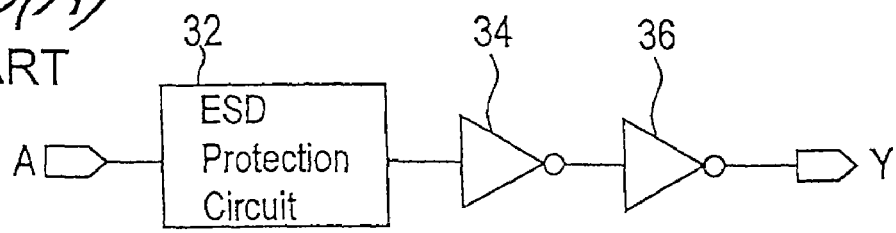
FIG. 36 (including FIGS. 36A, 36B and 36C) is a drawing showing an example of an I/O circuit.
Figure 36B:
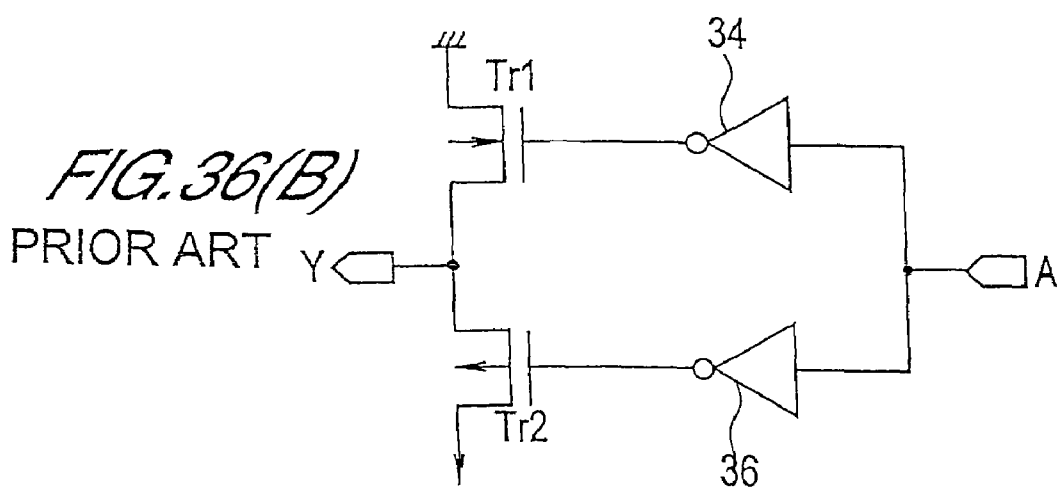
Figure 36C:
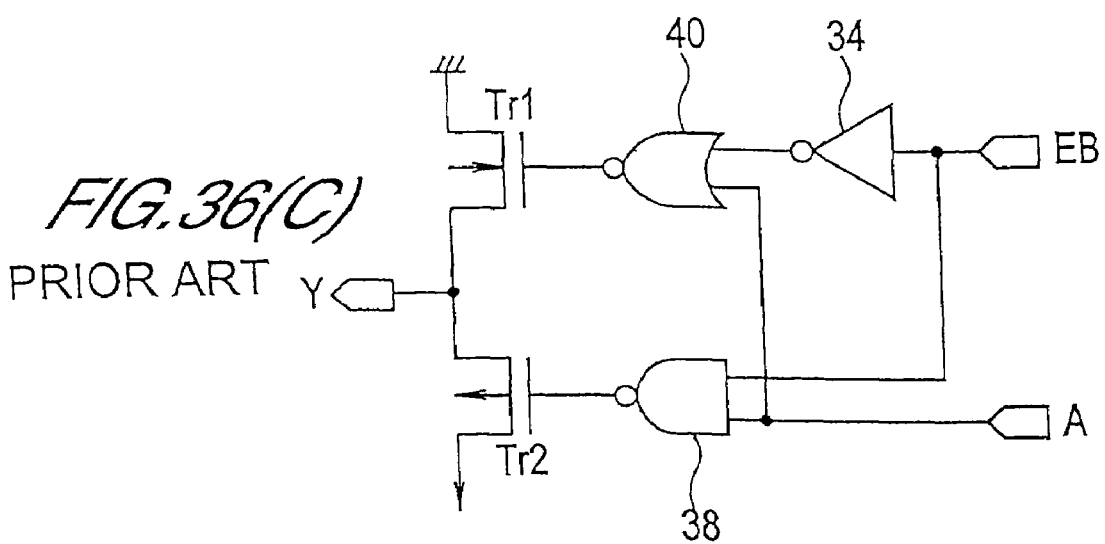

FIG. 33 is a mask pattern diagram showing an example of the configuration of an inverter using the modified example of the basic cell of the sixth embodiment. The various shadings in FIG. 33 each have the same meaning as in FIG. 37.

The wiring of the inverter shown in FIG. 33 is similar to the wiring of the inverter shown in FIG. 30. The difference is that, in FIG. 33, there is no need for connection of the gate G5 of PMOS transistor Tr5 and gate G7 of NMOS transistor Tr7. This connection shown in FIG. 30 is replaced in FIG. 33 by a first metal layer 58 (70) which connects the active region 20 of PMOS transistor Tr5 and the active region 22 of NMOS transistor Tr7. The connections of the inverter of FIG. 33 are as shown in FIG. 31.

In this way, by means of the modified example of the basic cell of the sixth embodiment, there is no longer a need to connect the gates of the PMOS and NMOS transistors, and so labor is eliminated in the drawing of diagrams. There is the further advantage that the size of basic cells is reduced.

As explained above, by means of the semiconductor integrated circuit of this invention, the efficiency of usage of elements in basic cells can be improved, and fine adjustment of Vth and Tpd becomes possible.

What is claimed is:

1. A semiconductor integrated circuit, manufactured by forming wiring on a bulk chip comprising a plurality of basic cells arranged in an array, wherein:

said basic cells comprise first, second, third, fourth and fifth P-channel MOS transistors, and first and second N-channel MOS transistors;

said second and third P-channel MOS transistors and said first P-channel MOS transistor are juxtaposed;

said fifth P-channel MOS transistor and said fourth P-channel MOS transistor are juxtaposed;

said second N-channel MOS transistor and said first N-channel MOS transistor are juxtaposed;

the gates of each of said transistors are parallel;

the gate of said first P-channel MOS transistor and the gate of said fourth P-channel MOS transistor are connected in a line;

the gate of said second P-channel MOS transistor and the gate of said third P-channel MOS transistor and the gate of said fifth P-channel MOS transistor are connected in a line;

the gate of said fourth P-channel MOS transistor and the gate of said first N-channel MOS transistor are provided in a line;

the gate of said fifth P-channel MOS transistor and the gate of said second N-channel MOS transistor are provided in a line; and, the gate width W1 of the gate of said first P-channel MOS transistor, the gate width W2 of the gate of said second P-channel MOS transistor, the gate width W3 of the gate of said third P-channel MOS transistor, the gate width W4 of the gate of said fourth P-channel MOS transistor, the gate width W5 of the gate of said fifth P-channel MOS transistor, the gate width W6 of the gate of said first N-channel MOS transistor, and the gate width W7 of the gate of said second N-channel MOS transistor, are selected such that $$W1:W2:W3:W4:W5:W6:W7=1:\frac{1}{3}:\frac{1}{3}:1:1:1:1.$$

2. The semiconductor integrated circuit according to claim 1, wherein the gate of said fourth P-channel MOS transistor and the gate of said first N-channel MOS transistor are connected in a line, and the gate of said fifth P-channel MOS transistor and the gate of said second N-channel MOS transistor are connected in a line.

* * * * *